(12) United States Patent
Iwami et al.

(10) Patent No.: US 9,642,245 B2
(45) Date of Patent: May 2, 2017

(54) CONDUCTIVE SHEET, TOUCH PANEL, DISPLAY DEVICE, METHOD FOR PRODUCING SAID CONDUCTIVE SHEET, AND NON-TRANSITORY RECORDING MEDIUM

(71) Applicant: FUJIFILM Corporation, Tokyo (JP)

(72) Inventors: Kazuchika Iwami, Ashigarakami-gun (JP); Hideyasu Ishibashi, Ashigarakami-gun (JP); Takashi Wakui, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 389 days.

(21) Appl. No.: 14/144,732

(22) Filed: Dec. 31, 2013

(65) Prior Publication Data

US 2014/0111711 A1    Apr. 24, 2014

Related U.S. Application Data

(63) Continuation of application No. PCT/JP2012/067620, filed on Jul. 10, 2012.

(30) Foreign Application Priority Data

Jul. 11, 2011 (JP) .................. 2011-152534
Jul. 11, 2011 (JP) .................. 2011-152759
(Continued)

(51) Int. Cl.
*G06F 3/041* (2006.01)
*H05K 1/02* (2006.01)
(Continued)

(52) U.S. Cl.
CPC ............ *H05K 1/0298* (2013.01); *B32B 7/02* (2013.01); *B32B 15/02* (2013.01); *B32B 15/08* (2013.01);
(Continued)

(58) Field of Classification Search
None
See application file for complete search history.

(56) References Cited

U.S. PATENT DOCUMENTS

2003/0052867 A1    3/2003  Shigetaka et al.
2005/0083307 A1    4/2005  Aufderheide et al.
(Continued)

FOREIGN PATENT DOCUMENTS

JP    10-041682       2/1988
JP    2002-140014     5/2002
(Continued)

OTHER PUBLICATIONS

Japanese Office Action, dated Aug. 12, 2014, in related Japanese Application No. 2012-155865.
(Continued)

*Primary Examiner* — Joseph Haley
(74) *Attorney, Agent, or Firm* — Birch, Stewart, Kolasch & Birch, LLP.

(57) ABSTRACT

The present invention pertains to: a conductive sheet, a touch panel, a display device, a method for producing the conductive sheet, and a recording medium. In the present invention, the relative refractive index of a substrate with respect to a first protective layer, and/or the relative refractive index of the substrate with respect to a second protective layer is 0.86-1.15. The relative refractive index of a first substrate with respect to the first protective layer, and/or the relative refractive index of a second substrate with respect to the second protective layer is 0.86-1.15.

20 Claims, 57 Drawing Sheets

(30) Foreign Application Priority Data

Sep. 6, 2011 (JP) ................................. 2011-193505
Sep. 6, 2011 (JP) ................................. 2011-193506

(51) Int. Cl.
| | |
|---|---|
| *B32B 7/02* | (2006.01) |
| *B32B 15/02* | (2006.01) |
| *G06F 3/044* | (2006.01) |
| *G06F 1/16* | (2006.01) |
| *B32B 15/08* | (2006.01) |
| *B32B 27/30* | (2006.01) |
| *B32B 27/32* | (2006.01) |
| *B32B 27/40* | (2006.01) |

(52) U.S. Cl.
CPC ............ *B32B 27/302* (2013.01); *B32B 27/32* (2013.01); *B32B 27/40* (2013.01); *G06F 1/1692* (2013.01); *G06F 3/044* (2013.01); *B32B 2307/202* (2013.01); *B32B 2307/412* (2013.01); *B32B 2307/418* (2013.01); *B32B 2457/208* (2013.01); *G06F 2203/04103* (2013.01); *G06F 2203/04111* (2013.01)

(56) References Cited

U.S. PATENT DOCUMENTS

| | | | |
|---|---|---|---|
| 2009/0073085 A1 | 3/2009 | Saneto et al. | |
| 2009/0159417 A1 | 6/2009 | Lin et al. | |
| 2009/0213090 A1 | 8/2009 | Mamba et al. | |
| 2009/0219257 A1 | 9/2009 | Frey et al. | |
| 2010/0182253 A1* | 7/2010 | Park ....................... | G06F 3/044 345/173 |
| 2011/0102370 A1* | 5/2011 | Kono ..................... | G06F 3/044 345/174 |
| 2012/0118614 A1 | 5/2012 | Kuriki | |
| 2012/0187821 A1* | 7/2012 | Lee ..................... | H01L 51/5212 313/498 |
| 2012/0273336 A1 | 11/2012 | Kuriki | |

FOREIGN PATENT DOCUMENTS

| | | |
|---|---|---|
| JP | 2003-99185 A | 4/2003 |
| JP | 2009-16700 A | 1/2009 |
| JP | 2009-137455 A | 6/2009 |
| JP | 2009-205321 A | 9/2009 |
| JP | 2009-302439 A | 12/2009 |
| JP | 2010-039537 | 2/2010 |
| JP | 2010-061425 | 3/2010 |
| JP | 2010-165336 A | 7/2010 |
| JP | 2010-262529 A | 11/2010 |
| JP | 2011-29037 A | 2/2011 |
| JP | 2011-513846 A | 4/2011 |
| JP | 2011-129112 | 6/2011 |
| JP | 2011-134311 A | 7/2011 |
| JP | 2012-533877 A | 12/2012 |
| TW | 200928931 A | 7/2009 |
| TW | M378432 U | 4/2010 |
| WO | WO 95/27334 A1 | 10/1995 |
| WO | WO 97/18508 A1 | 5/1997 |
| WO | WO 2011/008055 A2 | 1/2011 |
| WO | WO 2011008055 A2 * | 1/2011 ........... H05K 9/0094 |

OTHER PUBLICATIONS

Japanese Office Action, dated Aug. 26, 2014, in related Japanese Application No. 2012-155866.
Office Action with Search Report dated Feb. 3, 2016 issued in the corresponding Chinese Patent Application No. 201280034049.8 with English Translation.
Office Action issued Mar. 7, 2016 in corresponding Korean Patent Application No. 10-2013-7034578 on with an English Translation.
Japanese Office Action, dated Mar. 10, 2015, in related application No. JP2011-193505.
Office Action dated Oct. 9, 2016 issued in the corresponding Chinese Patent Application No. 201280034049.8 with an English Translation.
Office Action with Search Report dated Sep. 21, 2016 issued in the corresponding Taiwanese Patent Application 101124944 with an English Translation.
Chinese Office Action dated Feb. 24, 2017 issued in corresponding Chinese Patent Application No. 201280034049.8 with an English Translation.

* cited by examiner

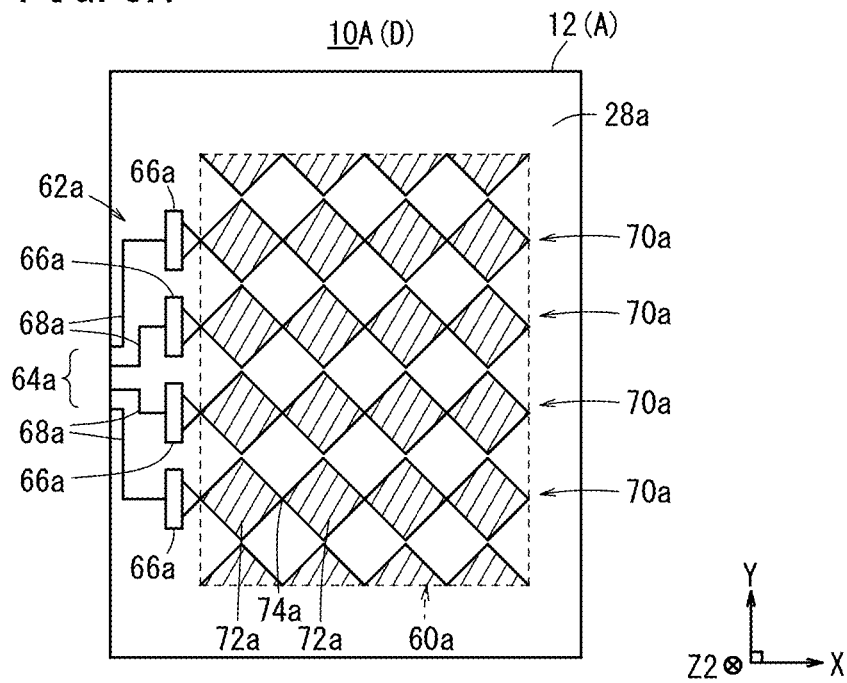
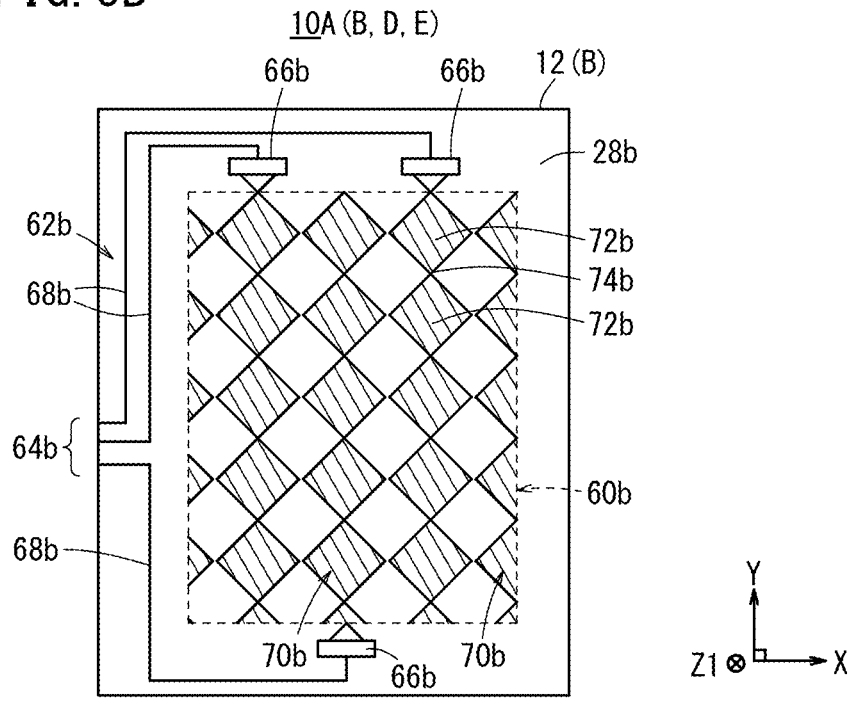

FIG. 7
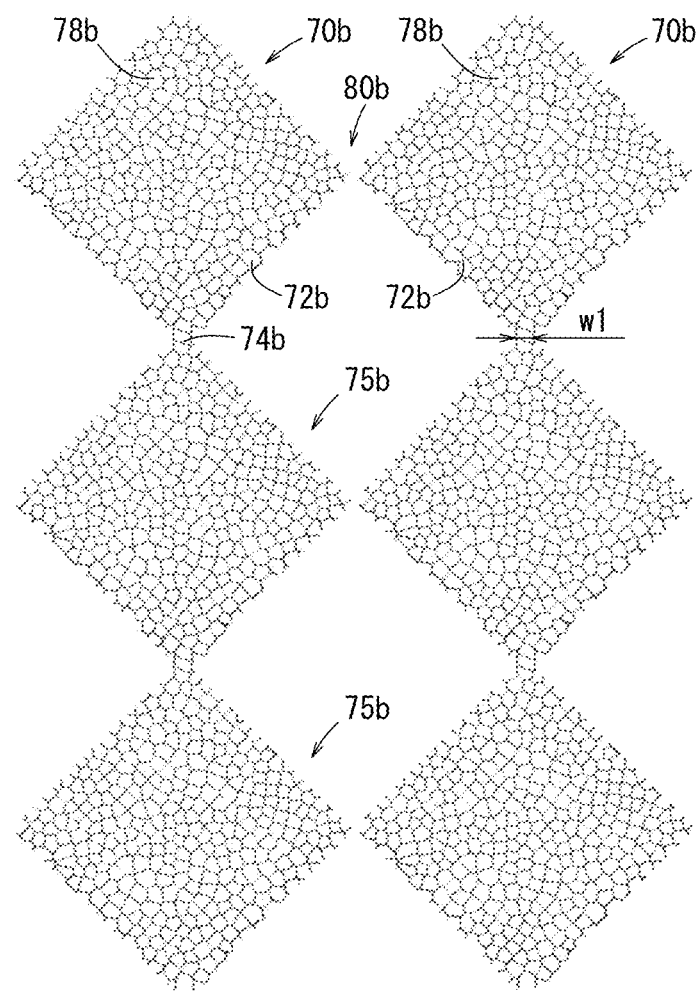
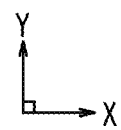

FIG. 35

IMAGE DATA GENERATION CONDITION SETTINGS [1/2]

WIRE MATERIAL SETTING CONDITIONS 422

TYPE  SILVER (Ag) ▽

PHYSICAL PROPERTY VALUES
(100 μm THICKNESS)

| | |
|---|---|
| TRANSMITTANCE | 448a |
| REFLECTANCE | 448b |
| COLOR VALUE L* | 448c |
| COLOR VALUE a* | 448d |
| COLOR VALUE b* | 448e |

MESH PATTERN SETTING CONDITIONS

TOTAL TRANSMITTANCE   93 %   430
FILM THICKNESS   20 μm   432
WIRING WIDTH   20 μm   434
WIRING THICKNESS   10 μm   436

FILM MATERIAL SETTING CONDITIONS 426

TYPE  PET FILM ▽

PHYSICAL PROPERTY VALUES
(1 mm THICKNESS)   428

| | |
|---|---|
| TRANSMITTANCE | 450a |
| REFLECTANCE | 450b |
| COLOR VALUE L* | 450c |
| COLOR VALUE a* | 450d |
| COLOR VALUE b* | 450e |

PATTERN SIZE H   5 mm   438
PATTERN SIZE V   5 mm   440
IMAGE RESOLUTION   3500 dpi   442

CANCEL 444    NEXT 446

IMAGE DATA GENERATION CONDITION SETTINGS [2/2] — 460

BLACK MATRIX SETTING CONDITIONS

PRESENCE/ABSENCE OF MATRIX  ● PRESENCE (462a)   ○ ABSENCE (462b)

AVERAGE SAMPLE NUMBER OF SUPERIMPOSED POSITIONS   5 TIMES — 464

DENSITY   4.5 D — 466, 468

DIMENSIONS  a  200 μm — 470
            b  200 μm — 472
            c   20 μm
            d   20 μm — 474

476 — 486
484

RETURN — 478    SET — 480    CANCEL — 482

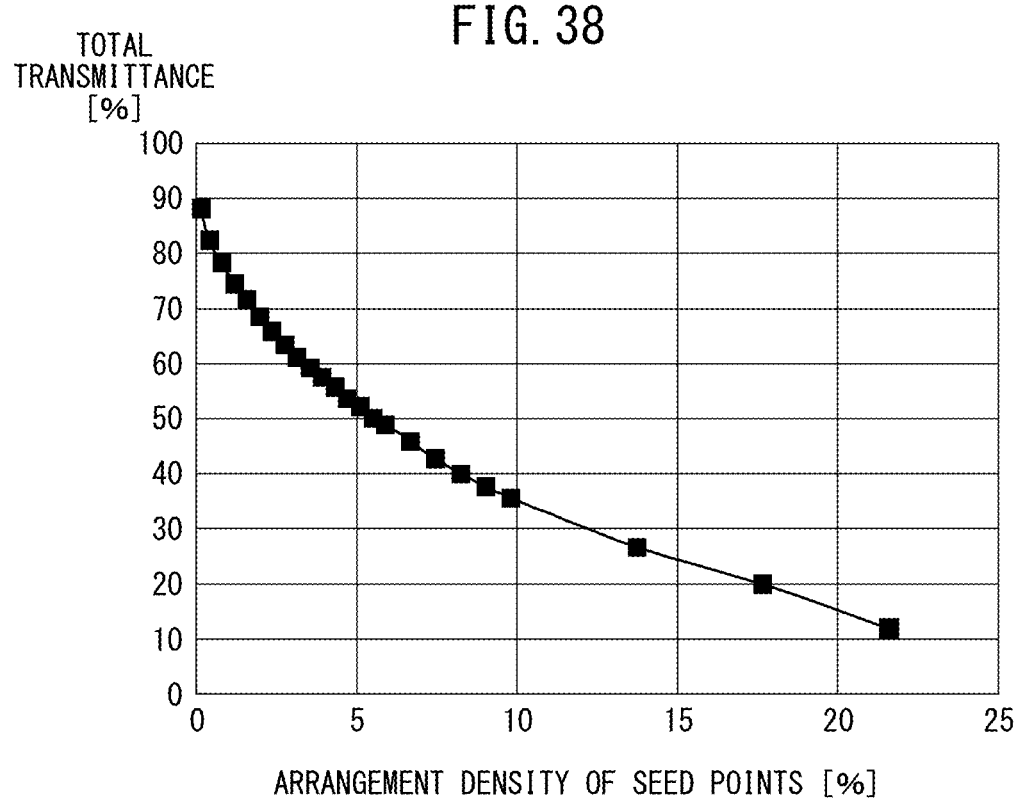

FIG. 51
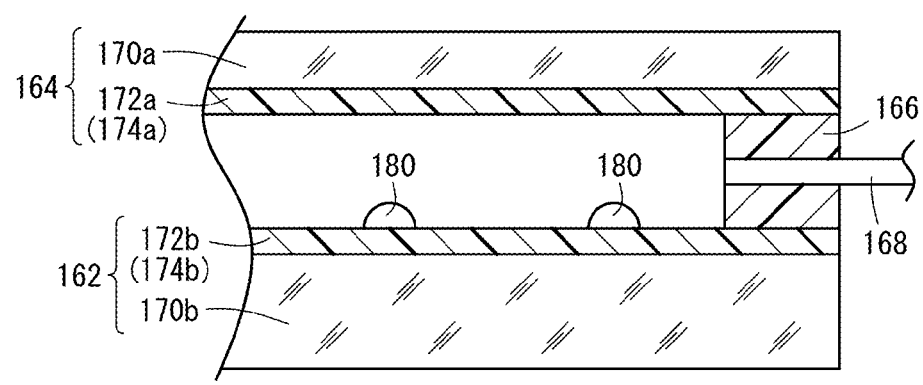
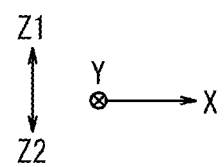

FIG. 55
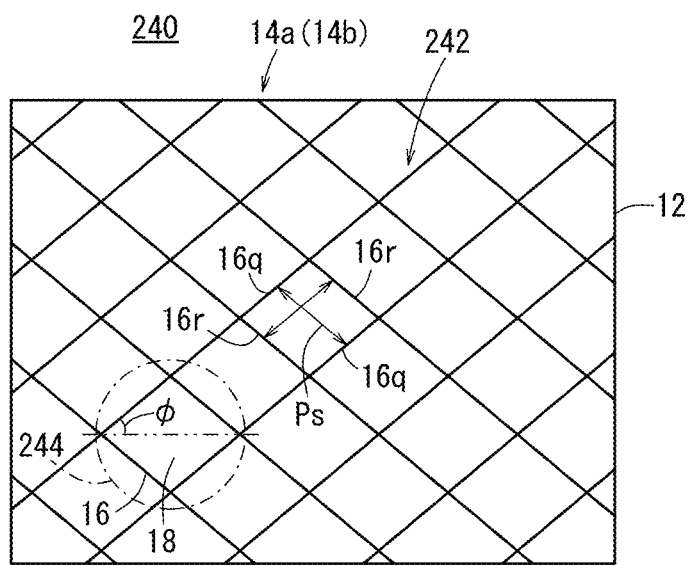
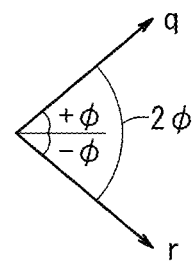

(COMPARATIVE EXAMPLE)

(COMPARATIVE EXAMPLE)

(COMPARATIVE EXAMPLE)

CONDUCTIVE SHEET, TOUCH PANEL, DISPLAY DEVICE, METHOD FOR PRODUCING SAID CONDUCTIVE SHEET, AND NON-TRANSITORY RECORDING MEDIUM

CROSS-REFERENCE TO RELATED APPLICATIONS AND PRIORITY CLAIMS

This application is a Continuation of International Application No. PCT/JP2012/067620 filed on Jul. 10, 2012, which was published under PCT Article 21(2) in Japanese, which is based upon and claims the benefit of priority from Japanese Patent Applications No. 2011-152534 filed on Jul. 11, 2011, No. 2011-152759 filed on Jul. 11, 2011, No. 2011-193505 filed on Sep. 6, 2011, and No. 2011-193506 filed on Sep. 6, 2011, the contents all of which are incorporated herein by reference.

TECHNICAL FIELD

The present invention relates to a conductive sheet, a touch panel and a display device, a method for producing the conductive sheet, and a non-transitory recording medium.

BACKGROUND ART

Recently, electronic devices that incorporate touch panels therein have been spreading widely. Touch panels are mounted in many devices including small screen, such as portable phones, PDAs (Personal Digital Assistants), or the like. In the future, it can be envisaged sufficiently that such touch panels will be incorporated into equipment having large sized screens that serve as PC (Personal Computer) displays or the like.

In the case of conventional touch panel electrodes, indium tin oxide (ITO: Indium Tin Oxide) primarily is used in view of the translucent properties thereof. It is known that the electric resistance per unit area of ITO is comparatively high compared to other metals or the like. More specifically, in the case of ITO, as the (total area of the touch panel) screen size increases, the surface resistivity in the electrode as a whole tends to increase. As a result, a problem arises in that the transmission speed of current between the electrodes becomes slower, such that the time (i.e., response speed) required to detect the contact position after the touch panel has been touched is delayed.

Therefore, various techniques have been proposed in which surface resistivity is decreased by constituting the electrodes in a plurality in the form of a lattice by means of thin wires (thin metal wires) made up from metal having low electrical resistance (see, for example, International Publication No. 1995/27334, International Publication No. 1997/18508, and Japanese Laid-Open Patent Publication No. 2003-099185).

For example, if the same mesh patterns are regularly arranged in a uniform manner, there is a disadvantage that, in relation to pixels constituting the display screen, moiré phenomena (interference patterns) are generated easily. Therefore, various techniques have been proposed for suppressing noise granularity (referred to generally as graininess), which occur in conjunction with moiré phenomena, by arranging the mesh pattern regularly or irregularly, thereby improving visibility of an observation target or object to be observed.

For example, as shown in FIG. 57A, according to Japanese Laid-Open Patent Publication No. 2009-137455, a window for a riding movable body and the shape of a pattern PT1 thereof in plan view are disclosed, having a mesh layer 4, in which rounded arcuate conductive wires 2 from which portions have been cutout are arranged repeatedly in a lattice shape, and respective ends of the arcuate wires 2 are connected in the vicinity of a center portion of another adjacent arcuate wire 2. In accordance therewith, it is noted that not only visibility but also shielding of electromagnetic waves as well as resistance to breakage can be improved.

Further, as shown in FIG. 57B, according to Japanese Laid-Open Patent Publication No. 2009-016700, a transparent conductive substrate and the shape of a pattern PT2 thereof as viewed in plan are disclosed, which is manufactured using a solution, i.e., a self-organized metal particle solution, which forms a mesh-like structure naturally on the substrate if one side of the substrate is coated and then left untreated. In accordance therewith, it is noted that an irregular mesh-like structure can be obtained in which moiré phenomena do not occur.

Moreover, as shown in FIG. 57C, according to Japanese Laid-Open Patent Publication No. 2009-302439, a light transmissive electromagnetic shield material and the shape of a pattern PT3 thereof as viewed in plan are disclosed, in which an electromagnetic shield layer 6 has a sea region structure in a sea-island configuration, wherein the shapes of island regions 8 made up from openings surrounded by the electromagnetic shield layer 6 differ mutually from each other. In accordance therewith, it is noted that both optical transparency and electromagnetic shielding are improved without the occurrence of moiré phenomena.

SUMMARY OF INVENTION

However, in the case of using a metal, which is a non-translucent material, as the electrode of a touch panel, a difference in the amount of light transmitted through the electrode in accordance with the presence or absence of the thin metal wires is increased. Thus, shading corresponding to the shape of the pattern formed by the electrode becomes significant, which is easily visible to the user. In particular, in the case of a mesh pattern in which different mesh shapes are arranged without gaps therebetween, there is a disadvantage in that sensation of graininess or roughness (grain noise) occurs easily.

The present invention has been made with a view toward solving the aforementioned problems. An object of the present invention is to provide a conductive sheet, a touch panel and a display device, a method for producing the conductive sheet, and a non-transitory recording medium, in which the occurrence of a sensation of roughness (graininess) caused by the pattern can be suppressed, and wherein the visibility of an object to be observed, i.e., an observation target, can be improved significantly.

A conductive sheet according to the present invention comprises a substrate, a first conductive portion made up from a plurality of thin metal wires and which is formed on one main surface of the substrate, a first protective layer disposed on the one main surface in covering relation to the first conductive portion, a second conductive portion made up from a plurality of thin metal wires and which is formed on another main surface of the substrate, and a second protective layer disposed on the other main surface in covering relation to the second conductive portion, wherein at least one of a relative index of refraction of the substrate with respect to the first protective layer and a relative index of refraction of the substrate with respect to the second protective layer is 0.86 to 1.15.

In the foregoing manner, since at least one of the relative index of refraction of the substrate with respect to the first protective layer and the relative index of refraction of the substrate with respect to the second protective layer is 0.86 to 1.15, among the light that enters at a slight angle with respect to a direction normal to the substrate, the amount of light that travels in a straight line at at least one of a boundary between the substrate and the first protective layer and a boundary between the substrate and the second protective layer is increased relatively. More specifically, the amount of light that passes through the interior of the substrate without scattering increases uniformly irrespective of the position of the thin metal wires that are constituted from a non-translucent material. Consequently, contrast in optical density caused by the thin metal wires can be decreased, thus making such contrast less visible to an observer (user).

A conductive sheet according to the present invention comprises a first substrate, a first conductive portion made up from a plurality of thin metal wires and which is formed on one main surface of the first substrate, a first protective layer disposed on the one main surface of the first substrate in covering relation to the first conductive portion, a second substrate, a second conductive portion made up from a plurality of thin metal wires and which is formed on one main surface of the second substrate, and a second protective layer disposed on the one main surface of the second substrate in covering relation to the second conductive portion, wherein at least one of a relative index of refraction of the first substrate with respect to the first protective layer and a relative index of refraction of the second substrate with respect to the second protective layer is 0.86 to 1.15.

In the foregoing manner, since at least one of the relative index of refraction of the first substrate with respect to the first protective layer and the relative index of refraction of the second substrate with respect to the second protective layer is 0.86 to 1.15, among the light that enters at a slight angle with respect to a direction normal to the first and second substrates, the amount of light that travels in a straight line at at least one of a boundary between the first substrate and the first protective layer and a boundary between the second substrate and the second protective layer is increased relatively. More specifically, the amount of light that passes through the interior of the substrates without scattering increases uniformly irrespective of the position of the thin metal wires that are constituted from a non-translucent material. Consequently, contrast in optical density caused by the thin metal wires can be decreased, thus making such contrast less visible to an observer (user).

Further, preferably, the first conductive portion comprises a plurality of first conductive patterns that extend in a first direction and are arranged in a second direction perpendicular to the first direction, and a plurality of first dummy patterns disposed in interspatial portions between adjacent ones of the first conductive patterns, and which are insulated electrically from each of the first conductive patterns, wherein a wiring density of the first dummy patterns is equal to a wiring density of the first conductive patterns. In this case, the optical reflectance in a planar region of the first dummy pattern with respect to light incident from the one main surface side coincides substantially with the optical reflectance in a planar region of the first conductive pattern. More specifically, irrespective of the regular arrangement of the first conductive pattern, the intensity distribution of the reflective light can be made more uniform. Consequently, even with a structure in which electrodes made up from thin metal wires are formed on both surfaces of the conductive sheet, visibility of the first conductive pattern caused by external light as a source of reflected light can be suppressed.

Further, the first conductive portion preferably comprises a mesh pattern in which different mesh shapes are arranged randomly in plan view.

Furthermore, the mesh pattern preferably satisfies at least one of the following first and second conditions. First condition: In relation to a centroid position distribution power spectrum of the mesh shapes, an average intensity on a spatial frequency side higher than a predetermined spatial frequency is greater than an average intensity on a spatial frequency band side lower than the predetermined spatial frequency. Second condition: In a convolution integral of a power spectrum of the mesh pattern and human standard visual response characteristics, respective integral values thereof within a spatial frequency band greater than or equal to $\frac{1}{4}$ of and less than or equal to $\frac{1}{2}$ of a spatial frequency corresponding to an average line width of the thin metal wires, are greater than an integral value at zero spatial frequency.

Furthermore, the mesh pattern preferably is formed based on output image data obtained by carrying out the following data generating process. Namely, the process comprises a selection step of selecting plural positions from within a predetermined two-dimensional image region, a generation step of generating image data that represent a pattern of the mesh pattern based on the selected plural positions, a calculation step of calculating a quantified evaluation value concerning noise characteristics of the mesh pattern, based on the generated image data, and a determination step of determining one of the image data as the output image data, based on the calculated evaluation value and predetermined evaluation conditions.

Moreover, in the data generating process, the evaluation value preferably is calculated based on superimposed image data obtained by superimposing on the mesh pattern a structural pattern having a pattern, which differs from the pattern of the mesh pattern, and the output image data may be determined based on the evaluation value.

Further, the second conductive portion preferably includes a plurality of second conductive patterns, which extend in the second direction, and are arranged in the first direction, wherein, by combining the first conductive portion and the second conductive portion, a mesh pattern may be constructed in which the same or different mesh shapes are arranged as viewed in plan.

Further, the mesh pattern preferably comprises a pattern in which different mesh shapes are arranged randomly.

Furthermore, the mesh pattern preferably satisfies at least one of the following first and second conditions. First condition: In relation to a centroid position distribution power spectrum of the mesh shapes, an average intensity on a spatial frequency side higher than a predetermined spatial frequency is greater than an average intensity on a spatial frequency band side lower than the predetermined spatial frequency. Second condition: In a convolution integral of a power spectrum of the mesh pattern and human standard visual response characteristics, respective integral values thereof within a spatial frequency band greater than or equal to $\frac{1}{4}$ of and less than or equal to $\frac{1}{2}$ of a spatial frequency corresponding to an average line width of the thin metal wires, are greater than an integral value at zero spatial frequency.

Furthermore, the mesh pattern preferably is formed based on output image data obtained by carrying out the following data generating process. Namely, the process comprises a selection step of selecting plural positions from within a predetermined two-dimensional image region, a generation step of generating image data that represent a pattern of the mesh pattern based on the selected plural positions, a calculation step of calculating a quantified evaluation value concerning noise characteristics of the mesh pattern, based on the generated image data, and a determination step of determining one of the image data as the output image data, based on the calculated evaluation value and predetermined evaluation conditions.

Moreover, in the data generating process, the evaluation value preferably is calculated based on superimposed image data obtained by superimposing on the mesh pattern a structural pattern having a pattern that differs from the pattern of the mesh pattern, and the output image data may be determined based on the evaluation value.

Further, each of the mesh shapes may be polygonal.

In addition, each of the mesh shapes may be determined according to a Voronoi diagram based on plural positions within one planar region.

Further, a percentage of polygons having a number of vertices, an occurrence frequency of which is highest in a histogram of the number of vertices in the mesh shapes, preferably is 40% to 70%.

Further, the mesh pattern may include a repeating shape.

Furthermore, each of the first conductive patterns may be inclined at a predetermined angle with respect to a direction in which the repeating shape is arranged.

A touch panel according to the present invention comprises the conductive sheet according to any one of aforementioned details, and a detection control unit for detecting a contact position or a proximity position from a side of the one main surface of the conductive sheet.

A display device according to the present invention comprises the conductive sheet according to any one of the aforementioned details, a detection control unit for detecting a contact position or a proximity position from a side of the one main surface of the conductive sheet, and a display unit that displays an image on a display surface based on a display signal, wherein the other main surface of the conductive sheet is disposed on the display surface in confronting relation to the display unit.

A method for producing a conductive sheet according to the present invention comprises a selection step of selecting plural positions from within a predetermined two-dimensional image region, a generation step of generating image data that represent a pattern of a mesh pattern based on the selected plural positions, a calculation step of calculating a quantified evaluation value concerning noise characteristics of the mesh pattern, based on the generated image data, a determination step of determining one of the image data as output image data, based on the calculated evaluation value and predetermined evaluation conditions, an image cutting out step of cutting out first image data representing a pattern on one main surface side of a substrate, and second image data representing a pattern on another main surface side of the substrate, from the determined output image data, and an outputting step of obtaining the conductive sheet, on which the mesh pattern is formed on the substrate as viewed in plan, by output formation of a wire material on the one main surface side of the substrate based on the cut out first image data, and by output formation of the wire material on the other main surface side of the substrate based on the cut out second image data.

A non-transitory recording medium according to the present invention stores a program therein for producing image data that outputs and forms a wire material on a substrate, the program enabling a computer to function as a position selecting unit for selecting plural positions from within a predetermined two-dimensional image region, an image data generating unit for generating image data that represent a pattern of a mesh pattern based on the plural positions selected by the position selecting unit, an evaluation value calculating unit for calculating a quantified evaluation value concerning noise characteristics of the mesh pattern, based on the image data that is generated by the image data generating unit, a data determining unit for determining one of the image data as output image data, based on the evaluation value calculated by the evaluation value calculating unit and predetermined evaluation conditions, and an image cutout unit for cutting out first image data representing a pattern on one main surface side of the substrate and second image data representing a pattern on another main surface side of the substrate, from the output image data determined by the data determining unit.

In accordance with the conductive sheet, the touch panel and the display device of the present invention, at least one of a relative index of refraction of the substrate with respect to the first protective layer and a relative index of refraction of the substrate with respect to the second protective layer is 0.86 to 1.15. Therefore, among the light that enters at a slight angle with respect to a direction normal to the substrate, the amount of light that travels in a straight line at at least one of a boundary between the substrate and the first protective layer and a boundary between the substrate and the second protective layer is increased relatively.

In accordance with the conductive sheet, the touch panel and the display device of the present invention, at least one of the relative index of refraction of the first substrate with respect to the first protective layer and the relative index of refraction of the second substrate with respect to the second protective layer is 0.86 to 1.15. Therefore, among the light that enters at a slight angle with respect to a direction normal to the first and second substrates, the amount of light that travels in a straight line at at least one of a boundary between the first substrate and the first protective layer and a boundary between the second substrate and the second protective layer is increased relatively.

More specifically, the amount of light that passes through the interior of the substrate without scattering increases uniformly irrespective of the position of the thin metal wires that are constituted from a non-translucent material. Consequently, contrast in optical density caused by the thin metal wires can be decreased, thus making such contrast less visible to an observer (user).

In accordance with the method for producing a conductive sheet and the recording medium of the present invention, image data are created that represent a pattern of the mesh pattern, based on a plurality of positions selected from within a predetermined two-dimensional region, a quantified evaluation value concerning noise characteristics of the mesh pattern is calculated based on the generated image data, and one of the image data is determined as the output image data, based on the calculated evaluation value and predetermined evaluation conditions. Therefore, the shape of the mesh pattern can be determined having noise characteristics that satisfy the aforementioned predetermined conditions. Stated otherwise, by suitably controlling the noise characteristics of the mesh pattern, sensation of such noise can be reduced. In addition, since first image data representing the pattern on one main surface, and second image data representing the pattern on the other main surface can be cut out from the same output image data, even in the case that the wire material is to be output and formed in two layers, visibility of the mesh pattern can be maintained as viewed in plan.

The aforementioned objects, characteristics, and advantages of the present invention will become more apparent from the following descriptions of preferred embodiments, taken in conjunction with the accompanying drawings.

BRIEF DESCRIPTION OF DRAWINGS

FIG. 5A is a plan view showing an example pattern of a first stacked portion shown in FIG. 2;

FIG. 5B is a plan view showing an example pattern of a second stacked portion shown in FIG. 2;

FIG. 7 is a partially enlarged plan view of a second sensor part of FIG. 5B;

FIG. 21C is performed;

FIG. 35 is a view showing an image of a first setting screen for setting image data creating conditions;

FIG. 36 is a view showing an image of a second setting screen for setting image data creating conditions;

FIG. 38 is a graph showing an example of a relationship between a seed point arrangement density and total transmittance;

FIG. 51 is a schematic cross sectional diagram of a touch panel according to another embodiment;

FIG. 55 is a schematic plan view of a conductive sheet according to another embodiment;

DESCRIPTION OF EMBODIMENTS

Below, with reference to the accompanying drawings, explanations shall be given of preferred embodiments in relation to a conductive sheet, a touch panel in which the conductive sheet is incorporated, and a display device according to the present invention. Further, explanations shall be given in detail in relation to a manufacturing method for producing the conductive sheet, as well as a manufacturing apparatus and a non-transitory recording medium (program) for carrying out the method. For facilitating explanation, cases may occur in which the term "conductive sheet 10" is used to refer collectively to conductive sheets 10A through 10F, 230 and 240 according to preferred embodiments or exemplary modifications, to be described later.

Moreover, the significance of the dash "-" to indicate numerical ranges in the present specification conveys the meaning that the numerical values appearing before and after the dash include therein lower limit numerical values and upper limit numerical values.

[Structure of Conductive Sheet 10A According to First Embodiment]

Figure 1:
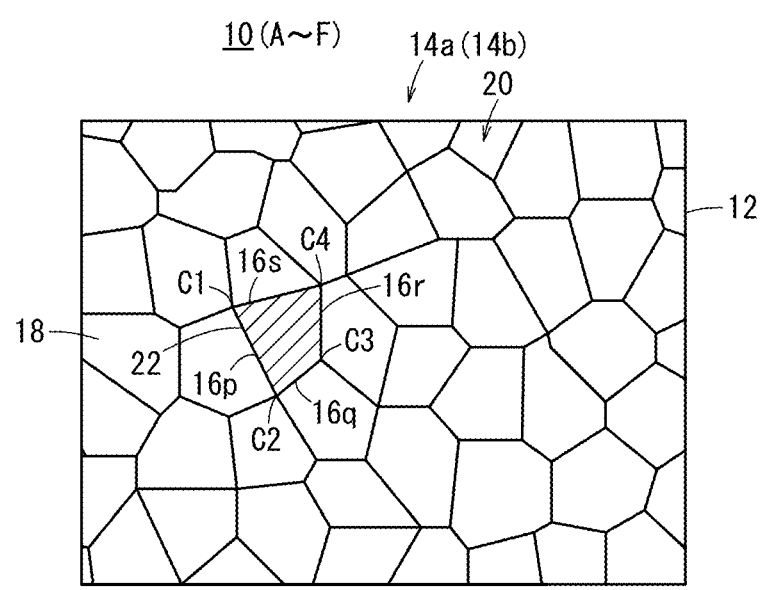
FIG. 1 is a schematic plan view showing an example of a conductive sheet common to respective embodiments of the present invention.
Figure 2:
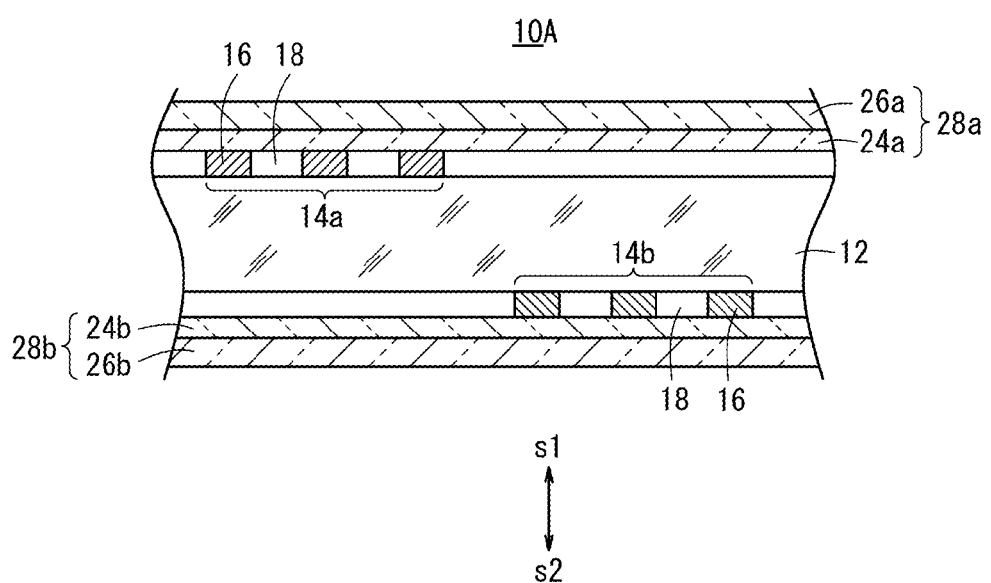
FIG. 2 is a cross sectional view with partial omission of a conductive sheet according to a first embodiment.

As shown in FIG. 1 and FIG. 2, a conductive sheet 10A according to a first embodiment includes a transparent substrate 12 (substrate). The transparent substrate 12, which is highly translucent and possesses insulative properties, is made from a material such as resin, glass, silicone or the like. As suitable resins, there may be cited PET (Polyethylene Terephthalate), PMMA (Polymethyl Methacrylate), PP (Polypropylene), PS (Polystyrene) TAC (Triacetyl Cellulose) COC (Cycloolefin Copolymer), etc.

A first conductive portion 14a is formed on one main, surface (a side in the direction of the arrow s1 in FIG. 2) of the transparent substrate 12. The first conductive portion 14a includes a mesh pattern 20 formed by openings 18 and thin metal wires (hereinafter referred to as thin metal wires 16, and also as thin metal wires 16p, 16q, 16r, 16s). The thin metal wires 16 are made from a metal material such as, for example, gold (Au), silver (Ag), copper (Cu), or the like.

The wire width of the thin metal wires 16 can be selected to be less than or equal to 30 μm. In the event that the conductive sheet 10A is applied to a touch panel, the wire width of the thin metal wires 16 preferably is greater than or equal to 0.1 μm and less than or equal to 15 μm, more preferably, is greater than or equal to 1 μm and less than or equal to 9 μm, still more preferably, is greater than or equal to 1 μm and less than or equal to 7 μm, and still more preferably, is greater than or equal to 1 μm and less than or equal to 5 μm. The upper limit value of the wire width preferably is 5 μm, more preferably is 4 μm, and still more preferably is 3 μm. The lower limit value of the wire width preferably is 0.5 μm, more preferably is 0.8 μm, and still more preferably is 1 μm. In the case of the random pattern exemplified in FIG. 1, from the standpoints of visibility and power characteristics, the line width of the thin metal wires 16 more preferably is in the vicinity of 3 μm.

In particular, the first conductive portion 14a has a mesh pattern 20 in which different mesh shapes 22 are arranged randomly without gaps. In other words, the mesh pattern 20 is a random pattern without regularity (uniformity) in each of the mesh shapes 22. For example, within the mesh pattern 20, the mesh shape 22 shown in hatching is of a rectangular shape, formed by a thin metal wire 16p that connects a vertex C1 and a vertex C2 by a straight line, a thin metal wire 16q that connects the vertex C2 and a vertex C3 by a straight line, a thin metal wire 16r that connects the vertex C3 and a vertex C4 by a straight line, and a thin metal wire 16s that connects the vertex C4 and the vertex C1 by a straight line. As will be understood from the figure, any one of such mesh shapes 22 is a polygonal shape having at least three sides.

Below, in the present specification, the term "polygonal" implies not only polygons that are complete polygons geometrically, but also includes the meaning of "substantially polygonal" in which minor changes may be added to a complete polygonal shape. As examples of such minor changes, partial defects or the like may be introduced to each side (thin metal wires 16) constituting the mesh shapes 22, or alternatively, micro point-like or line-like elements, as compared with the illustrated mesh shapes 22 may be added to the mesh shapes 22.

A first protective layer 26a is bonded through a first adhesive layer 24a substantially over the entire surface of the first conductive portion 14a, so as to cover the thin metal wires 16. As suitable materials for the first adhesive layer 24a, wet laminating adhesives, dry laminating adhesives, or hot melt adhesives, etc., may be used.

Similar to the transparent substrate 12, the first protective layer 26a is made from a highly translucent material such as resin, glass, silicone or the like. The index of refraction n1 of the first protective layer 26a is of a value equivalent to the index of refraction n0 of the transparent substrate 12, or a value close to the index of refraction n0 thereof. In this case, the relative index of refraction nr1 of the transparent substrate 12 with respect to the first protective layer 26a is of a value close to 1.

The index of refraction as used in the present specification implies an index of refraction in relation to light having a wavelength of 589.3 nm (sodium D line), and for example in the case of a resin, is defined by the international standard ISO 14782:1999 (corresponding to JIS K 7105). Further, the relative index of refraction nr1 of the transparent substrate 12 with respect to the first protective layer 26a is defined by nr1=(n1/n0). The relative index of refraction nr1 may reside within a range of being greater than or equal to 0.85 and less than or equal to 1.17, more preferably, being greater than or equal to 0.86 and less than or equal to 1.15, and still more preferably, being greater than or equal to 0.91 and less than or equal to 1.08.

In the case that the transparent substrate 12 is made from PET, by adopting as a material for the first protective layer 26a, for example, PCTFE (Polychloro-Trifluoroethylene), PMMA, PS, PET, PTU (Polythiourethane), or high refractive index glass, etc., the above relationship concerning the index of refraction can be satisfied. The same applies to a second protective layer 26b, to be described later.

Hereinbelow, respective parts (including the first conductive portion 14a, the first adhesive layer 24a, and the first protective layer 26a) that are formed on the one main surface (the side in the direction of the arrow s1 in FIG. 2) of the transparent substrate 12 may also be referred to collectively as a first stacked portion 28a.

Incidentally, a second conductive portion 14b is formed on another main surface (a side in the direction of the arrow s2 in FIG. 2) of the transparent substrate 12. The second conductive portion 14b includes a mesh pattern 20 formed by openings 18 and thin metal wires 16, in the same manner as the first conductive portion 14a. The transparent substrate 12 is made from an insulating material, so that the second conductive portion 14b is kept under a condition of being electrically insulated from the first conductive portion 14a.

A second protective layer 26b is bonded through a second adhesive layer 24b substantially over the entire surface of the second conductive portion 14b, so as to cover the thin metal wires 16. The material of the second adhesive layer 24b may be the same material or a different material from that of the first adhesive layer 24a. Also, the material of the second protective layer 26b may be the same material or a different material from that of the first protective layer 26a.

The index of refraction n2 of the second protective layer 26b is equal to or is near to the value of the index of refraction n0 of the transparent substrate 12. In this case, the relative index of refraction nr2 of the transparent substrate 12 with respect to the second protective layer 26b is of a value close to 1. Herein, the definitions of the index of refraction and relative index of refraction are the same as described above. Further, the relative index of refraction nr2 of the transparent substrate 12 with respect to the second protective layer 26b is defined by nr2=(n2/n0). The relative index of refraction nr2 may reside within a range of being greater than or equal to 0.85 and less than or equal to 1.17, more preferably, being greater than or equal to 0.86 and less than or equal to 1.15, and still more preferably, being greater than or equal to 0.91 and less than or equal to 1.08.

Hereinbelow, respective parts (including the second conductive portion 14b, the second adhesive layer 24b, and the second protective layer 26b) that are formed on the other main surface (the side in the direction of the arrow s2 in FIG. 2) of the transparent substrate 12 may also be referred to collectively as a second stacked portion 28b.

As described above, the conductive sheet 10A includes the transparent substrate 12, the first conductive portion 14a made up from a plurality of thin metal wires 16 and formed on the one main surface of the transparent substrate 12, the first protective layer 26a disposed on the one main surface in covering relation to the first conductive portion 14a, the second conductive portion 14b made up from a plurality of thin metal wires 16 and formed on the other main surface of the transparent substrate 12, and the second protective layer 26b disposed on the other main surface in covering relation to the second conductive portion 14b.

The conductive sheet 10A is applied, for example, to a touch panel of a display unit 30 (display device). The display unit 30 may be constituted by a liquid crystal panel, a plasma panel, an organic EL (Electro-Luminescence) panel, an inorganic EL panel, or the like.

Figure 3:
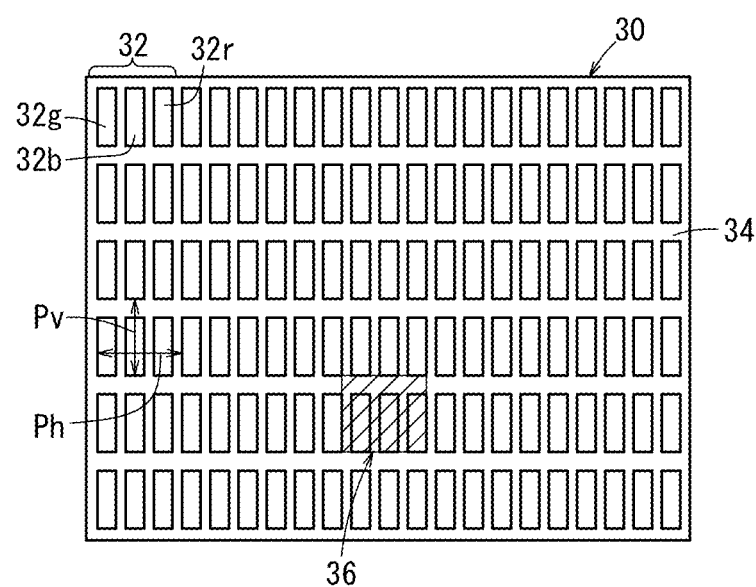
FIG. 3 is an outline schematic diagram showing a pixel arrangement of a display unit.

As shown with partial omission in FIG. 3, the display unit 30 is composed of a plurality of pixels 32 which are arranged in the form of a matrix. One pixel 32 is constituted by three sub-pixels (red sub-pixel 32r, blue sub-pixel 32b, and green sub-pixel 32g), which are arranged in the horizontal direction. One sub-pixel is of a vertically-long rectangular shape. The arrangement pitch of the pixels 32 in the horizontal direction (horizontal pixel pitch Ph) and the arrangement pitch of the pixels 32 in the vertical direction (vertical pixel pitch Pv) are substantially the same. Stated otherwise, the shape (refer to the shaded region 36) in which the one pixel 32 and a black matrix 34 (pattern member) surrounding the one pixel 32 are constituted is of a substantially square shape. Further, an aspect ratio of the one pixel 32 is not 1, but rather, the length in the horizontal direction (width) is greater than the length in the vertical direction (height). In the case that the conductive sheet 10 is disposed on the display panel of the display unit 30 having the aforementioned pixel arrangement, almost no interference of spatial frequency occurs between the randomly formed thin metal wires 16 and the period (array period) at which the pixels 32 are arranged. Thus, generation of moiré phenomena is suppressed.

[Structure of Display Device 40 Incorporating Conductive Sheet 10A]

Next, with reference to FIGS. 4 through 8, a description shall be given concerning the display device 40 in which the conductive sheet 10A according to the first embodiment is incorporated. An example of a projection-capacitive type of touch panel will be presented. Further, the conductive sheets 10B through 10F according to other embodiments can also be incorporated in a similar manner in the display device 40.

Figure 4:
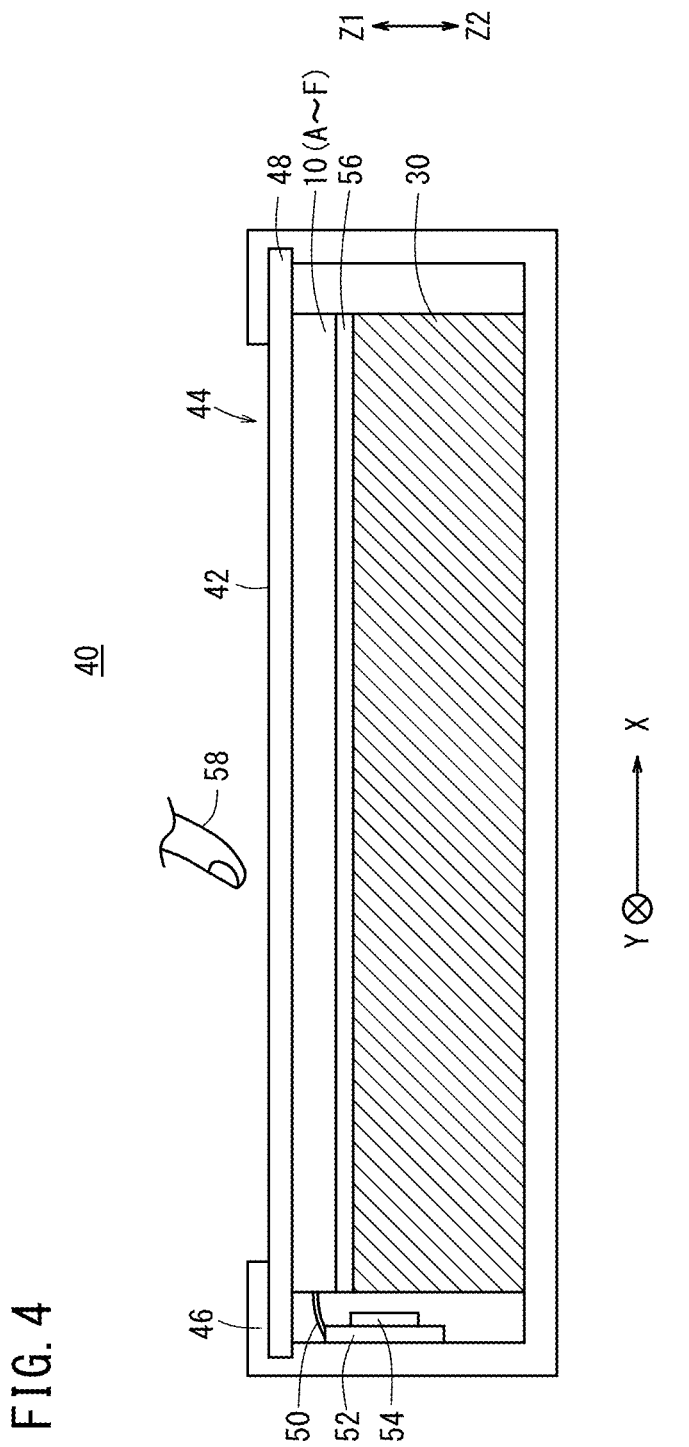
FIG. 4 is a schematic cross sectional view of a display device in which the conductive sheet of FIG. 2 is incorporated.

As shown in FIG. 4, the display device 40 includes a display unit 30 (see FIG. 3) which is capable of displaying at least one of color and monochromatic images, a touch panel 44 that detects a contact position from an input surface 42 (on a side in the direction of the arrow Z1), and a casing 46 that accommodates the display unit 30 and the touch panel 44 therein. A user is capable of accessing the touch panel 44 through a large opening that is provided on one surface (on the side in the direction of the arrow Z1) of the casing 46.

The touch panel 44 comprises, apart from the aforementioned conductive sheet 10A (see FIG. 1 and FIG. 2), a cover member 48 that is stacked on one surface (on a side in the direction of the arrow Z1) of the conductive sheet 10A, a flexible substrate 52 connected electrically via a cable 50 to the conductive sheet 10A, and a detection control unit 54 disposed on the flexible substrate 52.

On one surface (the side in the direction of the arrow Z1) of the display unit 30, the conductive sheet 10 is bonded through an adhesive layer 56. The other main surface side (the second conductive portion 14b side) of the conductive sheet 10A is disposed on the display screen in confronting relation to the display unit 30.

The cover member 48 functions as an input surface 42 while covering one surface of the conductive sheet 10A. Further, by preventing direct contact with a contact body 58 (e.g., a finger or a stylus), the cover member 48 is capable of suppressing abrasion, adherence of dust, etc., thereby enabling the conductivity of the conductive sheet 10A to remain stable.

The material of the cover member 48 may be glass or a resin film, for example. Under a condition in which one surface (on the side in the direction of the arrow Z2) of the cover member 48 is coated with silicon oxide or the like, the one surface of the conductive sheet 10A (on the side in the direction of the arrow Z1) may be placed in intimate contact firmly against the cover member 48. Further, for preventing damage due to rubbing or the like, the conductive sheet 10A and the cover member 48 may be adhered to one another by bonding.

The flexible substrate 52 is an electronic substrate equipped with flexibility. In the illustrated example, although the flexible substrate 52 is fixed to an inner wall side surface of the casing 46, the position at which the flexible substrate 52 is arranged may be changed in various ways. In a case where the contact body 58, which acts as a conductor, comes into contact (or into proximity) with the input surface 42, the detection control unit 54 forms an electric circuit for capturing a change in electrostatic capacitance between the conductive sheet 10A and the contact body 58 thereby to detect the contact position (or the proximate position) thereof.

As shown in FIG. 5A, on the one main surface of the conductive sheet 10A, on a side in the direction of the arrow Z2 as viewed in plan, there are provided a first sensor part 60a, which is disposed in the display area of the display unit 30 (see FIG. 3 and FIG. 4), and first terminal wire parts 62a (a so-called frame), which are disposed on an outer peripheral region of the display area.

The appearance and shape of the conductive sheet 10A is rectangular as viewed in plan, and the appearance and shape of the first sensor part 60a also is rectangular. Among the first terminal wire parts 62a, on a peripheral edge portion of the conductive sheet 10 on one side thereof parallel to the direction of the arrow Y, on a central portion in the lengthwise direction thereof, plural first terminals 64a are arrayed in the direction of the arrow Y. Along one side of the first sensor part 60a (a side parallel to the direction of the arrow Y in the illustrated example), plural first wire connectors 66a are arrayed in a line. First terminal wire patterns 68a, which are led out from the respective first wire connectors 66a, are routed toward the first terminals 64a on the outer peripheral region of the display area, and the first wire connectors 66a are connected electrically to the respective first terminals 64a.

A site corresponding to the first sensor part 60a includes two or more first conductive patterns 70a (mesh patterns) formed by a plurality of thin metal wires 16 (see FIG. 1). The first conductive patterns 70a extend respectively in a direction (first direction) of the arrow X, and are arranged in a direction (second direction) of the arrow Y perpendicular to the direction of the arrow X. Further, each of the first conductive patterns 70a is constituted by connection of two or more first sensing units 72a in series in the direction of the arrow X. The first sensing units 72a, which are substantially diamond shaped in profile, each include the same profile shape respectively. Between adjacent first sensing units 72a, first connectors 74a are formed, which serve to connect the first sensing units 72a electrically. More specifically, via the first connectors 74a, the vertex of one of the first sensing units 72a is connected to the vertex of another of the first sensing units 72a, which is adjacent to the one first sensing units 72a in the direction of the arrow X.

On one end side of each of the first conductive patterns 70a, the first connectors 74a are not formed on open ends of the first sensing units 72a. On the other end side of each of the first conductive patterns 70a, the first wire connectors 66a are provided respectively on ends of the first sensing units 72a. In addition, each of the first conductive patterns 70a is connected electrically via the respective first wire connectors 66a to the first terminal wire patterns 68a.

Further, substantially diamond shaped first interspatial portions 75a are formed, respectively, each of which is surrounded by pairs (i.e., two pairs) of first sensing units 72a, 72a from among the adjacent first conductive patterns 70a.

Figure 6:
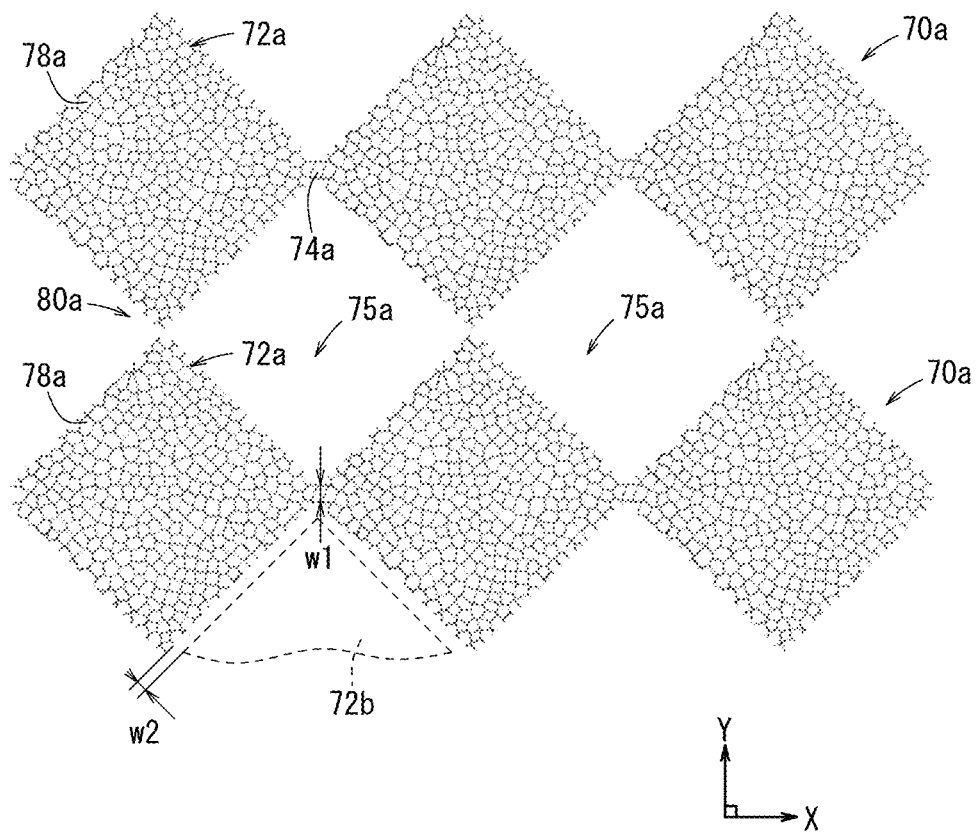
FIG. 6 is a partially enlarged plan view of a first sensor part of FIG. 5A.

As shown in FIG. 6, each of the first sensing units 72a is constituted by combining at least two first mesh elements 78a. The shape of each first mesh element 78a is a polygonal having at least three sides, similar to the aforementioned mesh shapes 22 (see FIG. 1). The first connector 74a, which is connected between adjacent first sensing units 72a, is constituted from at least one of the first mesh elements 78a.

Moreover, the first mesh elements 78a, which constitute peripheral edge portions of each of the first sensing units 72a, may be closed spaces or open spaces in terms of topology (topologically). The same applies to the first connectors 74a. Further, between adjacent ones of the first conductive patterns 70a, first insulators 80a, which are electrically insulated, are disposed respectively.

On the other hand, as shown in FIG. 5B, on the other main surface of the conductive sheet 10A, on a side in the direction of the arrow Z1 as viewed in plan, there are provided a second sensor part 60b, which is disposed in the display area of the display unit 30 (see FIG. 3 and FIG. 4), and second terminal wire parts 62b (a so-called frame), which are disposed on an outer peripheral region of the display area.

The appearance and shape of the conductive sheet 10 is rectangular as viewed in plan, and the appearance and shape of the second sensor part 60b also is rectangular. Among the second terminal wire parts 62b, on a peripheral edge portion of the conductive sheet 10 on one side thereof parallel to the direction of the arrow Y, on a central portion in the lengthwise direction, plural second terminals 64b are arrayed in the direction of the arrow Y. Along one side of the second sensor part 60b (a side parallel to the direction of the arrow X in the illustrated example), plural second wire connectors 66b (e.g., odd-numbered second wire connectors 66b) are arrayed in a line. Along the other side of the second sensor part 60b (a side opposite to the aforementioned one side), plural second wire connectors 66b (e.g., even-numbered second wire connectors 66b) are arranged in a line. Second terminal wire patterns 68b, which are led out from the respective second wire connectors 66b, are routed toward the second terminals 64b on the outer peripheral region of the display area, and the second wire connectors 66b are connected electrically to the confronting second terminals 64b, respectively.

A site corresponding to the second sensor part 60b includes two or more second conductive patterns 70b (mesh patterns) formed by a plurality of thin metal wires 16 (see FIG. 1). The second conductive patterns 70b extend respectively in a direction (second direction) of the arrow Y, and are arranged in a direction (first direction) of the arrow X perpendicular to the direction of the arrow Y. Further, each of the second conductive patterns 70b is constituted by connection of two or more second sensing units 72b in series in the direction of the arrow Y. The second sensing units 72b, which are substantially diamond shaped in profile, each include the same profile shape respectively. Between adjacent second sensing units 72b, second connectors 74b are formed, which serve to connect the second sensing units 72b electrically. More specifically, via the second connectors 74b, the vertex of one of the second sensing units 72b is connected to the vertex of another of the second sensing units 72b, which is adjacent to the one second sensing units 72b in the direction of the arrow Y.

On one end side of each of the second conductive patterns 70b, the second connector 74b is not formed on an open end of the second sensing unit 72b. On the other end side of each of the second conductive patterns 70b, the second wire connector 66b is provided respectively on an end of the second sensing unit 72b. In addition, the second conductive patterns 70b are connected electrically via the respective second wire connectors 66b to the respective second terminal wire patterns 68b.

Further, substantially diamond shaped second interspatial portions 75b are formed, respectively, each of which is surrounded by pairs (i.e., two pairs) of second sensing units 72b, 72b from among the adjacent second conductive patterns 70b.

As shown in FIG. 7, each of the second sensing units 72b is constituted by combining at least two second mesh elements 78b. The shape of each second mesh element 78b is a polygonal having at least three sides, similar to the aforementioned mesh shapes 22 (see FIG. 1). Each of second connectors 74b, which is connected between adjacent second sensing units 72b, is constituted from at least one of the second mesh elements 78b.

Moreover, the second mesh elements 78b, which constitute peripheral edge portions of each of the second sensing units 72b, may be closed spaces or open spaces in terms of topology (topologically). The same applies to the second connectors 74b.

Further, between adjacent ones of the second conductive patterns 70b, second insulators 80b, which are electrically insulated, are disposed respectively.

Figure 8:
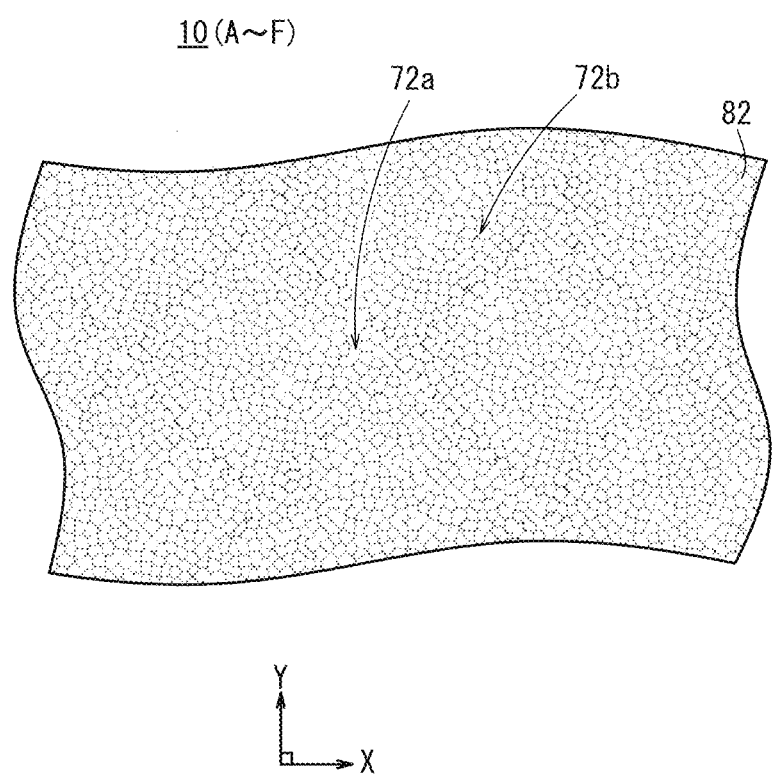
FIG. 8 is a schematic plan view of a conductive sheet in a condition in which a first conductive portion and a second conductive portion are combined.

As shown in FIG. 8, in a plan view of the conductive sheet 10A comprising the first sensor part 60a and the second sensor part 60b, a configuration is provided in which the second conductive patterns 70b, which are formed on the other surface (on the side in the direction of the arrow Z2), are arranged in an embedded manner in interspaces (part of the first interspatial portions 75a) of the first conductive patterns 70a, which are formed on the one surface (on the side in the direction of the arrow Z1). Further, in a planar region in which the profile of the first conductive patterns 70a overlaps with the profile of the second conductive patterns 70b, positions of the thin metal wires 16 of both of the conductive patterns match completely. As a result, in a case where the conductive sheet 10A is viewed in plan, a form is brought about in which multiple polygons 82 (mesh shapes) are spread all over. Further, since the thin metal wires 16 at respective peripheral edge portions of the first sensing units 72a and the second sensing units 72b are arranged in a seamless manner respectively as viewed in plan, the outline diamond-shaped pattern thereof no longer is visible.

The length of one side of the first sensing units 72a (and the second sensing units 72b) preferably is 3-10 mm, and more preferably, is 4-6 mm. In the case that the length of the one side is less than the aforementioned lower limit value and the conductive sheet 10A is applied to a touch panel, since the detected electrostatic capacitance of the first sensing units 72a (and the second sensing units 72b) decreases, the possibility for detection failures to occur increases. On the other hand, if the aforementioned upper limit value is exceeded, the detection precision of the contact position tends to decrease. From the same standpoint, as noted above, the average length of one side of the polygons 82 (first mesh elements 78a, second mesh elements 78b) preferably is 100-400 μm, more preferably, is 150-300 μm, and most preferably, is 210-250 μm. In the case that the sides of the polygons 82 are within the aforementioned ranges, transparency can be more suitably maintained, and the display screen can be viewed without discomfort in a case where the conductive sheet is attached to the front of the display unit 30.

Returning to FIG. 6, the width w1 of the first connectors 74a preferably is 0.2-1.0 mm, and more preferably, is 0.4-0.8 mm. If the width w1 is less than the aforementioned lower limit value, since the number of wires connecting the respective first sensing units 72a decreases, inter-electrode resistance increases. On the other hand, if the width w1 is in excess of the aforementioned upper limit value, since the overlapping area of the second sensing units 72b increases, the amount of noise is increased. Note that the same width w1 also applies in relation to the width of the second connectors 74b (see FIG. 7).

Further, the form shown in FIG. 8 may also be realized by disposing dummy patterns (a pattern made up of insulated thin metal wires 16) in the vicinity of at least one of the first sensing units 72a and the second sensing units 72b, and thereby complementing the interspaces between the first sensing units 72a and the second sensing units 72b with such dummy patterns. In this case, the width w2 that separates the first sensing units 72a and the second sensing units 72b preferably is 0.1-0.6 mm, and more preferably is 0.2-0.5 mm. In the case that the width w2 is less than the aforementioned lower limit value, since the amount of change in electrostatic capacitance accompanying contact (or proximity) of the contact body 58 becomes smaller, the signal amount tends to decrease. On the other hand, if the width w2 exceeds the aforementioned upper limit value, since the density of the first sensing units 72a is decreased, the resolution of the sensor tends to decrease.

[Structure of Conductive Sheet 10B According to First Modification]

Next, a description will be made, with reference to FIGS. 9A through 10, concerning the structure of a conductive sheet 10B according to a first modification of the first embodiment. Constituent elements thereof, which exhibit the same functions as those according to the conductive sheet 10A, are denoted using the same reference characters and detailed description of such features is omitted. The same applies to other modifications and embodiments to be described later.

Figure 9A:
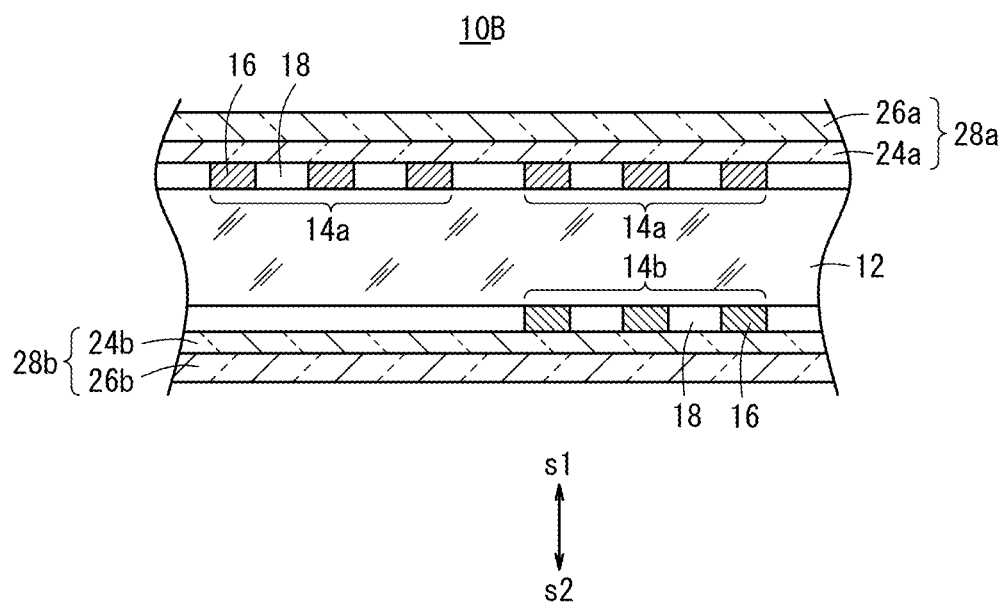
FIG. 9A is a cross sectional view with partial omission of a conductive sheet according to a first modification.
Figure 9B:
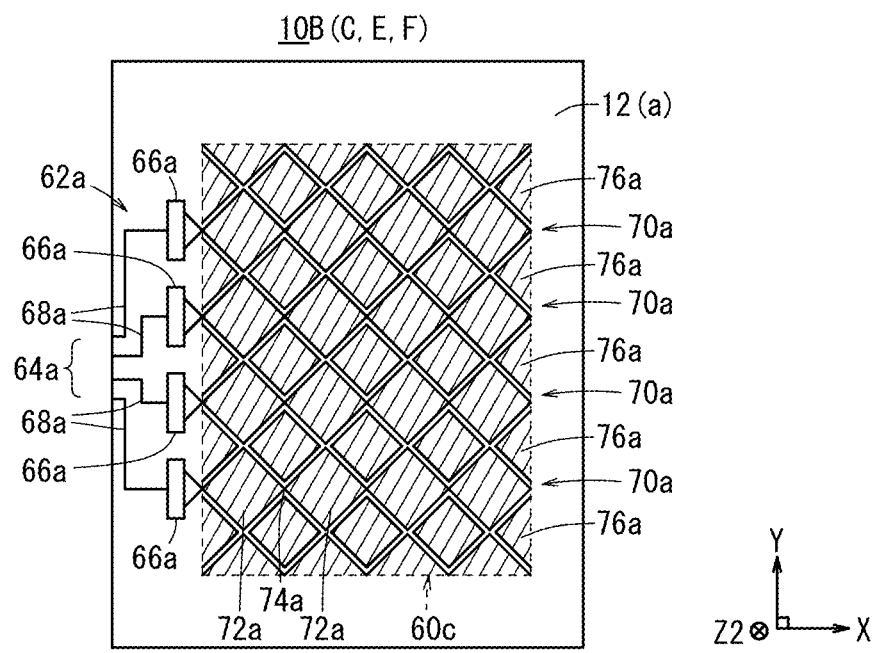
FIG. 9B is a plan view showing an example pattern of a first stacked portion shown in FIG. 9A.

FIG. 9A is a cross sectional view with partial omission showing the conductive sheet 10B according to the first modification. FIG. 9B is a plan view showing an example pattern of a first stacked portion 28a shown in FIG. 9A. FIG. 10 is a partially enlarged plan view of a first sensor part 60c of FIG. 9B. In relation to the conductive sheet 10B, the first conductive portion 14a is formed on one main surface (on a side in the direction of the arrow s1 in FIG. 9A) of the transparent substrate 12 without gaps substantially over the entire surface thereof.

Figure 10:
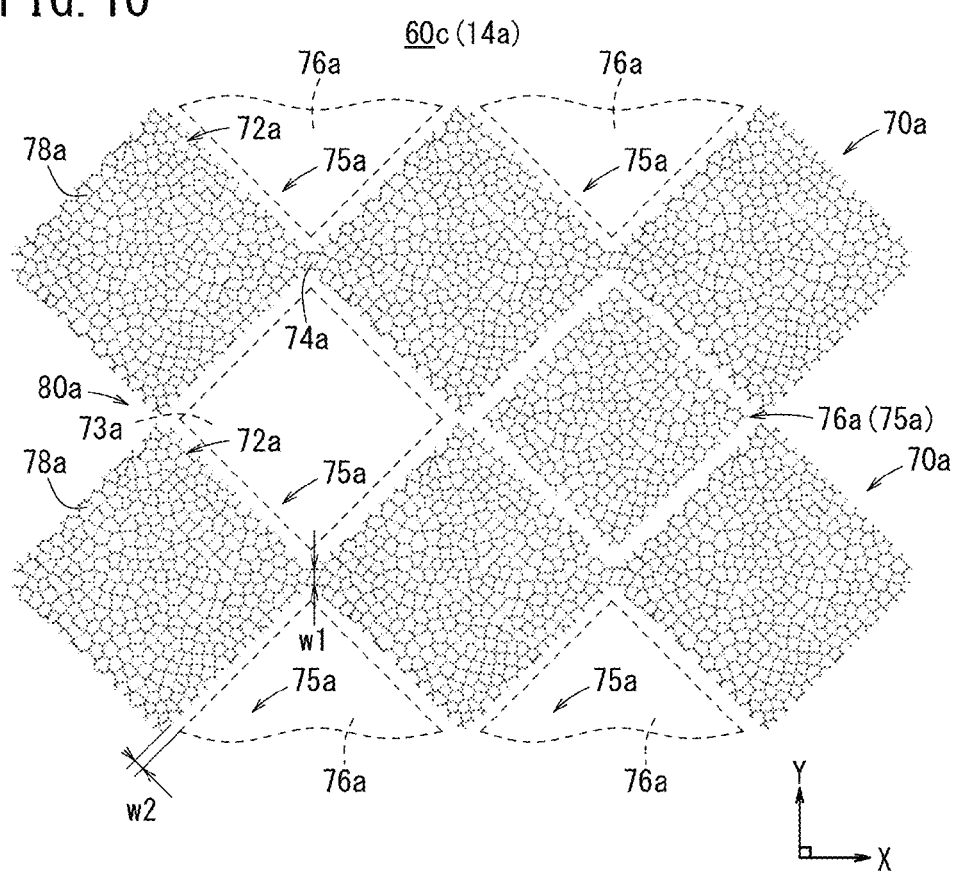
FIG. 10 is a partially enlarged plan view of a first sensor part of FIG. 9B.

As shown in FIG. 9B and FIG. 10, at a site corresponding to the first sensor part 60c, there are further included at least two first dummy patterns 76a (mesh patterns), which are formed by plural thin metal wires 16 (see FIG. 1). The first dummy patterns 76a are arranged respectively in first interspatial portions 75a (see FIG. 6) that reside between adjacent first conductive patterns 70a. The first dummy patterns 76a, which are substantially diamond-shaped in profile, are disposed while being separated at a predetermined interval from each of the first conductive patterns 70a (first sensing units 72a and first connectors 74a). More specifically, the first dummy patterns 76a are placed under a condition in which they are insulated electrically from the respective first conductive patterns 70a.

Moreover, the interval (width) is extremely small compared with the side length of the first sensing units 72a. Accordingly, in the first sensor part 60c, the thin metal wires 16 are arranged with substantially uniform density over the entire surface thereof.

For facilitating explanation, in FIG. 10, mesh shapes are denoted, but only in relation to one of the first dummy patterns 76a (in a center right portion of the figure). In relation to the other first dummy patterns 76a, profiles thereof are shown in dashed lines, while the interior shapes thereof are omitted from illustration.

As shown in FIG. 10, each of the first dummy patterns 76a is combined with at least two first mesh elements 78a. The shape of each first mesh element 78a, in the same manner as the aforementioned mesh shapes 22 (see FIG. 1), is of a polygonal shape having at least three sides. Further, the first mesh elements 78a, which constitute peripheral edge portions of each of the first dummy patterns 76a, may be closed spaces or open spaces in terms of topology (topologically).

The wiring density of the first dummy patterns 76a is equivalent to the wiring density of the first conductive patterns 70a (first sensing units 72a and first connectors 74a). In this case, the optical reflectance in a planar region of the first dummy patterns 76a matches the optical reflectance within the planar region of the first conductive patterns 70a. If the wire width of the thin metal wires 16 is constant, it follows that a high correlation exists between wire density and optical reflectance.

Moreover, as used in the present specification, the phrase "wiring density is equivalent" implies not only a case of complete equivalence, but is a concept including substantial equivalence (i.e., lying in a range in which the density ratio generally is 0.8-1.2). More specifically, a difference in optical reflectance is acceptable insofar as such a difference cannot be detected visually by humans (observers). Further, the measurement area of the wiring density of the thin metal wires 16 may be 1 $mm^2$ or greater, taking into consideration measurement precision, etc.

Further, the distance between each of the first conductive patterns 70a and each of the first dummy patterns 76a may be constant (including substantially constant) irrespective of positions thereof. This is preferable because, in such a case, the wiring density of the thin metal wires 16 approaches uniformity.

Furthermore, the coverage (arrangement percentage) of the first dummy patterns 76a with respect to the first interspatial portions 75a preferably lies generally in a range of 30% to 95%, and more preferably, in a range of 70% to 95%.

Moreover, the profile of each of the first dummy patterns 76a may take the form of various shapes including triangular, rectangular, circular, etc. For example, the profile shape (in the example of FIG. 10, an outline diamond shape is shown) of each first dummy pattern 76a may be of the same shape as or similar in shape to the first sensing units 72a.

As shown in FIG. 8, as viewed in plan, in the conductive sheet 10B equipped with the first sensor part 60c and the second sensor part 60b (see FIG. 5B), a configuration is provided in which the second conductive patterns 70b, which are formed on the other surface (on the side in the direction of the arrow Z2), are arranged in an embedded manner in interspaces of the first conductive patterns 70a and the first dummy patterns 76a, which are formed on the one surface (on the side in the direction of the arrow Z1). Further, in a planar region in which profiles of the first conductive patterns 70a and the first dummy patterns 76a overlap with profiles of the second conductive patterns 70b, positions of the thin metal wires 16 of both of the patterns match completely. As a result, in a case where the conductive sheet 10B is viewed in plan, a form is brought about in which multiple polygons 82 are spread all over.

[Structure of Conductive Sheet 10C According to Second Modification]

Next, a description will be made, with reference to FIGS. 11A through 12, concerning the structure of a conductive sheet 10C according to a second modification of the first embodiment.

Figure 11A:
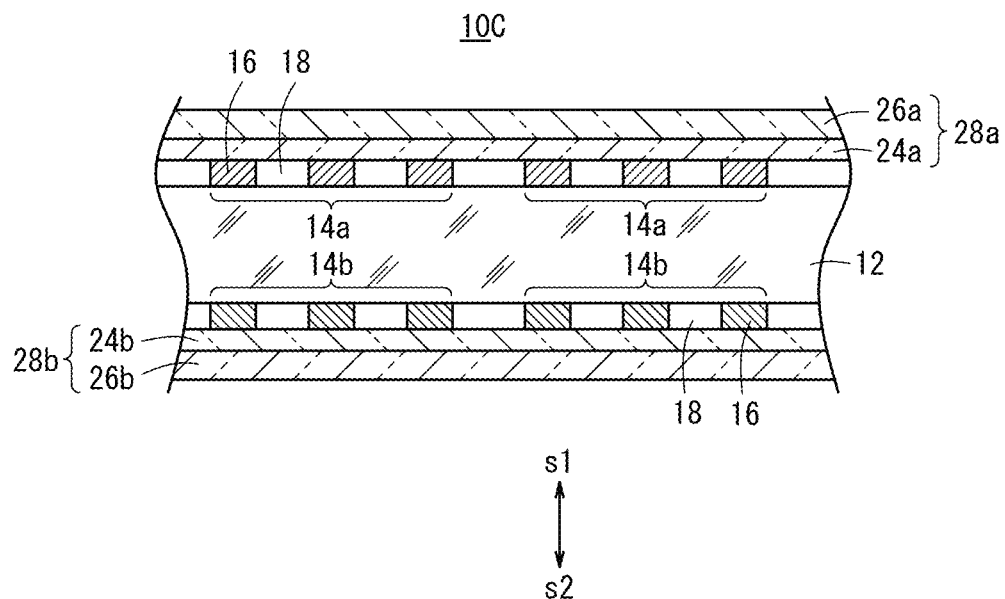
FIG. 11A is a cross sectional view with partial omission of a conductive sheet according to a second modification.
Figure 11B:
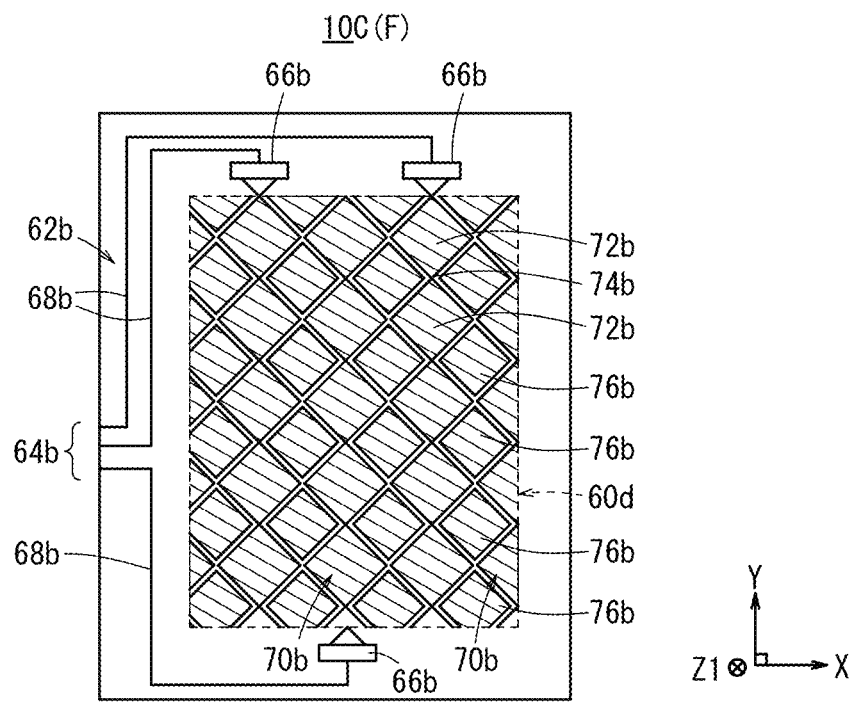
FIG. 11B is a plan view showing an example pattern of a second stacked portion shown in FIG. 11A.

FIG. 11A is a cross sectional view with partial omission showing the conductive sheet 10C according to the second modification. FIG. 11B is a plan view showing an example pattern of a second stacked portion 28b shown in FIG. 11A. FIG. 12 is a partially enlarged plan view of a second sensor part 60d of FIG. 11B.

In relation to the conductive sheet 100, the first conductive portion 14a is formed on one main surface (on a side in the direction of the arrow s1 in FIG. 11A) of the transparent substrate 12 without gaps substantially over the entire surface thereof, and the second conductive portion 14b is formed on the other main surface (on a side in the direction of the arrow s2 in FIG. 11A) without gaps substantially over the entire surface thereof.

Figure 12:
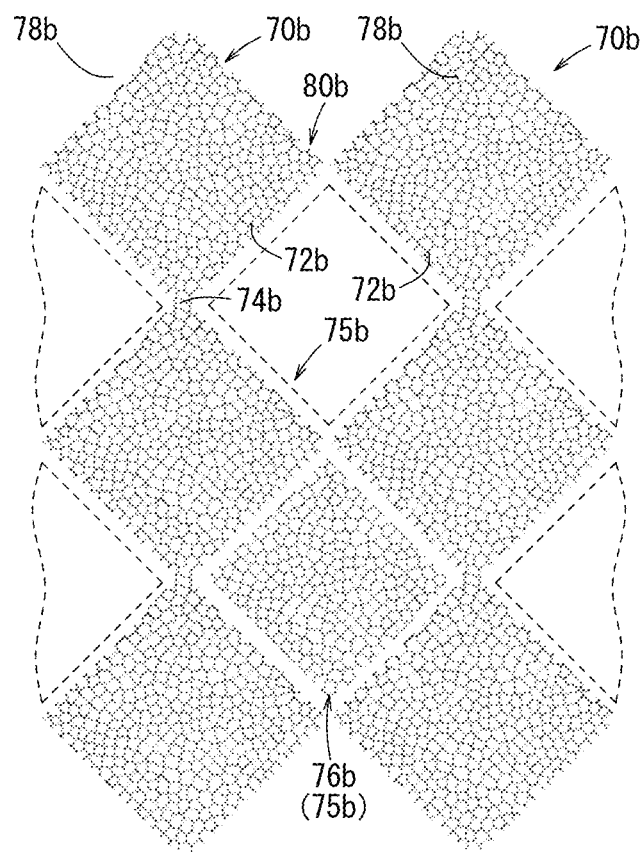
FIG. 12 is a partially enlarged plan view of a second sensor part of FIG. 11B.

As shown in FIG. 11B and FIG. 12, at a site corresponding to the second sensor part 60d, there are further included at least two second dummy patterns 76b (mesh patterns), which are formed by plural thin metal wires 16 (see FIG. 1). The second dummy patterns 76b are arranged respectively in second interspatial portions 75b (see FIG. 7) that reside between adjacent second conductive patterns 70b. The second dummy patterns 76b, which are substantially diamond-shaped in profile, are disposed while being separated at a predetermined interval from each of the second conductive patterns 70b (second sensing units 72b and second connectors 74b). More specifically, the second dummy patterns 76b are placed under a condition in which they are insulated electrically from the second conductive patterns 70b.

For facilitating explanation, in FIG. 12, respective mesh shapes are denoted in detail, but only in relation to one of the second dummy patterns 76b (in a center lower portion of the figure). In relation to the other second dummy patterns 76b, profiles thereof are shown in dashed lines, while the interior shapes thereof are omitted from illustration. In addition, the wiring density of the second dummy patterns 76b is equivalent to the wiring density of the second conductive patterns 70b (second sensing units 72b and second connectors 74b). The definition of the phrase "wiring density is equivalent" is the same as that described above and further description thereof is omitted.

As shown in FIG. 8, as viewed in plan, in the conductive sheet 10C equipped with the first sensor part 60c (see FIG. 9B) and the second sensor part 60d, a configuration is provided in which the second conductive patterns 70b and the second dummy patterns 76b, which are formed on the other surface (on the side in the direction of the arrow Z2), are arranged in an embedded manner in interspaces of the first conductive patterns 70a and the first dummy patterns 76a, which are formed on the one surface (on the side in the direction of the arrow Z1). Further, in a planar region in which the profile of the first conductive patterns 70a and the first dummy patterns 76a overlap with the profile of the second conductive patterns 70b and the second dummy patterns 76b, positions of the thin metal wires 16 of both conductive patterns match completely. As a result, in a case where the conductive sheet 10C is viewed in plan, a form is brought about in which multiple polygons 82 are spread all over.

With the conductive sheet 10C, the respective thin metal wires 16 are disposed such that positions thereof overlap completely over substantially the entire area. However, the thin metal wires 16 may also be disposed at mutually complementing positions between the first sensor part 60c and the second sensor part 60d. More specifically, the thin metal wires 16 may be provided as a complement in line units or area units, and the form thereof is not of concern insofar as the functions of the conductive sheet 10 can be exhibited. By reducing, as much as possible, the range in which the thin metal wires 16 overlap, it is possible to suppress the occurrence of line thickening caused by the shifting of the positions where the thin metal wires 16 are formed. As a result, visibility of the conductive sheet 10 can be further improved.

Further, by providing the thin metal wires 16 without gaps on both sides of the transparent substrate 12, in a case where the conductive sheet 100 is incorporated in the display device 40 (see FIG. 4), whether placed in either a forward or rearward facing manner, the advantages of the present invention can be achieved.

[Conductive Sheet 10D According to Second Embodiment]

Figure 13:
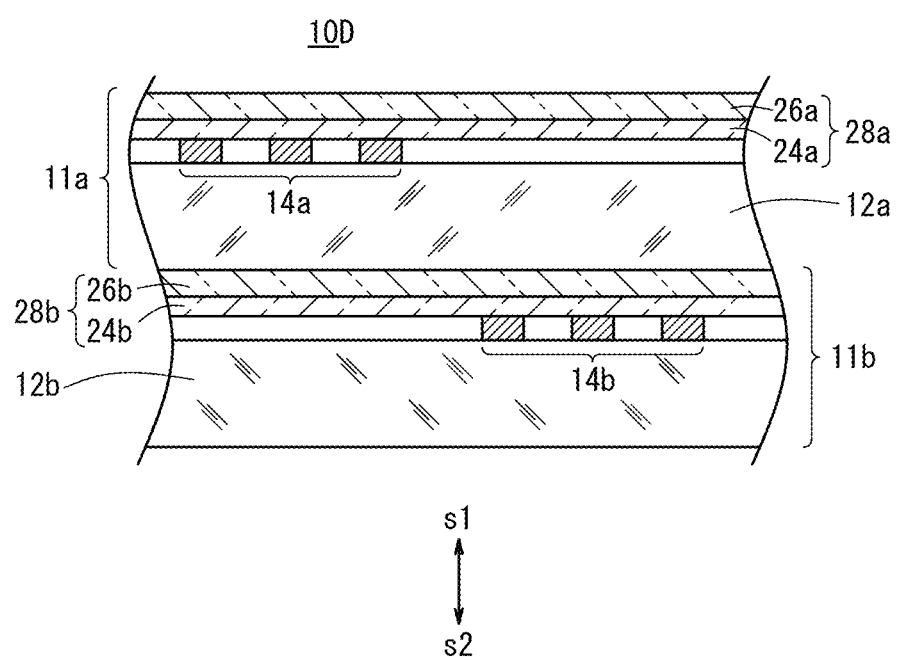
FIG. 13 is a cross sectional view with partial omission of a conductive sheet according to a second embodiment.

Next, a description shall be made with reference to FIG. 13, etc., concerning the structure of a conductive sheet 10D according to a second embodiment. FIG. 13 is a cross sectional view with partial omission of the conductive sheet 10D according to the second embodiment.

As shown in FIG. 13, the conductive sheet 10D is constituted by stacking in order from below a second sheet member 11b and a first sheet member 11a. The first sheet member 11a includes a first transparent substrate 12a (first substrate), and the second sheet member 11b includes a second transparent substrate 12b (second substrate). The first transparent substrate 12a and the second transparent substrate 12b are made from a highly-translucent material having insulation properties, such as resin, glass, silicone or the like. As suitable resins, there may be cited PET, PMMA, PP, PS, TAC, etc.

The first sheet member 11a includes a first conductive portion 14a formed on one main surface (on a side in the direction of the arrow s1) of the first transparent substrate 12a. A first protective layer 26a is bonded through a first adhesive layer 24a substantially over the entire surface of the first conductive portion 14a, so as to cover the thin metal wires 16. In a case where the relative index of refraction of the transparent substrate 12a with respect to the first protective layer 26a is defined as nr1, similar to the first embodiment, the relative index of refraction nr1 may reside within a range of being greater than or equal to 0.85 and less than or equal to 1.17, more preferably, being greater than or equal to 0.86 and less than or equal to 1.15, and still more preferably, being greater than or equal to 0.91 and less than or equal to 1.08.

The second sheet member 11b includes a second conductive portion 14b formed on one main surface (on a side in the direction of the arrow s1) of the second transparent substrate 12b. A second protective layer 26b is bonded through a second adhesive layer 24b substantially over the entire surface of the second conductive portion 14b, so as to cover the thin metal wires 16. In a case where the relative index of refraction of the transparent substrate 12b with respect to the second protective layer 26b is defined as nr2, similar to the first embodiment, the relative index of refraction nr2 may reside within a range of being greater than or equal to 0.85 and less than or equal to 1.17, more preferably, being greater than or equal to 0.86 and less than or equal to 1.15, and still more preferably, being greater than or equal to 0.91 and less than or equal to 1.08.

In the foregoing manner, the conductive sheet 10D includes the first transparent substrate 12a, the first conductive portion 14a made up from a plurality of thin metal wires 16 formed on one main surface of the first transparent substrate 12a, the first protective layer 26a disposed on the one main surface of the first transparent substrate 12a in covering relation to the first conductive portion 14a, the second transparent substrate 12b, the second conductive portion 14b made up from a plurality of thin metal wires 16 formed on one main surface of the second transparent substrate 12b, and the second protective layer 26b disposed on the one main surface of the second transparent substrate 12b in covering relation to the second conductive portion 14b.

On the one main surface side of the first transparent substrate 12a, a first sensor part 60a, which is the same as that of the first embodiment, is provided (see FIG. 5A and FIG. 6). Further, on the one main surface side of the second transparent substrate 12b, a second sensor part 60b, which is the same as that of the first embodiment, is provided (see FIG. 5B and FIG. 7).

Provided in this manner, as shown in FIG. 8, in a case where the conductive sheet 10D comprising the first sensor part 60a and the second sensor part 60b is viewed in plan, a condition is brought about in which plural polygons 82 (mesh shapes) are spread all over.

If the conductive sheet 10D is constructed as described above, the same advantages as those of the first embodiment can be obtained. Moreover, another layer (for example, an adhesive layer) may be interposed between the first sheet member 11a and the second sheet member 11b. Further, if kept in an insulated state, the first conductive portion 14a and the second conductive portion 14b can be disposed in confronting relation to each other.

[Conductive Sheet 10E According to First Modification]

Figure 14A:
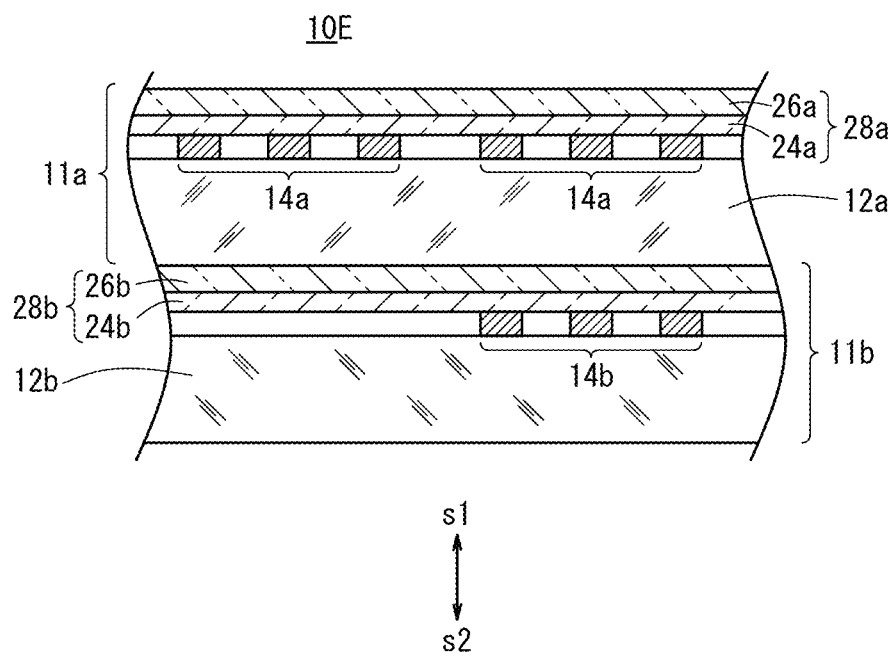
FIG. 14A is a cross sectional view with partial omission of a conductive sheet according to a first modification.

Next, a description will be made, with reference to FIG. 14A, concerning the structure of a conductive sheet 10E according to a first modification of the second embodiment. FIG. 14A is a partial schematic cross sectional view of the conductive sheet 10E according to the first modification. Concerning the conductive sheet 10E, the first conductive portion 14a is formed without gaps substantially over the entire surface on one main surface (on a side in the direction of the arrow s1) of the first transparent substrate 12a.

More specifically, the first sensor part 60c (see FIG. 9B and FIG. 10) is disposed on the side in the direction of the arrow s1 of the conductive sheet 10E, and the second sensor part 60b (see FIG. 5B and FIG. 7) is disposed on the side in the direction of the arrow s2 of the conductive sheet 10E. Consequently, as shown in FIG. 8, in a case where the conductive sheet 10E is viewed in plan, a form is brought about in which multiple polygons 82 are spread all over.

[Conductive Sheet 10F According to Second Modification]

Figure 14B:
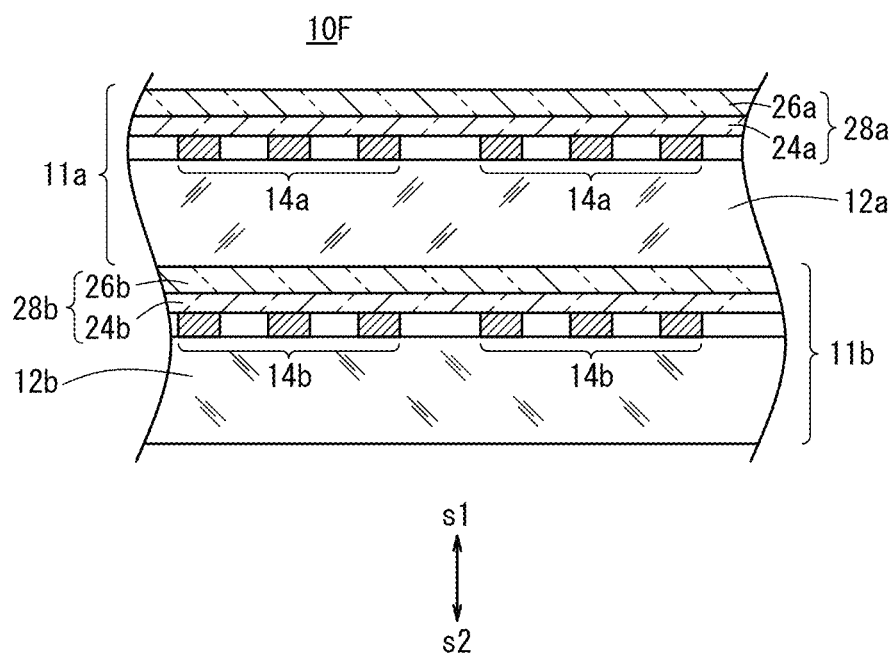
FIG. 14B is a cross sectional view with partial omission of a conductive sheet according to a second modification.

Next, a description will be made with reference to FIG. 14B, concerning the structure of a conductive sheet 10F according to a second modification of the second embodiment. FIG. 14B is a partial schematic cross sectional view of the conductive sheet 10F according to the second modification. Concerning the conductive sheet 10F, the first conductive portion 14a is formed without gaps substantially over the entire surface on one main surface (on a side in the direction of the arrow s1) of the first transparent substrate 12a. In addition, the second conductive portion 14b is formed without gaps substantially over the entire surface on one main surface (on a side in the direction of the arrow s1) of the second transparent substrate 12b.

More specifically, the first sensor part 60c (see FIG. 9B and FIG. 10) is disposed on the side in the direction of the arrow s1 of the conductive sheet 10F, and the second sensor part 60d (see FIG. 11B and FIG. 12) is disposed on the side in the direction of the arrow s2 of the conductive sheet 10F. Consequently, as shown in FIG. 8, in a case where the conductive sheet 10F is viewed in plan, a form is brought about in which multiple polygons 82 are spread all over.

[First Sensor Part 60e and Second Sensor Part 60f According to Third Modification]

Figure 15A:
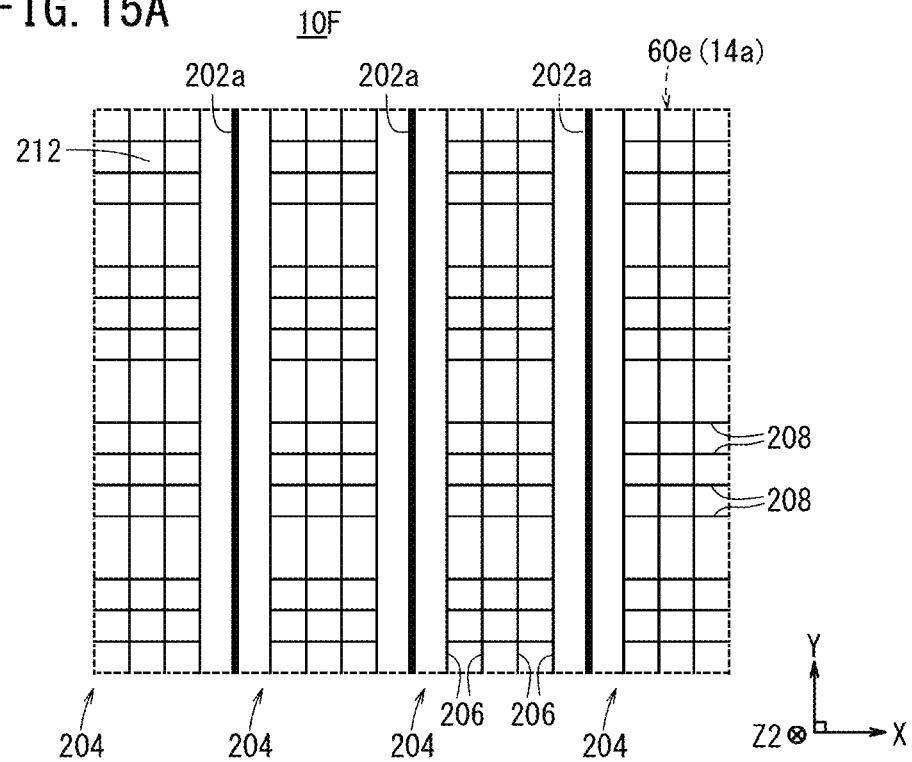
FIG. 15A is a partially enlarged plan view of a first sensor part according to a third modification.
Figure 15B:
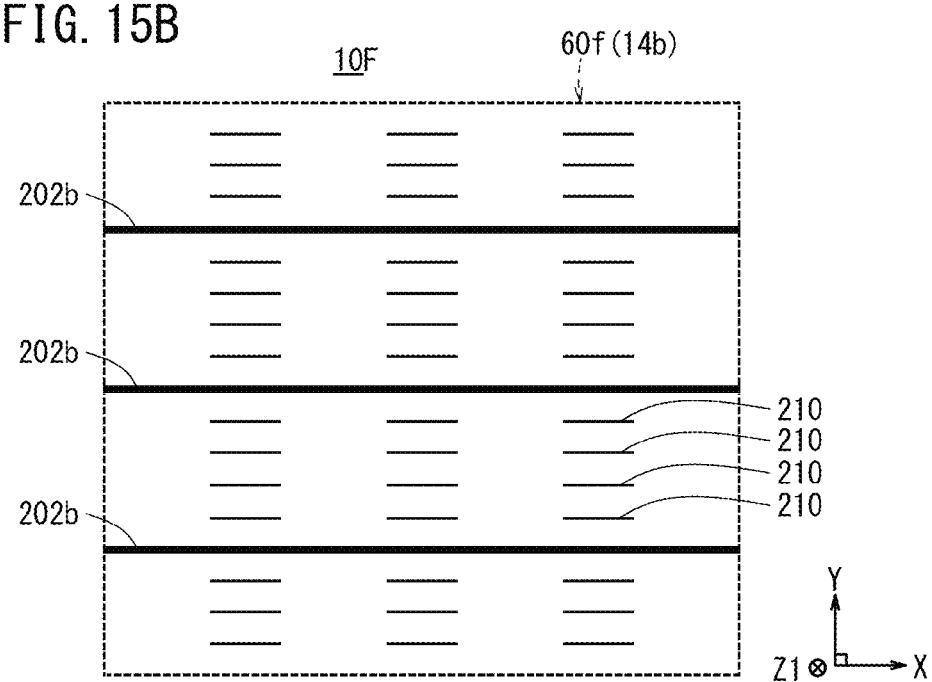
FIG. 15B is a partially enlarged plan view of a second sensor part according to the third modification.

Next, a description will be made, with reference to FIG. 15A and FIG. 15B, concerning the structure of a first sensor part 60e and a second sensor part 60f according to a third modification of the second embodiment. FIG. 15A is a partially enlarged plan view of the first sensor part 60e according to the third modification. FIG. 15B is a partially enlarged plan view of the second sensor part 60f according to the third modification.

In FIG. 15A and FIG. 15B, for facilitating explanation, only an outline of the mesh pattern 20 formed by multiple thin metal wires 16, is denoted by single lines. More specifically, if portions of each of the single lines shown in FIG. 15A and FIG. 15B were enlarged, the structure of the mesh pattern 20 shown in FIG. 1 would become apparent.

As shown in FIG. 15A, at a site corresponding to the first sensor part 60e, two or more first conductive patterns 202a formed by multiple thin metal wires 16 are included. The first conductive patterns 202a extend respectively in the direction of the arrow Y, and are arranged at equal intervals in the direction of the arrow X perpendicular to the direction of the arrow Y. Further, the first conductive patterns 202a differ from the second conductive patterns 70b (see FIG. 5B, etc.) and are strip shaped patterns having substantially constant widths. Lattice-shaped first dummy patterns 204 are disposed respectively between each of the first conductive patterns 202a. The first dummy patterns 204 are constituted from four elongate line patterns 206 that extend in the direction of the arrow Y and are arranged at equal intervals, and a plurality of short line patterns 208 disposed perpendicularly to the four elongate line patterns 206, respectively. The respective short line patterns 208 are of the same length, repeated in units of four each, which are arrayed at equal intervals with respect to the direction of the arrow Y.

As shown in FIG. 15B, at a site corresponding to the second sensor part 60f, two or more second conductive patterns 202b formed by multiple thin metal wires 16 are included. The second conductive patterns 202b extend respectively in the direction of the arrow X, and are arranged at equal intervals in the direction of the arrow Y perpendicular to the direction of the arrow X. Further, the second conductive patterns 202b differ from the second conductive patterns 70b (see FIG. 5B, etc.) and are strip shaped patterns having substantially constant widths. Straight line shaped second dummy patterns 210, which extend in the direction of the arrow X, are arranged in plurality between each of the second conductive patterns 202b. The respective second dummy patterns 210 are of the same length, repeated in units of four each, which are arrayed at equal intervals with respect to the direction of the arrow Y.

More specifically, as viewed in plan, by mutually complementing the patterns, which are formed in the first sensor part 60e (see FIG. 15A) and the second sensor part 60f (see FIG. 15B), a lattice shape pattern is formed with one lattice element 212 as one unit. If constructed in this manner, the same advantages as those of the first and second embodiments can be obtained.

[First Mechanism for Improving Visibility of the Conductive Sheet 10]

Next, with reference to FIGS. 16A through 17B, an explanation shall be given concerning advantages and effects obtained by maintaining the relative index of refraction nr1 of the transparent substrate 12 with respect to the first protective layer 26a in the vicinity of 1. To facilitate understanding, parts of the structure of the conductive sheet 10 are omitted, and only the transparent substrate 12, the first conductive portion 14a, and the first protective layer 26a are denoted.

Figure 16A:
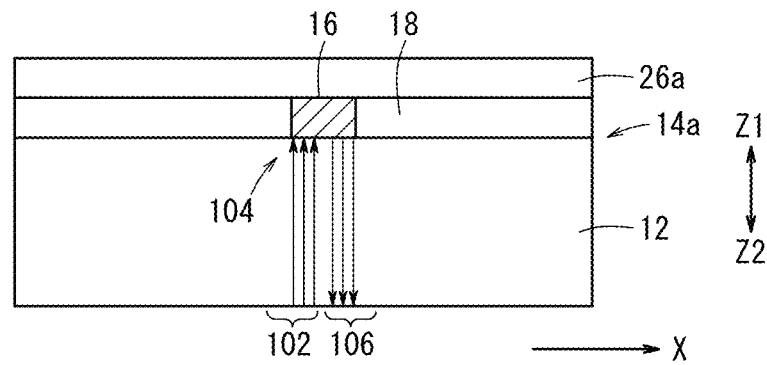
FIG. 16A is an outline schematic diagram showing paths of parallel light which are irradiated toward thin metal wires.

As shown in FIG. 16A, parallel light 102, which is irradiated from the side of the display unit 30 (see FIG. 4), enters into the interior of the transparent substrate 12 and travels in straight lines in the direction of the arrow Z1. In addition, at a first interface 104 between the transparent substrate 12 and the thin metal wires 16, the parallel light 102 is reflected as a reflected light component 106 substantially completely in the direction of the arrow Z2. More specifically, corresponding to the presence or absence of the thin metal wires 16, which are formed from a non-translucent material, the difference in the amount of light that is transmitted through the conductive sheet 10 is large. As a result, shading becomes significant responsive to the shape of the mesh pattern, making it easy for moiré phenomena to be generated. In contrast thereto, in the case of a conductive sheet that uses a translucent conductive material (typically, ITO), the above described effect virtually is not imparted.

Next, an optical phenomenon that occurs in the case that the difference in the index of refraction between the transparent substrate 12 and the first protective layer 26a is large, i.e., in the event that the relative index of refraction nr1 is far from the value 1, will be explained with reference to FIG. 16B and FIG. 16C.

Figure 16B:
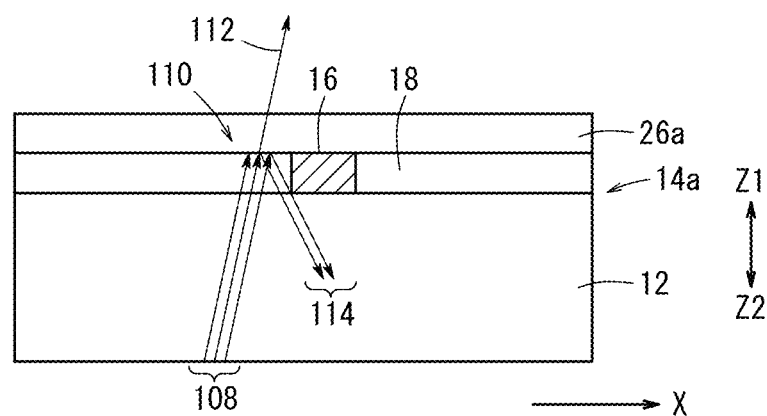
FIG. 16B is an outline schematic diagram showing paths of oblique light which are irradiated toward thin metal wires.

As shown in FIG. 16B, light (oblique light 108), which is incident at a slight angle with respect to the direction of the arrow Z1, is irradiated into the interior of the transparent substrate 12, and travels in a straight line to a second interface 110 between the first conductive portion 14a (openings 18) and the first protective layer 26a. In addition, concerning the oblique light 108, due to a refraction phenomenon caused by the second interface 110, a portion of the light (linear component 112) is transmitted through the first protective layer 26a, and the remainder of the light (reflected component 114) is reflected. At this time, since the relative index of refraction nr1 is far from the value 1, interfacial transmittance is decreased, and the amount of light of the linear component 112 (or the reflected component 114) decreases (or increases) relatively.

Figure 16C:
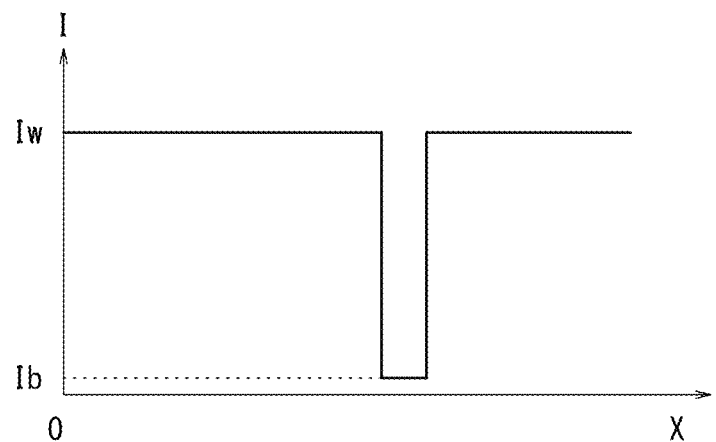
FIG. 16C is a graph showing an intensity distribution of transmitted light in FIG. 16B.

For example, as shown in FIG. 16C, a light intensity I=Iw at positions corresponding to the openings 18, and a light intensity I=Ib at positions corresponding to the thin metal wires 16, are transmitted respectively and detected. In this case, the optical density due to the thin metal wires 16 is represented by $\Delta D1=-\log(Ib/Iw)$, on the basis of the detected light intensity at the openings 18.

Next, an optical phenomenon that occurs in the case that the difference in the index of refraction between the transparent substrate 12 and the first protective layer 26a is small, i.e., in the event that the relative index of refraction nr1 is near to the value 1, will be explained with reference to FIG. 17A and FIG. 17B.

In the case that the relative index of refraction nr1 is near to the value 1, as can be easily derived from optical considerations, the interfacial transmittance approaches 1 (the interfacial reflectance approaches 0). Accordingly, the light intensity of the linear component 116 (or the reflected component 118) is increased (or decreased) relatively compared to the case of FIG. 16B. Stated otherwise, the light intensity transmitted through the interior of the transparent substrate 12 without being subjected to scattering increases uniformly irrespective of the position of the thin metal wires 16 that are constituted from a non-translucent material. Below, for facilitating explanation, it will be assumed that the detected light intensity is increased by a value (positive value) ϵ.

Figure 17A:
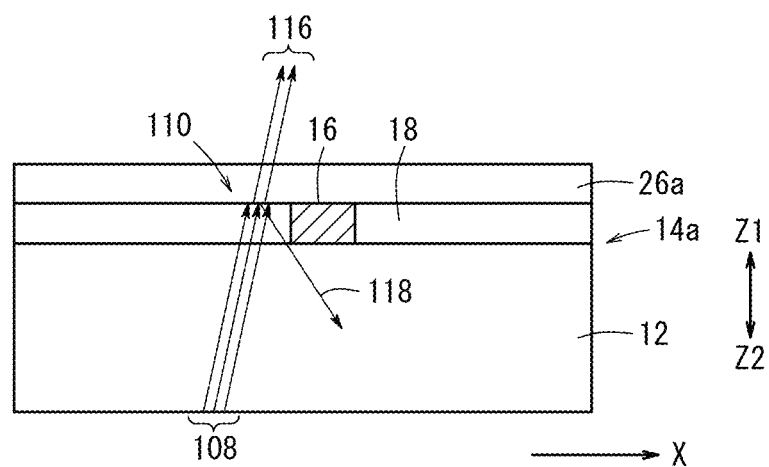
FIG. 17A is an outline schematic diagram showing paths of oblique light which are irradiated toward thin metal wires in a configuration according to the present invention.
Figure 17B:
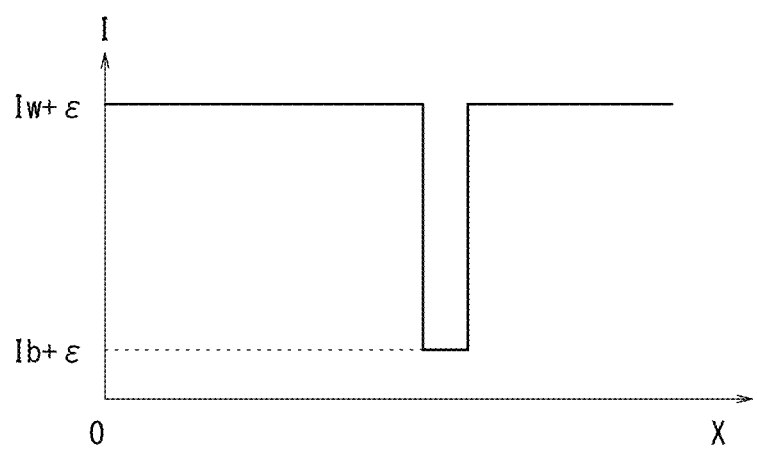
FIG. 17B is a graph showing an intensity distribution of transmitted light in FIG. 17A.

At this time, as shown in FIG. 17A and FIG. 17B, a light intensity I=Iw+ϵ at a position corresponding to the openings 18, and a light intensity I=Ib+ϵ at the position corresponding to the thin metal wires 16 are transmitted respectively and detected. The optical density due to the thin metal wires 16 is represented by $\Delta D2=-\log\{(Ib+\epsilon)/(Iw+\epsilon)\}$, on the basis of the detected light intensity at the openings 18.

Since the inequality $(Ib/Iw)<(Ib+\epsilon)/(Iw+\epsilon)$ is satisfied if $Iw>Ib\geq 0$ and $\epsilon>0$, the relationship $\Delta D1>\Delta D2$ normally holds true. More specifically, by maintaining the relative index of refraction nr1 between the transparent substrate 12 and the first protective layer 26a close to the value 1, contrast in optical density due to the thin metal wires 16 can be reduced. As a result, in a case where the display device 40 is viewed in plan, it is difficult for the user to visually perceive the pattern of the thin metal wires 16.

The same advantages can be realized not only in relation to the transparent substrate 12 and the first protective layer 26a shown in FIGS. 2, 9A, and 11A, but also in relation to the transparent substrate 12 and the second protective layer 26b (refer to FIG. 2). The same also holds true in relation to the first transparent substrate 12a and the first protective layer 26a in FIGS. 13 through 14B, or in relation to the second transparent substrate 12b and the second protective layer 26b.

The relative indices of refraction nr1, nr2 preferably are in the range of 0.85-1.17, more preferably, are in the range of 0.86-1.15, and still more preferably, are in the range of 0.91-1.08. In particular, if at least one of the first protective layer 26a and the second protective layer 26b are made from the same material as the transparent substrate 12, the equation nr1=1 (nr2=1) is satisfied, which is even more preferable.

In the foregoing manner, at least one of the relative index of refraction nr1 of the transparent substrate 12 (or the first transparent substrate 12a) with respect to the first protective layer 26a, and the relative index of refraction nr2 of the transparent substrate 12 (or the second transparent substrate 12b) with respect to the second protective layer 26b is in the range of 0.86-1.15. Therefore, among the light (oblique light), which is inclined slightly with respect to a direction normal to the transparent substrate 12 (the direction of the arrow Z1), the light intensity (linear component 116) at at least one of the interface between the transparent substrate 12 and the first protective layer 26a, and the interface between the transparent substrate 12 and the second protective layer 26b is increased relatively. More specifically, the amount of light that passes through the interior of the transparent substrate 12 without scattering increases uniformly irrespective of the position of the thin metal wires 16 that are constituted from a non-translucent material. Consequently, contrast in optical density caused by the thin metal wires 16 can be decreased, thus making such contrast less visible to an observer (user). In particular, with a mesh pattern 20 in which different mesh shapes 22 are arranged without gaps, since generation of noise graininess can be suppressed, even further advantages are achieved. Moreover, not only in cases where the respective mesh shapes 22 are polygonal, with various other shapes as well, it goes without saying that the aforementioned effects and advantages can be obtained.

[Second Mechanism for Improving Visibility of the Conductive Sheet 10]

Next, with reference to FIGS. 18A through 19C, an explanation shall be given concerning advantages and effects obtained by providing the first dummy patterns 76a on the conductive sheet 10. To facilitate understanding, the structure of the first protective layer 26a is omitted, and optical phenomena will be described in which the influence of effects due to refraction of light is slight.

Figure 18A:
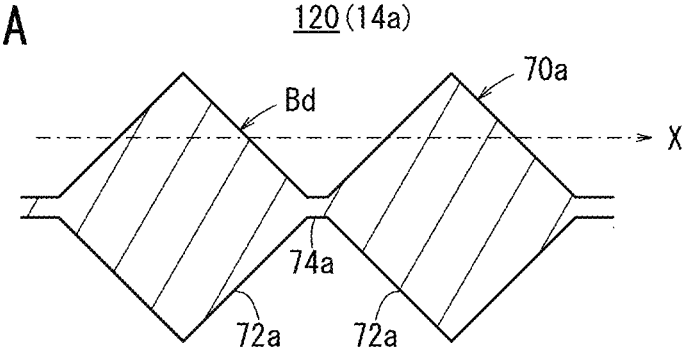
FIG. 18A is a schematic plan view of a first sensor part according to a reference example.

FIG. 18A is a schematic plan view of a first sensor part 120 according to a reference example. The first sensor part 120 is made up from only the first conductive patterns 70a, and has a form in which the first dummy patterns 76a (see FIG. 9B and FIG. 10) are omitted.

Figure 18B:
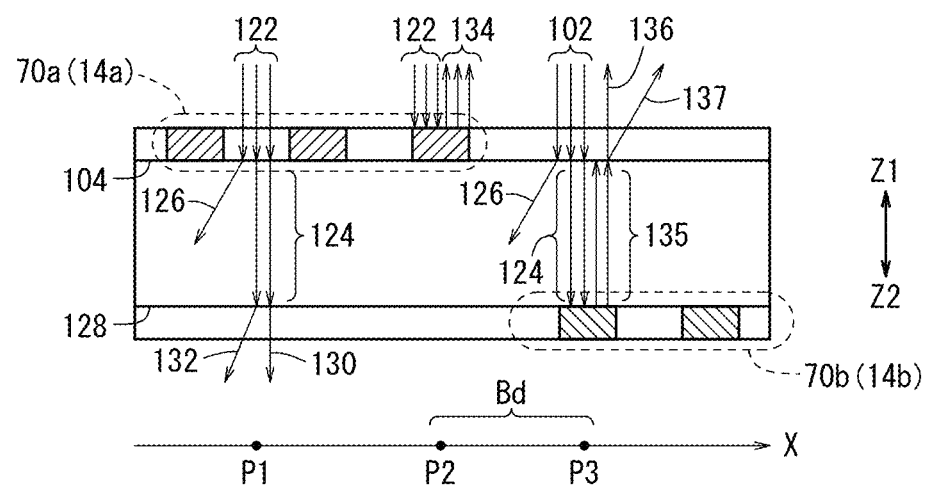
FIG. 18B is an outline schematic diagram showing paths of external light incident on the first sensor part of FIG. 18A.

FIG. 18B is a schematic diagram showing paths of external light 122 incident on the first sensor part 120. The present drawing corresponds to an outline cross sectional view in the vicinity of a boundary Bd of the first conductive patterns 70a shown in FIG. 18A.

The position P1 corresponds to a position at which the thin metal wires 16 do not reside in the first conductive portion 14a or the second conductive portion 14b. External light 122, which is irradiated from the exterior of the display device 40 (see FIG. 4), enters into the interior of the conductive sheet 10 and travels straight in substantially parallel to the direction of the arrow Z2. In addition, at a first interface 104 between the openings 18 and the transparent substrate 12, the external light 122 is transmitted substantially entirely in the direction of the arrow Z2. At this time, a portion of the transmitted light travels in a straight line as a linear component 124 in the direction of the arrow Z2, whereas the remaining portion thereof is scattered as a scattered component 126. Thereafter, the linear component 124 is transmitted substantially entirely in the direction of the arrow Z2 at a third interface 128 between the transparent substrate 12 and the openings 18. A portion of the transmitted light travels in a straight line as a linear component 130 in the direction of the arrow Z2, whereas the remaining portion thereof is scattered as a scattered component 132. As a result, the majority of the external light 122 irradiated toward the position P1 is emitted in the direction of the arrow Z2 of the conductive sheet 10.

The position P2 corresponds to a position at which the thin metal wires 16 reside in the first conductive portion 14a (first conductive patterns 70a), and at which the thin metal wires 16 do not reside in the second conductive portion 14b. External light 122, which is irradiated from the exterior of the display device 40 (see FIG. 4), is reflected substantially completely as a reflected component 134 in the direction of the arrow Z1 at the surface of the first conductive portion 14a (non-translucent material thin metal wires 16).

The position P3 corresponds to a position at which the thin metal wires 16 do not reside in the first conductive portion 14a (first conductive patterns 70a), and at which the thin metal wires 16 reside in the second conductive portion 14b (second conductive patterns 70b). External light 122, which is irradiated from the exterior of the display device 40 (see FIG. 4), enters into the interior of the conductive sheet 10, and travels in the straight line substantially in parallel in the direction of the arrow Z2. In addition, at the first interface 104, the external light 122 is transmitted substantially entirely in the direction of the arrow Z2. At this time, a portion of the transmitted light travels in a straight line as a linear component 124 in the direction of the arrow Z2, whereas the remaining portion thereof is scattered as a scattered component 126. In addition, at the third interface 128 (a surface of the non-translucent material thin metal wires 16), the linear component 124 is reflected substantially entirely as a reflected component 135 in the direction of the arrow Z1. Thereafter, the reflected component 135 travels in a straight line through the interior of the transparent substrate 12 in the direction of the arrow Z1, and is transmitted substantially entirely in the direction of the arrow Z1 at the first interface 104. As a result, a portion of the external light 122 irradiated toward the position P3 is emitted to the outside of the conductive sheet 10 (in the direction of the arrow Z1) as a linear component 136 (or as a scattered component 137).

In this manner, it is understood that the reflected light intensity Ir (reflected component 134) at the position P2 is greater in comparison with the reflected light intensity Ir (linear component 136) at the position P3. This is caused by the difference (corresponding to two times the value of the width of the transparent substrate 12) in the light path length until reaching the position of the thin metal wires 16.

Figure 18C:
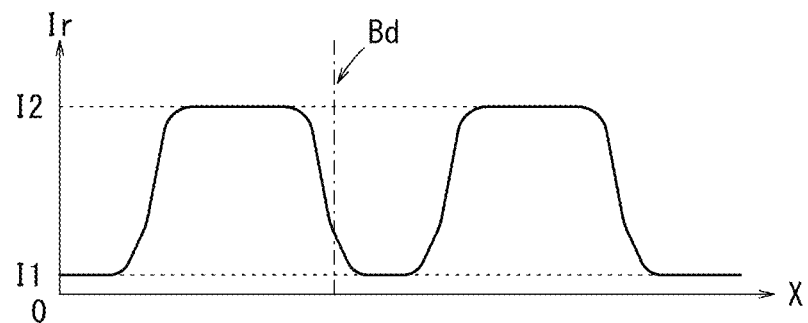
FIG. 18C is a graph showing an intensity distribution of reflected light in the first sensor part of FIG. 18A.

FIG. 18C is a graph showing an intensity distribution of reflected light in the first sensor part 120 of FIG. 18A. The horizontal axis of the graph represents position in the direction of the arrow X, and the vertical axis of the graph represents intensity of reflected light (reflected light intensity Ir). The reflected light intensity Ir implies a light intensity that is reflected toward the one surface side of the conductive sheet 10 (in the direction of the arrow Z1), for a case in which external light 122 is incident uniformly regardless of the position in the direction of the arrow X.

As a result, at a position in which the first conductive patterns 70a do not reside in the first sensor part 120, the reflected light intensity Ir exhibits a minimum value (Ir=I1). Further, at a position in which the first conductive patterns 70a reside in the first sensor part 120, the reflected light intensity Ir exhibits a maximum value (Ir=I2). More specifically, the reflected light intensity Ir has a characteristic responsive to the regular arrangement of the first sensing units 72a, or stated otherwise, a periodic characteristic in which the minimum value (I1) and the maximum value (I2) are repeated alternately.

In contrast thereto, in the case of a conductive sheet in which a highly-translucent conductive material (typically, ITO) is used, the reflected light intensity Ir is substantially equivalent to zero (I1=I2=0). Thus, almost no contrast (difference in brightness) occurs due to the presence or absence of the first conductive patterns 70a. More specifically, compared to a case in which the thin metal wires 16 are applied to the first conductive patterns 70a, the above described effect virtually is not imparted.

Figure 19A:
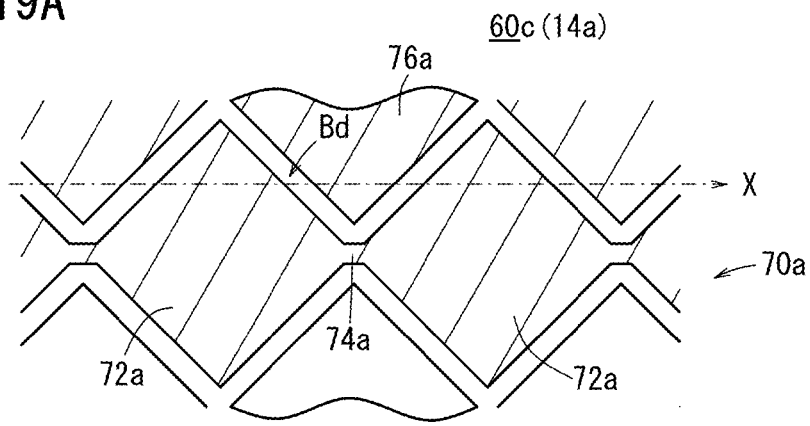
FIG. 19A is a schematic view of a first sensor part according to the present embodiment.

FIG. 19A is a schematic plan view of a first sensor part 60c (see FIG. 9B and FIG. 10) according to the second embodiment. The first sensor part 60c is made up from the first conductive patterns 70a and the first dummy patterns 76a.

Figure 19B:
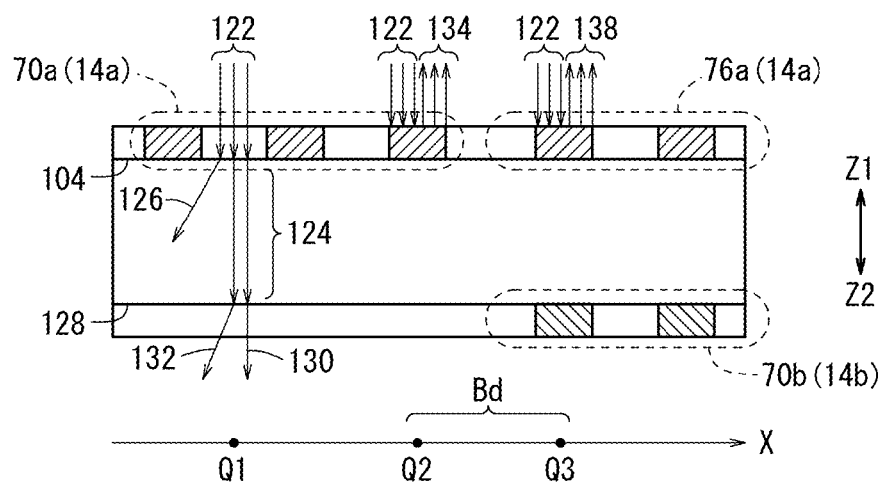
FIG. 19B is an outline schematic diagram showing paths of external light incident on the first sensor part of FIG. 19A.

FIG. 19B is a schematic diagram showing paths of external light 122 incident on the first sensor part 60c. The present drawing corresponds to an outline cross sectional view in the vicinity of a boundary Bd of the first conductive patterns 70a shown in FIG. 19A.

In relation to a position Q1 that corresponds to the position P1, explanations are omitted since they are the same as those made above with respect to FIG. 18B. The same holds true for the position Q2 that corresponds to the position P2.

At position Q3, which corresponds to position P3, external light 122, which is irradiated from the exterior of the display device 40 (see FIG. 4), is reflected substantially completely as a reflected component 138 in the direction of the arrow Z1 at the surface of the first dummy patterns 76a (non-translucent material thin metal wires 16). More specifically, the conductive sheet 10 reflects external light 122 to the same degree as at the position Q2, irrespective of the presence or absence of the thin metal wires 16 of the second conductive portion 14b.

Figure 19C:
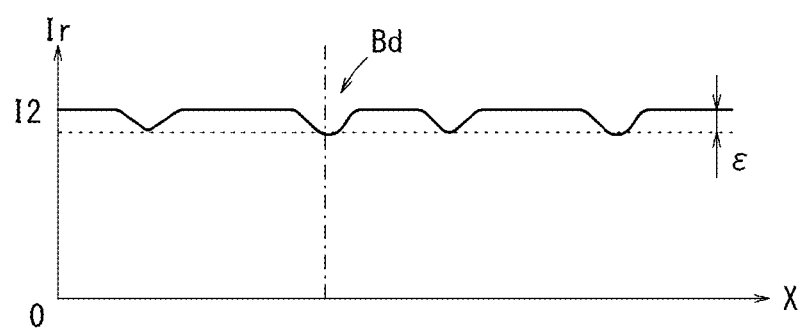
FIG. 19C is a graph showing an intensity distribution of reflected light in the first sensor part of FIG. 19A.

As a result, as shown in FIG. 19C, the reflected light intensity Ir exhibits a uniform characteristic where Ir=I2, irrespective of the regular arrangement of the first sensing units 72a. In spaces between the first conductive patterns 70a and the first dummy patterns 76a, the reflected light intensity Ir has a tendency to decrease slightly ($\epsilon$). By keeping the width of the spacing small, it becomes more difficult for the shape of the first sensing units 72a to be recognized visually.

In the foregoing manner, the wiring density of the first dummy patterns 76a, which are arranged in the first interspatial portions 75a between adjacent first conductive patterns 70a is equivalent to the wiring density of the first conductive patterns 70a themselves. Therefore, the optical reflectance within the planar regions of the first dummy patterns 76a with respect to external light 122 from the side of the one main surface matches or coincides substantially with the optical reflectance of the planar regions of the first conductive patterns 70a. More specifically, regardless of the regular arrangement of the first sensing units 72a, the intensity distribution of the reflected light (reflected component 134, 138) can be made more uniform. Consequently, even in a structure in which electrodes made up of thin metal wires 16 are formed on both surfaces of the transparent substrate 12, visual recognition of the first sensing units 72a (or the second sensing units 72b) due to external light 122 as a source of reflected light can be suppressed.

[Mathematical Characteristics of Wiring Shape of Conductive Sheet 10]

Next, with reference to FIGS. 20A through 31, an explanation shall be given concerning mathematical characteristics of the wiring shape (shape of the mesh pattern 20) of the conductive sheet 10 according to the first and second embodiments (hereinafter referred to collectively as present embodiments).

First, examples of methods for determining wiring shapes for the first conductive portion 14a and the second conductive portion 14b will be described with reference to FIGS. 20A through 21C.

Figure 20A:
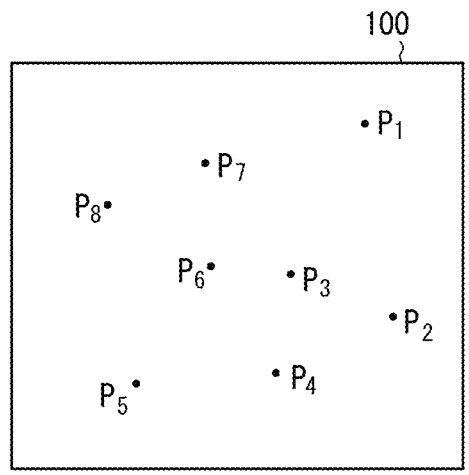
FIG. 20A is an outline schematic diagram showing a result in which eight points are selected from within one planar region.

In the present embodiment, the mesh pattern 20 is determined from a plurality of positions existing within one planar region 100. As shown in FIG. 20A, eight seed points $P_1$ to $P_8$ are selected at random from within a square shaped planar region 100.

Figure 20B:
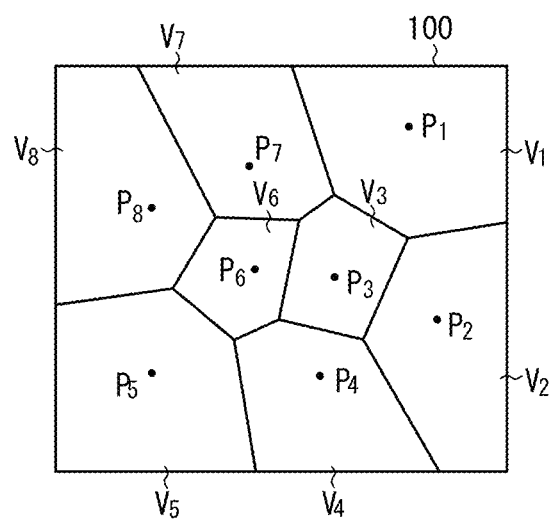
FIG. 20B is an outline schematic diagram showing a result in which a wiring pattern is determined in accordance with a Voronoi Diagram.

FIG. 20B is a schematic diagram showing a result by which the wiring shape is determined in accordance with a Voronoi diagram (Voronoi Tessellation Method). In accordance therewith, eight regions $V_1$ through $V_8$ are defined, which surround respectively eight seed points $P_1$ to $P_8$. The regions $V_i$ (where i=1 to 8) defined by the Voronoi diagram represent a collection of points, which are points closest to the seed points $P_i$. In this case, although Euclidean distance is used as a distance function, various other functions may be used.

Figure 20C:
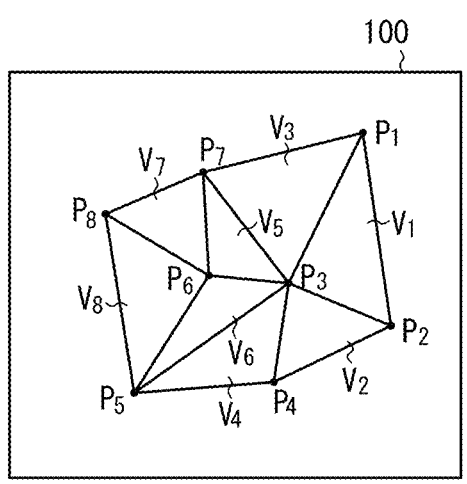
FIG. 20C is an outline schematic diagram showing a result in which a wiring pattern is determined in accordance with a Delaunay triangulation method.

FIG. 20C is a schematic diagram showing a result by which the wiring shape is determined in accordance with a Delaunay diagram (Delaunay Triangulation Method). Delaunay Triangulation is a method of defining triangular shaped regions by connecting adjacent points from among the seed points $P_1$ to $P_8$. According to this method as well, regions $V_1$ to $V_8$ are determined such that each region has any of the eight seed points $P_1$ to $P_8$ as a vertex.

In the foregoing manner, the thin metal wires 16 are placed at the respective boundary lines shown in FIG. 20B (or 20C), and respective mesh shapes 22 are determined for a case in which the wiring shapes of the regions Vi that define the openings 18, i.e., the first conductive portion 14a and the second conductive portion 14b, are overlapped. In addition, the mesh pattern 20 satisfies at least one of the following conditions from among a first condition, a second condition, and a third condition to be described below.

(First Mathematical Characteristic, First Condition)

The first mathematical characteristic relates to the centroid position power spectrum of the mesh shapes 22. Below, a description thereof shall be made in detail with reference to FIGS. 21A through 28B.

Figure 21A:
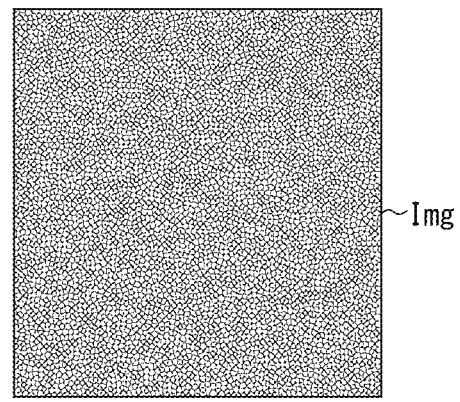
FIG. 21A is an outline schematic diagram in which image data representing the form of a mesh pattern are made visual.

FIG. 21A is an outline schematic diagram in which image data Img representing the form of a mesh pattern 20 are made visual. Below, and example will be given of the image data Img. The image data Img may be color value data of the conductive sheet 10 that is read using an input device such as a scanner or the like, or may be exposure data that is actually used in output formation of the mesh pattern 20. In either case, the image data Img has a high resolution (small pixel size) of a degree that is capable of expressing an average wire width of the thin metal wires by one or more pixels.

First, a Fourier transformation, i.e., FFT (Fast Fourier Transformation) is implemented with respect to the image data Img shown in FIG. 21A. As a result, concerning the shape of the mesh pattern 20, and overall tendency (spatial frequency distribution) can be grasped, rather than a partial shape thereof.

Figure 21B:
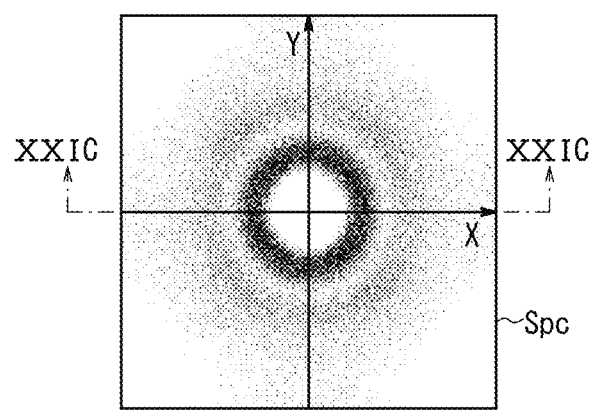
FIG. 21B is a diagram of a two-dimensional power spectrum obtained by implementing FFT (Fast Fourier Transform) on the image data of FIG. 21A.

FIG. 21B is a distribution diagram of a power spectrum Spc (hereinafter referred to simply as a spectrum Spc) obtained by implementing FFT on the image data Img of FIG. 21A. The horizontal axis of the distribution diagram indicates the spatial frequency in the x-axis direction, whereas the vertical axis indicates the spatial frequency in the y-axis direction. Further, as the displayed density within each spatial frequency band becomes thinner, the intensity level (spectral value) becomes smaller, and as the displayed density becomes denser, the intensity level becomes greater. In the example shown in the diagram, the spectral distribution of the spectrum Spc is isotropic and has two annular peaks.

Figure 21C:
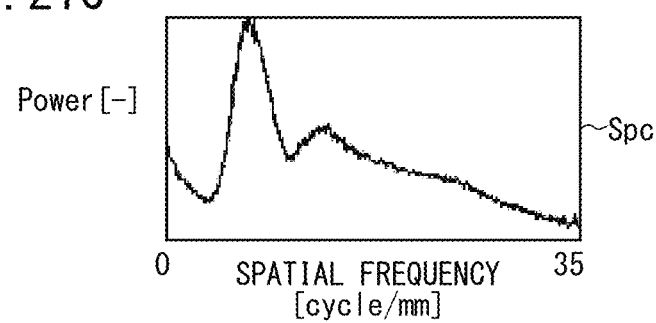
FIG. 21C is a cross sectional view taken along line XXIC-XXIC of the two-dimensional power spectrum shown in FIG. 21B.

FIG. 21C is a cross sectional view taken along line XXIC-XXIC of the spectrum Spc shown in FIG. 21B. Because the spectrum Spc is isotropic, in FIG. 21C, the cross section thereof corresponds to a radial distribution with respect to all angular directions. As understood from the present drawing, the intensity level becomes small in a low spatial frequency band and in a high spatial frequency band, whereas the intensity level is high only in an intermediate spatial frequency band, thereby exhibiting a so-called bandpass characteristic. More specifically, according to common technical terminology in the field of image engineering, the image data Img shown in FIG. 21A is representative of a pattern having a "green noise" characteristic.

Figure 22:
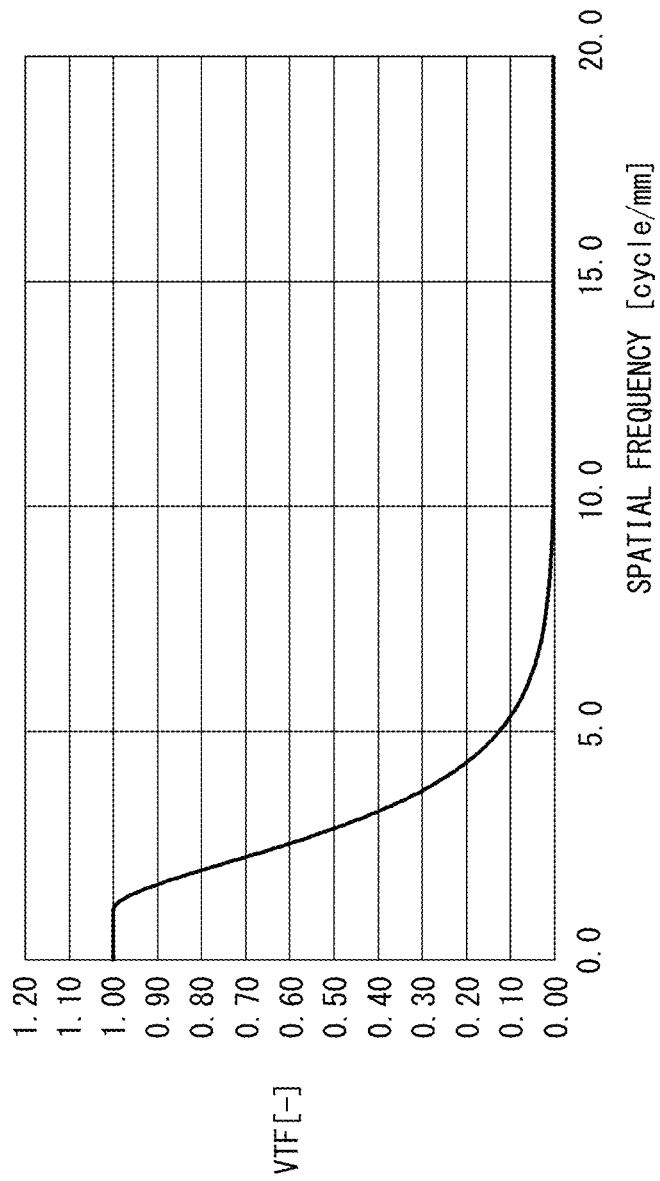
FIG. 22 is a graph showing an example of standard human visual response characteristics.

FIG. 22 is a graph showing an example of standard human visual response characteristics.

In the present embodiment, as a standard human visual response characteristic, a Dooley-Shaw function is used at an observation distance of 300 mm under a condition of clear viewing. A Dooley-Shaw function is one type of VTF (Visual Transfer Function), which is a representative function that simulates standard human visual response characteristics. More specifically, the function corresponds to the square of a luminance contrast ratio characteristic. The horizontal axis on the graph is the spatial frequency (units: cycle/mm), whereas the vertical axis is the value of the VTF (units: dimensionless).

If the observational distance is set at 300 mm, values of the VTF are constant (equivalent to 1) within a range of 0 to 1.0 cycle/mm, and as the spatial frequency becomes higher, there is a tendency for the VTF values to decrease. More specifically, the function operates as a low pass filter that blocks or cuts off mid to high spatial frequency bands.

Actual standard human visual response characteristics exhibit the characteristics of a so-called band pass filter, in which the value thereof becomes smaller than 1 in the vicinity of 0 cycle/mm. However, as exemplified in FIG. 22, in the present embodiment, by setting the VTF value to 1 even in extremely low spatial frequency bands, the contribution to a later-described evaluation value EVP is high. Consequently, an effect is obtained of suppressing periodicity due to repeated arrangement of the mesh pattern 20.

Figure 23:
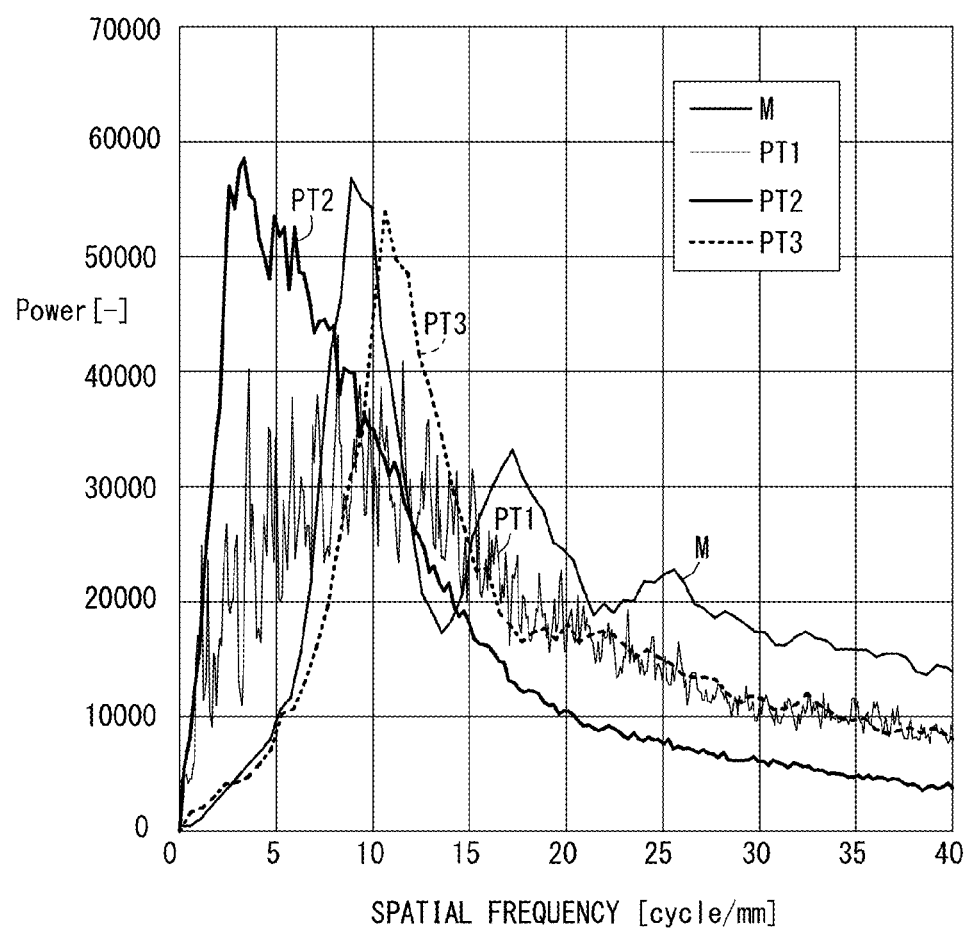
FIG. 23 is a cross sectional view taken along the x-axis of two dimensional power spectra obtained by implementing FFT, respectively, on image data of a mesh pattern according to the present embodiment and a mesh pattern according to a conventional technique.

FIG. 23 is a cross sectional view taken along the X-axis of spectra Spc obtained by effecting FFT respectively on image data Img representing various types of patterns PT1 to PT3 according to conventional examples, and the mesh pattern 20 according to the present embodiment.

Figure 57A:
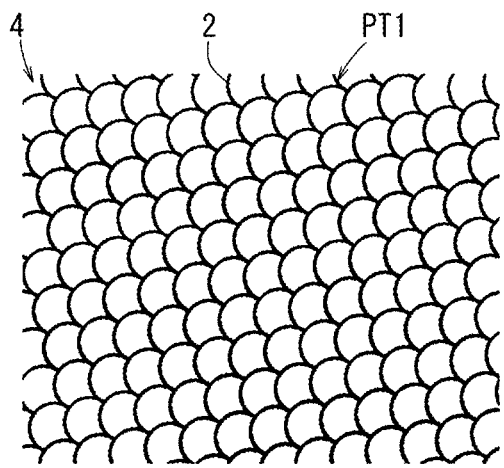
FIGS. 57A to 57C are enlarged plan views of patterns according to comparative examples.
Figure 57B:
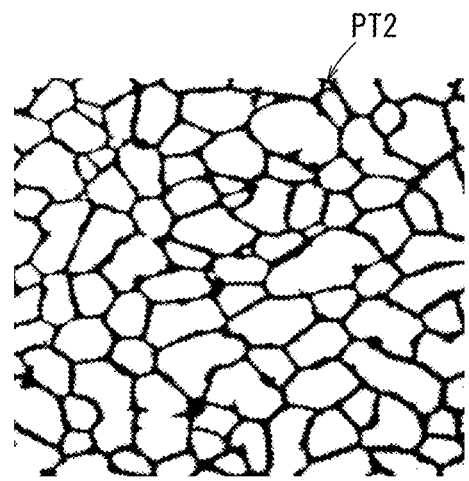
Figure 57C:
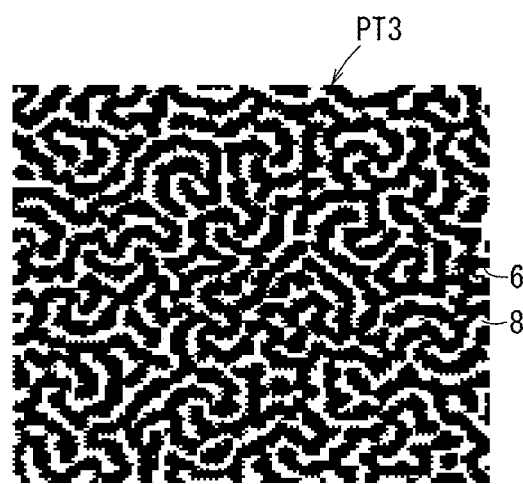

The spectrum Spc of the pattern PT1 shown in FIG. 57A has a broad width peak (a range of 2 to 30 cycle/mm) with an apex at approximately 10 cycle/mm. Further, the spectrum Spc of the pattern PT2 shown in FIG. 57B has a broad width peak (a range of 3 to 20 cycle/mm) centered at approximately 3 cycle/mm. Furthermore, the spectrum Spc of the pattern PT3 shown in FIG. 57C has a comparatively narrow width peak (a range of 8 to 18 cycle/mm) centered at approximately 10 cycle/mm. In contrast thereto, the spectrum Spc of the mesh pattern 20 (indicated by M in the present drawing, as well as in FIG. 27 to be discussed later) has a narrow width peak centered at 8.8 cycle/mm.

Figure 24:
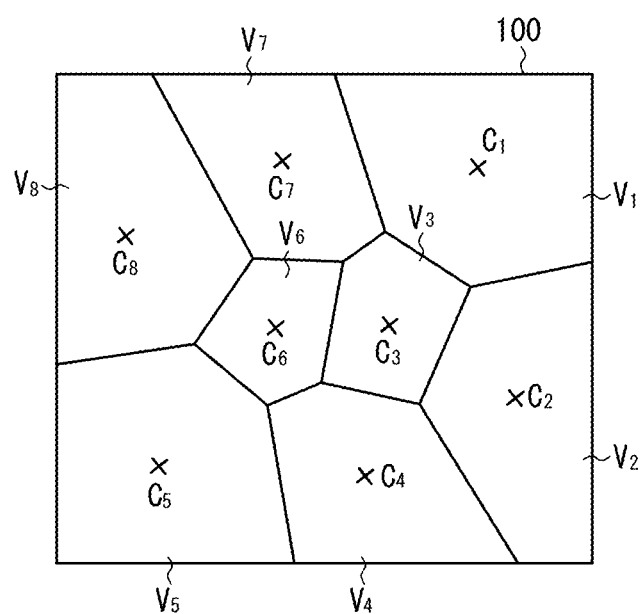
FIG. 24 is a schematic diagram showing centroid positions of respective regions shown in FIG. 20B.

An explanation shall be given next concerning a relationship between characteristics of the spectrum Spc shown in FIG. 21C and centroid positions of the respective mesh shapes 22. As shown in FIG. 24, with respect to a planar region 100 similar to that shown in FIG. 20B, using the aforementioned Voronoi diagram, respective polygonal shaped regions $V_1$ to $V_8$ are defined. Points $C_1$ to $C_8$ belonging respectively to the regions $V_1$ to $V_8$ represent centroid positions of such regions respectively.

Figure 25:
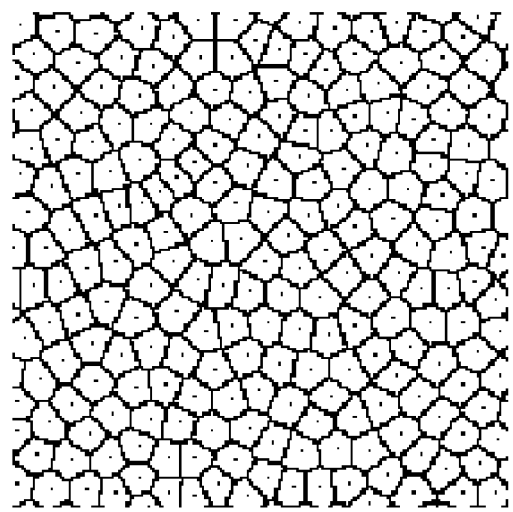
FIG. 25 is an outline schematic diagram showing a relationship between a mesh pattern and centroid positions of respective mesh shapes.
Figure 26A:
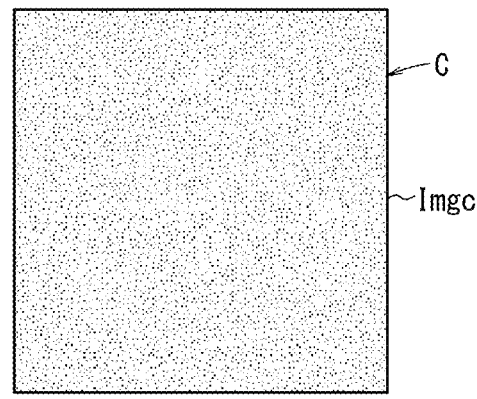
FIG. 26A is an outline schematic diagram in which image data representing a centroid position distribution of respective mesh shapes of the mesh pattern of FIG. 25 are made visual.

FIG. 25 is an outline schematic diagram showing a relationship between the mesh pattern 20 according to the present embodiment, and the centroid positions of mesh shapes 22. FIG. 26A is an outline schematic diagram in which image data (hereinafter referred to as "centroid image data Imgc") are made visual, the image data showing a distribution of centroid positions (hereinafter referred to as a "centroid distribution C") of the mesh shapes 22 of the mesh pattern 20 of FIG. 25. As understood from the drawing, the centroid distribution C is such that the centroid positions are scattered suitably so as not to overlap mutually with each other.

Figure 26B:
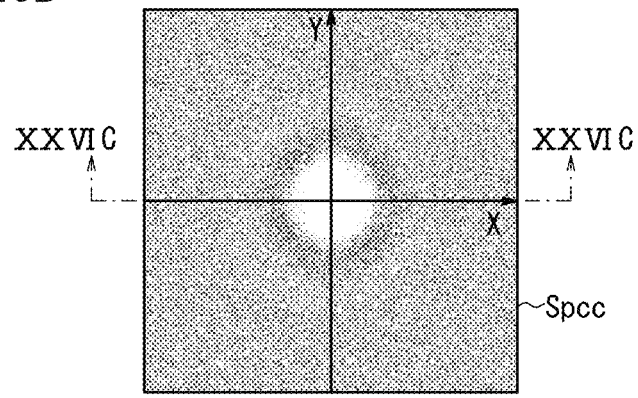
FIG. 26B is a diagram of a two-dimensional power spectrum obtained by implementing FFT (Fast Fourier Transform) on the image data of FIG. 26A.

FIG. 26B is a distribution diagram of a two-dimensional spectrum (hereinafter referred to as a "centroid spectrum Spcc") obtained by effecting FFT with respect to the centroid image data Imgc of FIG. 26A. The horizontal axis of the distribution diagram shows the spatial frequency with respect to the x-axis direction, whereas the vertical axis thereof shows the spatial frequency with respect to the y-axis direction. Further, within each spatial frequency band, as the display density becomes thinner, the intensity level (spectral value) becomes smaller, whereas as the display density becomes denser, the intensity level becomes greater. The distribution of the centroid spectrum Spcc is isotropic and exhibits one annular peak.

Figure 26C:
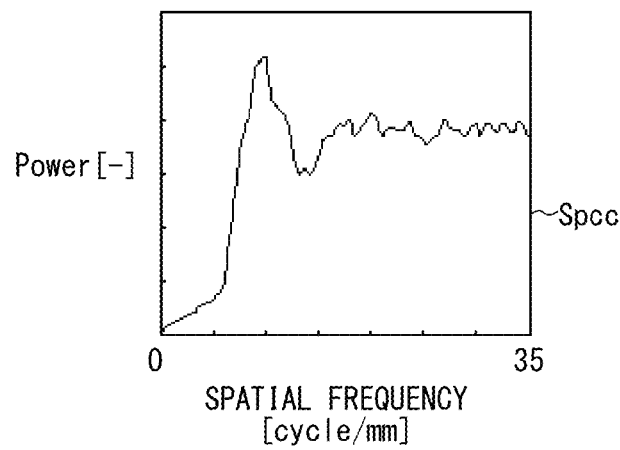
FIG. 26C is a cross sectional view taken along line XXVIC-XXVIC of the two-dimensional power spectrum shown in FIG. 26B.

FIG. 26C is a cross sectional view taken along line XXVIC-XXVIC of the distribution of the centroid spectrum Spcc shown in FIG. 26B. Because the centroid spectrum Spcc is isotropic, FIG. 26C corresponds to a radial distribution with respect to all angular directions. As understood from the present drawing, the intensity level becomes small in a low spatial frequency band, and has a broad peak in an intermediate spatial frequency band. Furthermore, a so-called high-pass characteristic is exhibited in which, in contrast to low spatial frequency bands, the intensity level is high in high spatial frequency bands. More specifically, according to common technical terminology in the field of image engineering, the centroid image data Imgc shown in FIG. 26A is representative of a pattern having a "blue noise" characteristic.

The power spectrum of a centroid position distribution C in conductive sheet 10 can be obtained by the following process. First, image data Img representing the pattern of the mesh pattern 20 are acquired, respective mesh shapes 22 (closed spaces) are identified, centroid positions (e.g., one pixel dot) thereof are calculated respectively and centroid image data Imgc are determined, and a two-dimensional power spectrum thereof is calculated. Accordingly, a power spectrum (centroid spectrum Spcc) of the centroid position distribution C is obtained.

Figure 27:
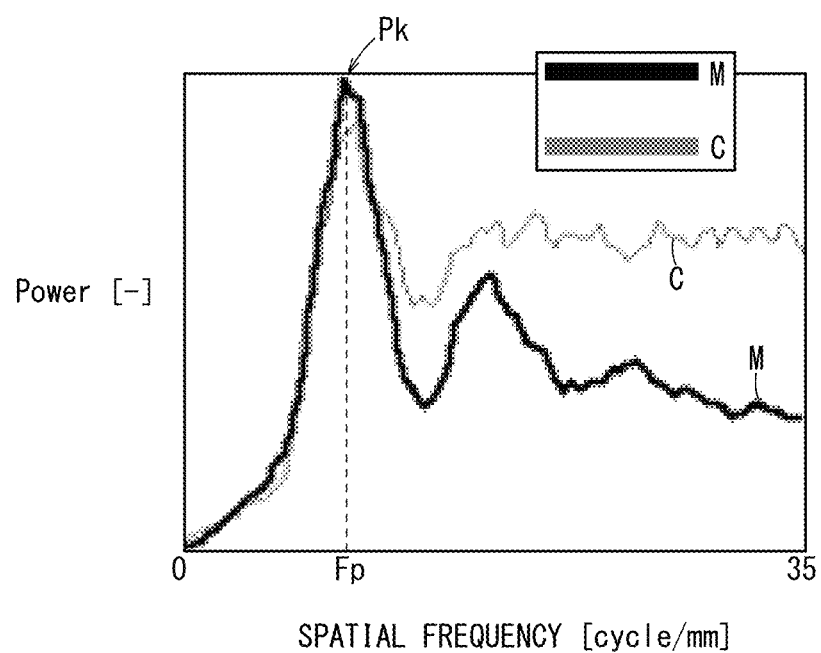
FIG. 27 is a comparative diagram of the graphs of FIG. 21C and FIG. 26C.

FIG. 27 is a comparative drawing of the graphs of FIG. 21C and FIG. 26C. More specifically, the spectrum Spc of the mesh pattern 20 is compared with the centroid spectrum Spcc of the centroid distribution C. For the sake of convenience, intensities of the spectrum Spc and the centroid spectrum Spcc are normalized such that maximum peak values Pk thereof are in agreement.

According to the present drawing, peaks Pk of the spatial frequencies Fp are in agreement, corresponding to a value of 8.8 cycle/mm. In high spatial frequency bands in excess of the spatial frequency Fp, the intensity of the spectrum Spc gradually decreases, whereas in contrast thereto, the intensity of the centroid spectrum Spcc is maintained at an even higher value. The reason therefor is presumed to be that, in contrast to the constituent elements of the mesh pattern 20 being line segments having a predetermined width and which intersect each other, the constituent elements of the centroid distribution C are points.

Figure 28A:
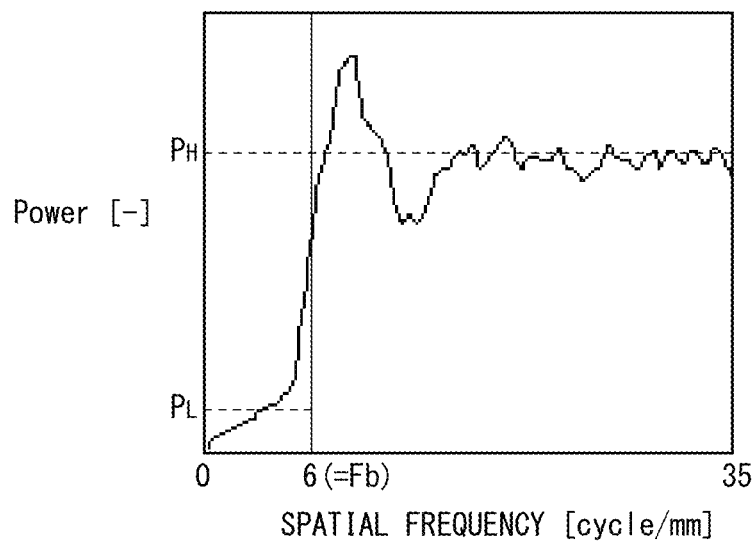
FIG. 28A and FIG. 28B are outline schematic diagrams of centroid spectra.

FIG. 28A is an outline explanatory drawing representative of characteristics of the centroid spectrum Spcc of FIG. 26C. The value of the centroid spectrum Spcc increases gradually in a range of 0 to 5 cycle/mm, increases rapidly in the vicinity of 6 cycle/mm, and has a broad peak at roughly 10 cycle/mm. In addition, the value of the centroid spectrum Spcc decreases gradually in a range of 10 to 15 cycle/mm, and is maintained at a high value in high spatial frequency bands in excess of 15 cycle/mm.

A standard spatial frequency (predetermined spatial frequency) Fb is set to 6 cycle/mm. Within a range on the side of a spatial frequency band lower than Fb, i.e., within a range from 0 to Fb [cycle/mm], the average intensity (average value) of the centroid spectrum Spcc is set to $P_L$. On the other hand, within a range on the side of a spatial frequency band higher than Fb, i.e., within a range from Fb [cycle/mm] to the Nyquist frequency, the average intensity (average value) of the centroid spectrum Spcc is set to $P_H$. In this manner, the value of $P_H$ is greater than the value of $P_L$. Since the centroid spectrum Spcc has such a characteristic, the sensation of noise that is felt visually by an observer is reduced. The basis therefor is as follows.

For example, the value of Fb is set such that a spatial frequency results in which the human visual response characteristic corresponds to 5% of the maximum response. This is because such a level is difficult to visually confirm. Further, as shown in FIG. 22, an acquired visual response characteristic is used based on a Dooley-Shaw function at a visibility distance of 300 mm. The present function is closely compatible with human visual response characteristics.

More specifically, as the value Fb, there can be used a spatial frequency of 6 cycle/mm, which corresponds to 5% of the maximum response in the Dooley-Shaw function at a visibility distance of 300 mm. It is further noted that 6 cycle/mm corresponds to an interval of 167 μm.

Figure 28B:
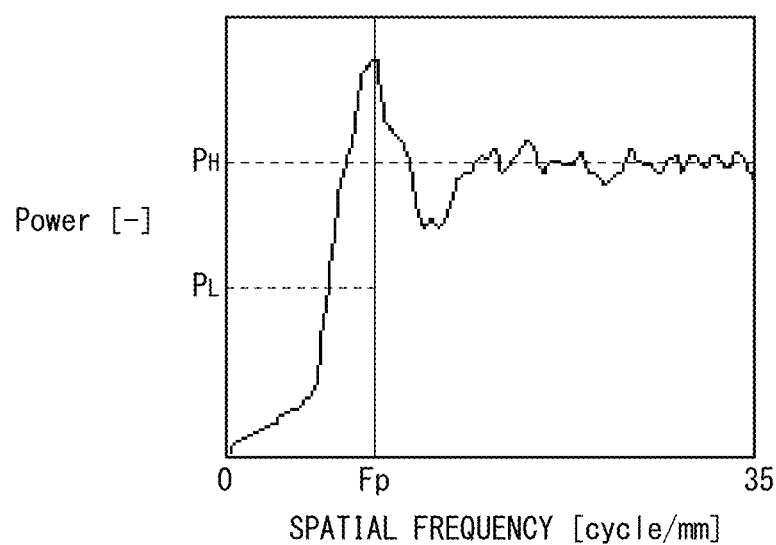

Further, as shown in FIG. 28B, a spatial frequency Fp that maximizes the value of the centroid spectrum Spcc may be set as the reference spatial frequency Fb. In this case as well, the aforementioned relationship ($P_H$>$P_L$) is met.

(Second Mathematical Characteristic, Second Condition)

The second mathematical characteristic relates to the power spectrum of the mesh shapes 22. Below, a description thereof shall be made in detail with reference to FIG. 29 and FIG. 30.

A noise intensity NP(Ux, Uy), which is a value that correlates highly with human visual response characteristics, is defined by the following formula (1), using the value F(Ux, Uy) of the spectrum Spc.

$$NP(Ux,Uy)=\int_{Ux}^{Unyq}\int_{Uy}^{Unyq} VTF(\sqrt{(Wx-Ux)^2+(Wy-Uy)^2})F(Wx,Wy)dWxdWy \quad (1)$$

Stated otherwise, the noise intensity NP(Ux, Uy) corresponds to a convolution integral (function of Ux, Uy) between the spectrum Spc and the standard human visual response characteristic (VTF). For example, in relation to spatial frequency bands in excess of the Nyquist frequency Unyq, normally, the convolution integral is calculated as F(Ux, Uy)=0. In the present case, the Nyquist frequency Unyq coincides with a spatial frequency corresponding to the average wire width of the thin metal wires 16.

As viewed from the standpoint, of spatial symmetry of the image data Img, the VTF exhibits spatial frequency symmetry {VTF(U)=VTF(−U)}. However, it is noted that, in the present embodiment, spatial frequency characteristics in the negative direction are not taken into account. More specifically, it is assumed that VTF(−U)=0 (where U is a positive value). The same is also true concerning the spectrum Spc.

Figure 29:
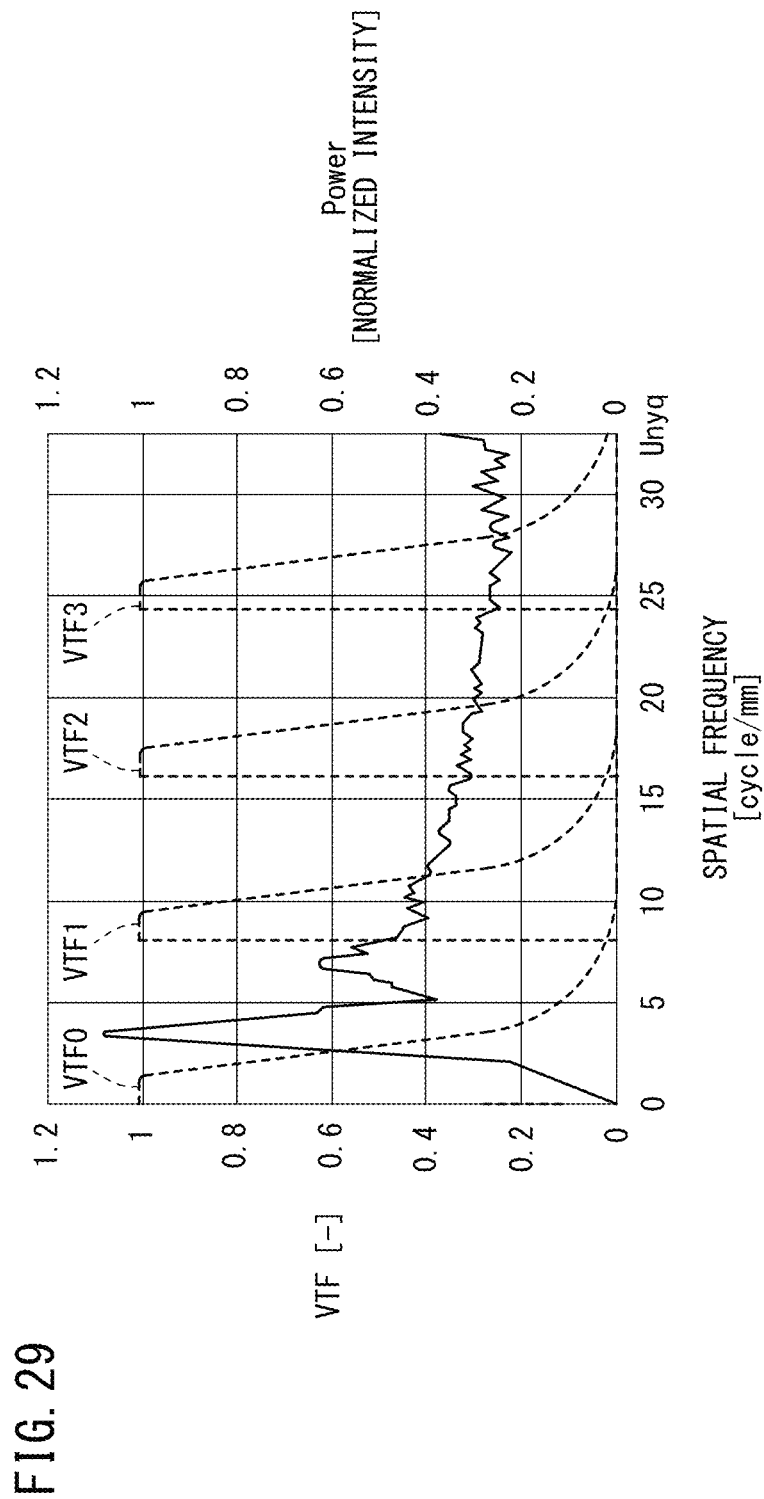
FIG. 29 is an outline schematic diagram showing a positional relationship between a two-dimensional power spectrum and a VTF (Visual Transfer Function) shifted toward a high spatial frequency side.

FIG. 29 is an outline schematic diagram showing a positional relationship between the spectrum Spc and the VTF, which is shifted toward a high spatial frequency side. The amount by which the VTF is shifted corresponds to U=(Ux²+Uy²)^(1/2) (units: cycle/mm). The curves VTF0, VTF1, VTF2, and VTF3 shown by the broken lines in FIG. 29 correspond to VTF values of 0, Unyq/4, Unyq/2, and 3·Unyq/4, respectively.

Figure 30:
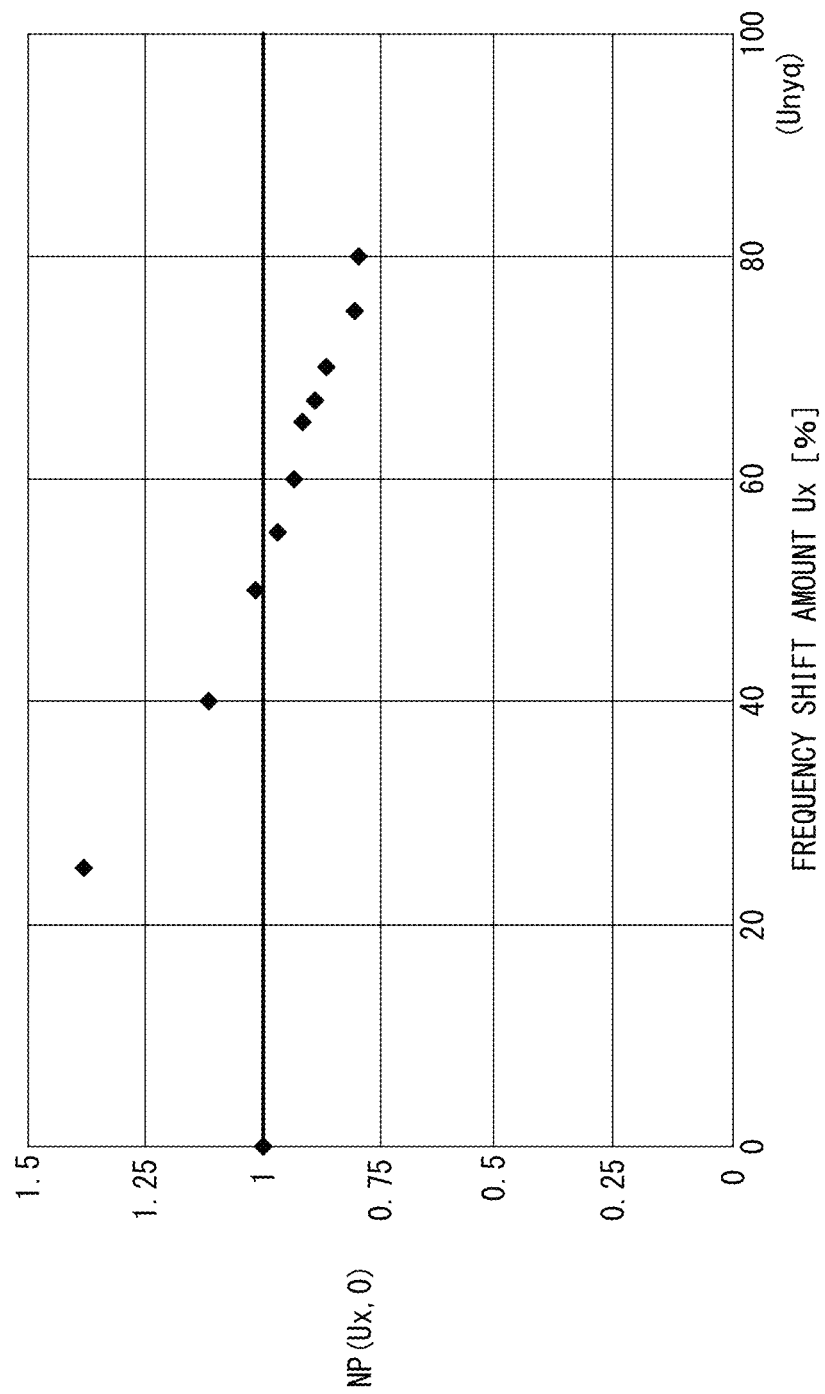
FIG. 30 is a graph showing a result in which the convolution of standard human visual response characteristics and the power spectrums shown in FIG. 21B

FIG. 30 is a graph showing the result of convoluting the standard human visual response characteristic (see FIG. 22) with respect to the spectrum Spc shown in FIGS. 21B and FIG. 21C. The horizontal axis of the graph is a shift amount (units: %) of spatial frequency with the Nyquist frequency Unyq being used as a reference (100%). The vertical axis of the graph is the noise intensity NP(Ux, 0) along the Ux-axis direction with the noise intensity NP(0, 0) at zero spatial frequency being used as a reference.

As shown in the present drawing, the noise intensity NP (Ux, 0) has a peak in the vicinity of Ux=0.25·Unyq, and exhibits a characteristic in which the noise intensity NP (Ux, 0) decreases monotonically as the spatial frequency becomes higher. In the case that the spatial frequency range is 0.25·Unyq≤Ux≤0.5·Unyq, the relationship NP(Ux, Uy)>NP (0, 0) normally is satisfied. Further, in relation to the noise intensity NP(Ux, Uy), without being limited to the Ux-axis, the same relationship is obtained in the radial direction of Spatial Frequency U=(Ux²+Uy²)^(1/2).

In the foregoing manner, in a convolution integral between the spectrum Spc as viewed in plan and a standard human visual response characteristic (VTF), respective integral values {Noise Intensity NP(Ux, Uy)} within a spatial frequency band greater than or equal to ¼ of and less than or equal to ½ of the Nyquist frequency (i.e., the spatial frequency corresponding to the average wire width of the thin metal wires 16), are greater than the integral value {Noise Intensity NP(0, 0)}. Therefore, compared to the low spatial frequency band side, the noise amount on the side of the high spatial frequency band is relatively large. Although human visual perception has a high response characteristic in a low spatial frequency band, in mid to high spatial frequency bands, properties of the response characteristic decrease rapidly, and thus, the sensation of noise as perceived visually by humans tends to decrease. In accordance with this phenomenon, the sensation of granular noise caused by the pattern of the conductive sheet 10 is lowered, and the visibility of objects to be observed can be significantly enhanced. Further, since plural polygonal meshes are provided, the cross sectional shape of the respective wires after cutting is substantially constant, and thus the conductive sheet exhibits a stable conducting capability.

(Third Mathematical Characteristic, Third Condition)

The third mathematical characteristic relates to the distribution of the number of vertices in the polygonal mesh shapes 22. Below, a description thereof shall be made in detail with reference to FIG. 31.

Figure 31:
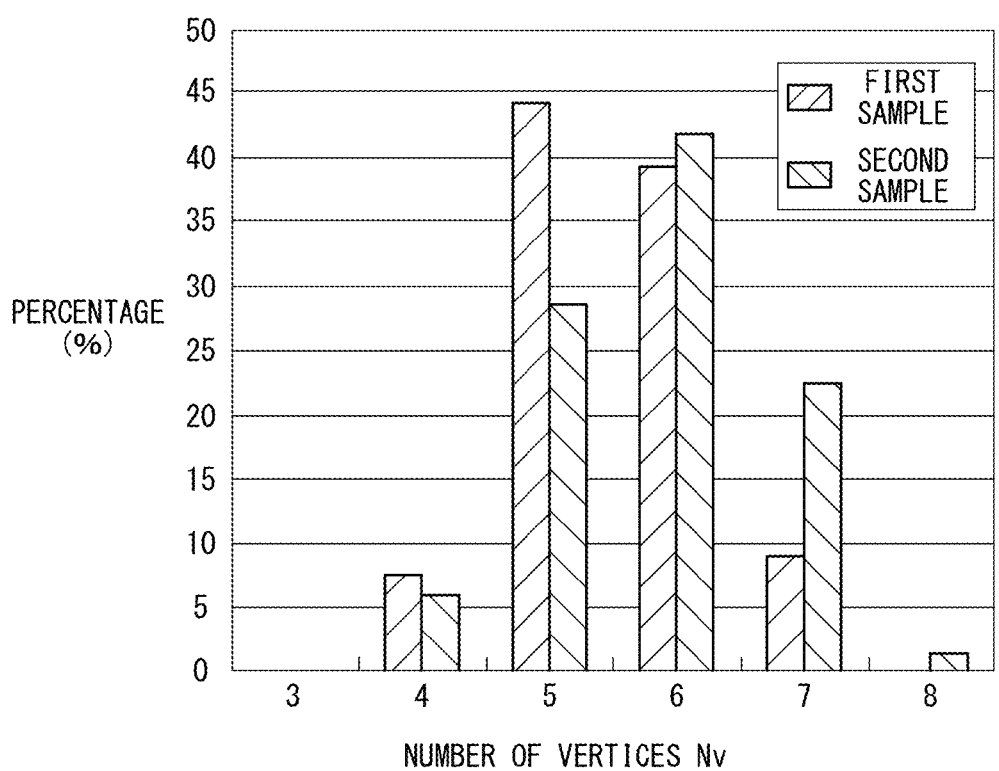
FIG. 31 is a histogram of a number of vertices in a preferred mesh shape.

FIG. 31 is a histogram of the number of vertices Nv in a preferred mesh shape 22. For example, two first sensing units 72a are selected randomly from among the plurality of first sensing units 72a, and histograms are created respectively of the number of vertices Nv of a first mesh element 78a (polygon 82) inside a square region having sides of 3 mm.

In a first sample, the number of vertices Nv was within a range of 4 to 7, and the occurrence thereof was highest in order of pentagons, hexagons, septagons, and tetragons. Further, in a second sample, the number of vertices Nv was within a range of 4 to 8, and the proportion thereof was highest in order of hexagons, pentagons, septagons, tetragons, and octagons.

As characteristics common to the first and second samples, there may be cited [1] the percentage of polygons having the highest frequently number of vertices is 40%-50%, [2] the sum of the percentage of polygons having the highest frequently number of vertices and the percentage of polygons having a second highest frequently number of vertices is 70%-85%, and [3] the histogram is of a mountain shape having a single peak.

Furthermore, by the result of the creation of the above-described histogram in relation to mesh patterns of multiple types in which noise graininess and the occurrence of moiré phenomena can be sufficiently tolerated, the following knowledge was obtained: that is, it is only necessary to meet at least one of a condition that the percentage of polygons having a highest frequently number of vertices is 40%-70% and a condition that the sum of the percentage of polygons having the highest frequently number of vertices and the percentage of polygons having a second highest frequently number of vertices is 70%-90%.

[Structure of Manufacturing Apparatus 310]

Figure 32:
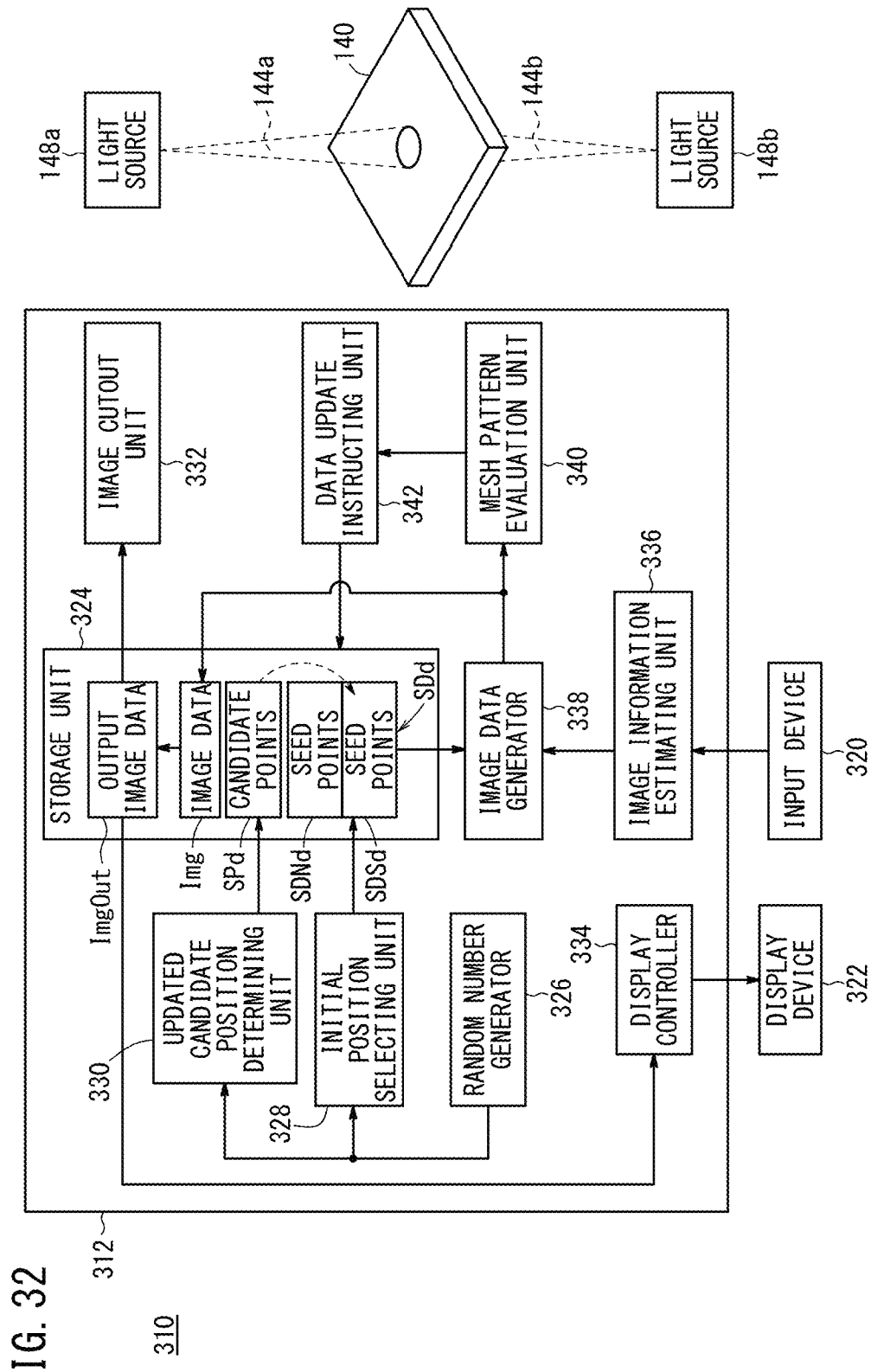
FIG. 32 is a schematic structural, block diagram of a manufacturing apparatus for producing the conductive sheet according to the present embodiment.

FIG. 32 is a schematic block diagram of a manufacturing apparatus 310 for manufacturing the conductive sheet 10 according to the present embodiment.

The manufacturing apparatus 310 basically comprises an image generating device 312 for creating image data Img (including output image data ImgOut) representative of the pattern (wiring shapes) of the mesh pattern 20, a first light source 148a for performing exposure by illuminating, with first light 144a, the one main surface of the conductive sheet (photosensitive material 140, see FIG. 42A) under a manufacturing process, in order to generate the pattern represented by the output image data ImgOut created by the image generating device 312, a second light source 148b for performing exposure by illuminating the other main surface of the photosensitive material 140 with second light 144b based on the output image data ImgOut, an input device 320 for inputting to the image generating device 312 each of various conditions (including visual information of the mesh pattern 20 and a later-described structural pattern) for creating the image data Img, and a display device 322 for displaying a GUI image to assist in an input operation, by the input device 320, and for displaying stored output image data ImgOut or the like.

The image generating device 312 comprises a storage unit 324 storing therein image data Img, output image data ImgOut, position data SPd of candidate points SP, and position data SDd of seed points SD, a random number generator 326 for producing a pseudo-random number and generating a random number value, an initial position selecting unit 328 for selecting initial positions of seed points SD from among a predetermined two-dimensional image using the random number value generated by the random number generator 326, an updated candidate position determining unit 330 for determining positions (excluding positions of the seed points SD) of candidate points SP from among the two-dimensional image region using the random number value, an image cutout unit 332 for cutting out first image data and second image data (described later) from the output image data ImgOut, and a display controller 334 for controlling display of respective images on the display device 322.

The seed points SD are made up from first seed points SDN that are not to be updated, and second seed points SDS that are to be updated. Stated otherwise, the position data SDd of the seed points SD are constituted from position data SDNd of the first seed points SDN, and position data SDSd of the second seed points SDS.

A non-illustrated controller, which is constituted by a CPU or the like, is capable of implementing various controls in relation to image processing, by reading and executing a program stored in a computer readable recording medium (a non-illustrated ROM or the storage unit 324).

The image generating device 312 further comprises an image information estimating unit 336 for estimating image information of a mesh pattern 20 or a structural pattern based on visual information (details of which are described later) input from the input device 320, an image data generating unit 338 for generating image data Img representative of a pattern corresponding to the mesh pattern 20 or the structural pattern based on image information supplied from the image information estimating unit 336 and positions of seed points SD supplied from the storage unit 324, a mesh pattern evaluating unit 340 that calculates an evaluation value EVP for evaluating a pattern of the mesh shapes 22 based on the image data Img created by the image data generating unit 338, and a data update instructing unit 342 for instructing updating/non-updating of data of seed points SD, evaluation values EVP, etc., based on the evaluation value EVP calculated by the mesh pattern evaluating unit 340.

Figure 33:
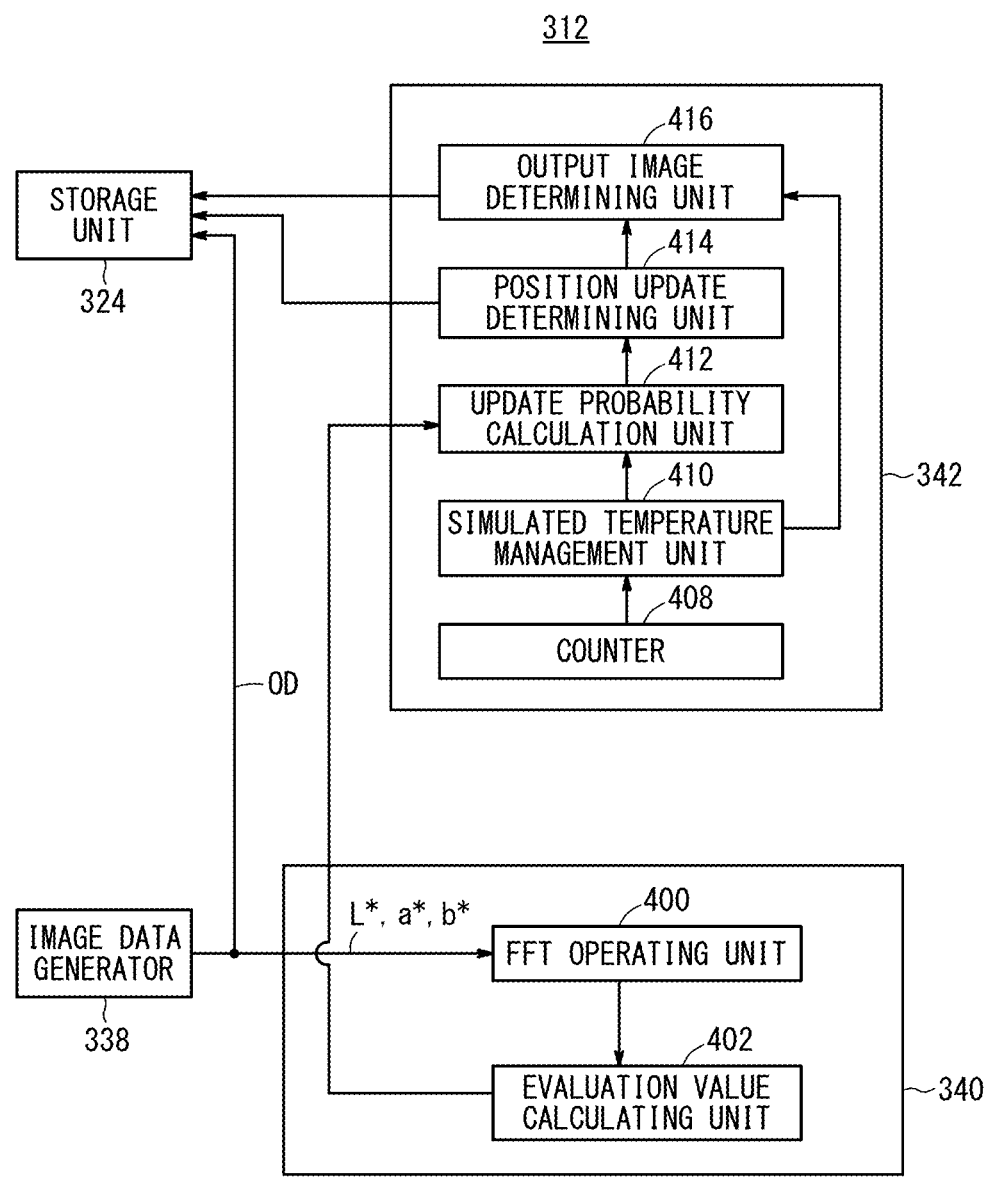
FIG. 33 is a functional block diagram of a data update instructing unit and a mesh pattern evaluating unit shown in FIG. 32.

FIG. 33 is a detailed functional block diagram of the mesh pattern evaluating unit 340 and the data update instructing unit 342 shown in FIG. 32.

The mesh pattern evaluating unit 340 comprises an, FFT operating unit 400, which carries out Fourier transformation, e.g., fast Fourier transformation (hereinafter also referred to as FFT), on the image data supplied from the image data generating unit 338 to obtain two-dimensional spectral data (hereinafter referred to as a "spectrum Spc"), and an evaluation value calculating unit 402 for calculating an evaluation value EVP based on the spectra Spc supplied from the FFT operating unit 400.

The data update instructing unit 342 comprises a counter 408 for counting the number of evaluations performed by the mesh pattern evaluating unit 340, a simulated temperature management unit 410 for managing values of simulated temperatures T utilized by a later-described simulated annealing method, an update probability calculation unit 412 for calculating an update probability of the seed points SD based on the evaluation value EVP supplied from the mesh pattern evaluating unit 340 and a simulated temperature T supplied from the simulated temperature management unit 410, a position update determining unit 414 for determining whether to update or not update position data SDd of seed points SD based on the update probability supplied from the update probability calculation unit 412, and an output image data determining unit 416 (data determining unit) for determining, as output image data ImgOut, one of the image data Img corresponding to a notification from the simulated temperature management unit 410.

[Description of Operations of Manufacturing Apparatus 310]

Figure 34:
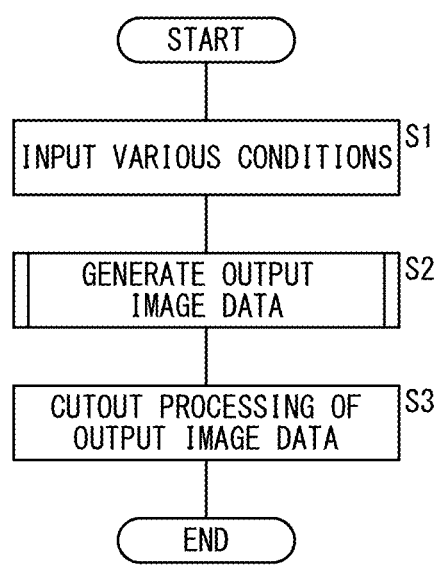
FIG. 34 is a flowchart providing a description of operations of the manufacturing apparatus of FIG. 32.

Operations of the manufacturing apparatus 310 constructed basically as described above, in particular, the image generating device 312, will be explained below with reference to the flowchart of FIG. 34.

First, various conditions necessary for creating the image data Img representing the pattern corresponding to the mesh pattern 20 (including the output image data ImgOut) are input (step S1).

FIG. 35 is a view showing a first setting screen 420 for setting image data generating conditions. The display controller 334 displays the setting screen 420 on the display device 322, responsive to an operation of the operator made through the input device 320.

The setting screen 420 comprises, from the top thereof and in the following order, a left side pull down menu 422, a left side display column 424, a right side pull down menu 426, a right side display column 428, seven text boxes 430, 432, 434, 436, 438, 440, 442, and buttons 444, 446 labeled "CANCEL" and "NEXT" respectively.

To the left of the pull down menus 422 and 426, text is displayed indicating "TYPE". By operating the input device 320 (e.g., a mouse), non-illustrated selection columns are displayed below the pull down menus 422, 426, to enable the items displayed therein to be selected.

The display column 424 is made up from five respective columns 448a, 448b, 448c, 448d, 448e with text labels "TRANSMITTANCE", "REFLECTANCE", "COLOR VALUE L*", "COLOR VALUE a*" and "COLOR VALUE b*" displayed respectively to the left thereof.

Similar to the display column 424, the display column 428 is made up from five respective columns 450a, 450b, 450c, 450d, 450e with text labels "REFLECTANCE", "TRANSMITTANCE", "COLOR VALUE L*", "COLOR VALUE a*" and "COLOR VALUE b*" displayed respectively to the left thereof.

The label "TOTAL TRANSMITTANCE" is displayed to the left of the text box 430, and "%" is displayed on the right hand side thereof. The label "FILM THICKNESS" is displayed to the left of the text box 432, and "µm" is displayed on the right hand side thereof. The label "WIRING WIDTH" is displayed to the left of the text box 434, and "µm" is displayed on the right hand side thereof. The label "WIRING THICKNESS" is displayed to the left of the text box 436, and "µm" is displayed on the right hand side thereof. The label "PATTERN SIZE H" is displayed to the left of the text box 438, and "mm" is displayed on the right hand side thereof. The label "PATTERN SIZE V" is displayed to the left of the text box 440, and "mm" is displayed on the right hand side thereof. The label "IMAGE RESOLUTION" is displayed to the left of the text box 442, and "dpi" is displayed on the right hand side thereof.

Further, by performing a predetermined operation using the input device 320 (e.g., a keyboard), Arabic numerals can be input into any of the seven text boxes 430, 432, 434, 436, 438, 440, 442.

The operator inputs appropriate numerical values, etc., via the setting screen 420 shown on the display device 322. As a result, visual information can be input concerning visibility of the mesh pattern 20. Visual information of the mesh pattern 20 is defined by various information that contribute to the shape and optical density of the mesh pattern 20, including visual information of the wire material (thin metal wires 16), and visual information of a film material (transparent substrate 12). As visual information of the wire material, there may be included, for example, at least one of the type of wire material, color value, optical transmittance, and optical reflectance of the wire material, and the cross sectional shape and thickness of the thin metal wires 16. As visual information of the film material, there may be included, for example, at least one of the type, color value, optical transmittance, optical reflectance of the film material, and film thickness of the transparent substrate 12.

In relation to the conductive sheet 10 to be manufactured, the operator selects one of the types of wire materials (thin metal wires 16) using the pull down menu 422. In the example of FIG. 35, "SILVER (Ag)" is selected. Upon selecting one type of wire material, the display column 424 is updated immediately, and predetermined numerical values are newly displayed corresponding to physical properties of the wire material. Values for optical reflectivity (units: %), optical reflectance (unit: %), color value L*, color value a*, color value b* (CIELAB) of silver having a thickness of 100 µm are displayed respectively in the columns 448a through 448e.

Further, in relation to the conductive sheet 10 to be manufactured, the operator selects one of the types of film materials (transparent substrate 12) using the pull down menu 426. In the example of FIG. 35, "PET FILM" is selected. Upon selecting one type of film material, the display column 428 is updated immediately, and predetermined numerical values are newly displayed corresponding to physical properties of the film material. Values for optical reflectivity (units: %), optical reflectance (unit: %), color value L*, color value a*, color value b* (CIELAB) of a 1 mm thickness PET film are displayed respectively in the columns 450a through 450e.

By selecting the item "MANUAL INPUT" (not shown) via the pull down menus 422, 426, various physical property values can be input directly from the display columns 424, 428.

Furthermore, in relation to the conductive sheet 10 to be manufactured, the operator enters various conditions of the mesh pattern 20 respectively using the text box 430, etc.

The values input to the text boxes 430, 432, 434, 436 correspond respectively to total optical transmittance (units: %), film thickness of the transparent substrate 12 (units: µm), line width of the thin metal wires 16 (units: µm), and thickness of the thin metal wires 16 (units: µm).

The values input to the text boxes 438, 440, 442 correspond respectively to the horizontal size of the mesh pattern 20, the vertical size of the mesh pattern 20, and the image resolution (pixel size) of the output image data ImgOut.

After having finished the input operations on the setting screen 420, the operator clicks the "NEXT" button 446. At this time, the display controller 334 changes the setting screen 420 to the setting screen 460, and the setting screen 460 is displayed on the display device 322.

FIG. 36 is a view showing an image of a second setting screen 460 for setting image data creating conditions.

The setting screen 460 has, from the top thereof and in the following order, two radio buttons 462a, 462b, six text boxes 464, 466, 468, 470, 472, 474, a matrix-shaped image 476, and buttons 478, 480, 482 labeled respectively with "RETURN", "SET", and "CANCEL".

The words "PRESENCE" and "ABSENCE" are displayed respectively to the right of the radio buttons 462a and 462b. In addition, to the left of the radio button 462a, the text label "PRESENCE/ABSENCE OF MATRIX" is displayed.

To the left of the text boxes 464, 466, 468, 470, 472, 474, the text labels, "AVERAGE SAMPLE NUMBER OF SUPERIMPOSED POSITIONS", "DENSITY", "DIMENSIONS", "a", "b", "c", and "d" are displayed respectively. Further, to the right of the text boxes 464, 466, 468, 470, 472, 474, the text labels "TIMES", "D", "µ", "µ", "µ", and "µm" are displayed respectively. By performing a predetermined operation using the input device 320 (e.g., a keyboard), Arabic numerals can be entered in any of the text boxes 464, 466, 468, 470, 472, 474.

The matrix-shaped image 476 is an image that simulates the form of the black matrix 34 (see FIG. 3), and is provided with four openings 484 and a window frame 486.

The operator inputs appropriate numerical values via the setting screen 460 displayed on the display device 322. As a result, visual information in relation to visibility of the black matrix 34 can be input. Visual information of the black matrix 34 is defined by various types of information that contribute to the shape and optical density of the black matrix 34, and includes visual information of the pattern material. As visual information of the pattern material, for example, there may be included at least one of a type, a color, an optical transmittance, or an optical reflectance of the pattern material, or at least one of an arrangement position, a unit shape, or a unit size of the structural pattern may be included in the visual information of the pattern material.

In relation to the black matrix 34 that is to be superimposed, the operator inputs various conditions of the black matrix 34 using the text box 464.

The inputs made via the radio buttons 462a, 462b correspond to whether or not output image data ImgOut is created representing a pattern in which the black matrix 34 is superimposed on the mesh pattern 20. If the radio button 462a ("PRESENCE") is selected, the black matrix 34 is superimposed, and if the radio button 462b ("ABSENCE") is selected, the black matrix 34 is not superimposed.

The value input to the text box 464 randomly determines the arrangement position of the black matrix 34, and corresponds to the number of trials carried out to generate and evaluate the image data Img. For example, in the event the value is set to 5 times, five instances of image data Img are created in which positional relationships are determined randomly between the mesh pattern 20 and the black matrix 34, and using respective average values of the evaluation value EVP, evaluation of the pattern of the mesh is carried out.

The input values of the text boxes 466, 468, 470, 472, 474 correspond respectively to the optical density of the black matrix 34 (units: D), the vertical size of the pixels 32 (units: μm), the horizontal size of the pixels 32 (units: μm), the width of horizontal lattice lines of the black matrix 34 (units: μm), and the width of vertical lattice lines of the black matrix 34 (units: μm).

Responsive to the operator clicking on the "SET" button 480, the image information estimating unit 336 estimates the image information corresponding to the mesh pattern 20. The image information is referred to at the time that the image data Img (including the output image data ImgOut) is created.

For example, based on the vertical size of the mesh pattern 20 (the value input to the text box 438) and the image resolution of the output image data ImgOut (the value input to the text box 442), the number of pixels in the horizontal direction of the output image data ImgOut can be calculated, and based on the width of the wiring (the value input to the text box 434) and the image resolution, the number of pixels corresponding to the line width of the thin metal wires 16 can be calculated.

Further, based on the optical transmittance of the wire material (the value displayed in column 448a) and the thickness of the wires (the value input to the text box 436), the optical transmittance of the thin metal wires 16 themselves can be estimated. In addition thereto, based on the optical transmittance of the film material (the value displayed in the column 450a) and the film thickness (the value input to the text box 432), the optical transmittance under a condition in which the thin metal wires 16 are laminated on the transparent substrate 12 can be estimated.

Furthermore, based on the optical transmittance of the wire material (the value displayed in the column 448a), the optical transmittance of the film material (the value displayed in the column 450a), the total transmittance (the value input to the text box 430), and the width of the wires (the value input to the text box 434), the number of openings 18 can be estimated together with estimating the number of seed points SD. The number of seed points SD may also be estimated responsive to an algorithm which determines regions of the openings 18.

Furthermore, based on the optical density of the black matrix 34 (text box 466), the vertical size of the pixels 32 (text box 468), the horizontal size of the pixels 32 (text box 470), the width of the horizontal matrix lines of the black matrix 34 (text box 472), and the width of the vertical matrix lines of the black matrix 34 (text box 474), the pattern of the mesh pattern 20 (i.e., the shape and optical density) in the case that the black matrix 34 is superimposed can be estimated.

Next, output image data ImgOut is generated for forming the mesh pattern 20 (step S2). The output image data ImgOut is determined and created based on an evaluation value EVP exemplified as shown below.

A first evaluation value EVP is calculated with the following formula (2) in the case that values of the spectrum Spc are quantified by NP(Ux, Uy).

$$EVP = NP(Ux, Uy) \quad (2)$$

According to the Wiener-Khintchine theorem, a value obtained by integrating the spectrum Spc over the total spatial frequency band matches the square of the RMS. A value obtained by multiplying the VTF with respect to the spectrum Spc, and then integrating the new spectrum Spc over the total spatial frequency band yields an evaluation index that substantially coincides with human visual characteristics. The evaluation value EVP can be provided by the RMS corrected by the human visual response characteristics. Similar to an ordinary RMS, the evaluation value EVP typically is taken to be a value that is greater than or equal to zero, and the closer the evaluation value EVP is to zero, the better the noise characteristics are.

Further, by effecting an inverse Fourier transform (e.g., IFFT) with respect to the VTF shown in FIG. 22, a mask corresponding to the VTF is calculated in real space, and by applying the mask with respect to image data Img to be evaluated and performing a convolution operation thereon, the RMS may be determined with respect to the new image data Img. Consequently, a computational result can be obtained, which is equivalent to that obtained by the above-described method using formula (2).

A second evaluation value EVP is calculated with the following formula (3), using the noise intensity NP(Ux, Uy).

$$EVP = \sum_{j=1}^{3} Aj \int_0^{2\pi} \Theta\left(NP(0,0) - NP\left(\frac{j}{4}Unyq\cos\phi, \frac{j}{4}Unyq\sin\phi\right)\right) d\phi \quad (3)$$

Aj (where j=1 to 3) is an arbitrary coefficient (non-negative real number) determined beforehand. Further, $\Theta(x)$ is a step function, in which $\Theta(x)=1$ in the case that x>0, and $\Theta(x)=0$ in the case that x≤0. Furthermore, Unyq represents the Nyquist frequency of the image data Img. For example, in the event that resolution of the image data Img is 1750 dpi (dots per inch), the Nyquist frequency corresponds to Unyq=34.4 cycle/mm. Moreover, the variable φ is an angular parameter (0≤φ≤2π) on the Ux-Uy plane.

As understood from formula (3), in the case that respective noise intensities NP(Ux, Uy) in a spatial frequency band higher than ¼ of the Nyquist frequency Unyq, are greater than the noise intensity NP(0, 0) at zero spatial frequency, the right-side value becomes zero. The evaluation value EVP becomes minimal in the event that this condition (predetermined spatial frequency condition) is satisfied. As the evaluation value EVP goes lower, the spectrum Spc exhibited by the pattern of the mesh pattern 20 is suppressed by the low spatial frequency band. More specifically, the granular noise characteristic exhibited by the mesh pattern 20 approaches a so-called "blue noise" region in which the noise intensity NP(Ux, Uy) is eccentrically located on the side of the high spatial frequency band. Owing thereto, a mesh pattern can be obtained in which graininess is not noticeable to human visual perception under conditions of normal observation.

It goes without saying the formula for computing the evaluation value EVP may be modified in various ways, responsive to the evaluation function and the target level (acceptable range or tolerance) for determining the mesh pattern 20.

Below, a detailed method for determining output image data ImgOut based on the above-described evaluation value EVP shall be explained. For example, a method can be used in which generation of dot patterns made up from multiple seed points SD, generation of image data Img based on the multiple seed points SD, and evaluation thereof by the evaluation value EVP are repeated successively.

An algorithm for determining positions of multiple seed points can adopt various optimization techniques. For example, a method can be used in which creation of dot patterns having different arrangements, and evaluation thereof by the evaluation value EVP are repeated successively. In this case, as an optimization problem for determining the dot pattern, various search algorithms can be used, such as a constructive algorithm or an iterative improvement algorithm, etc. As detailed examples, a neural network, a genetic algorithm, a simulated annealing method, and a void-and-cluster method may be cited.

Figure 37:
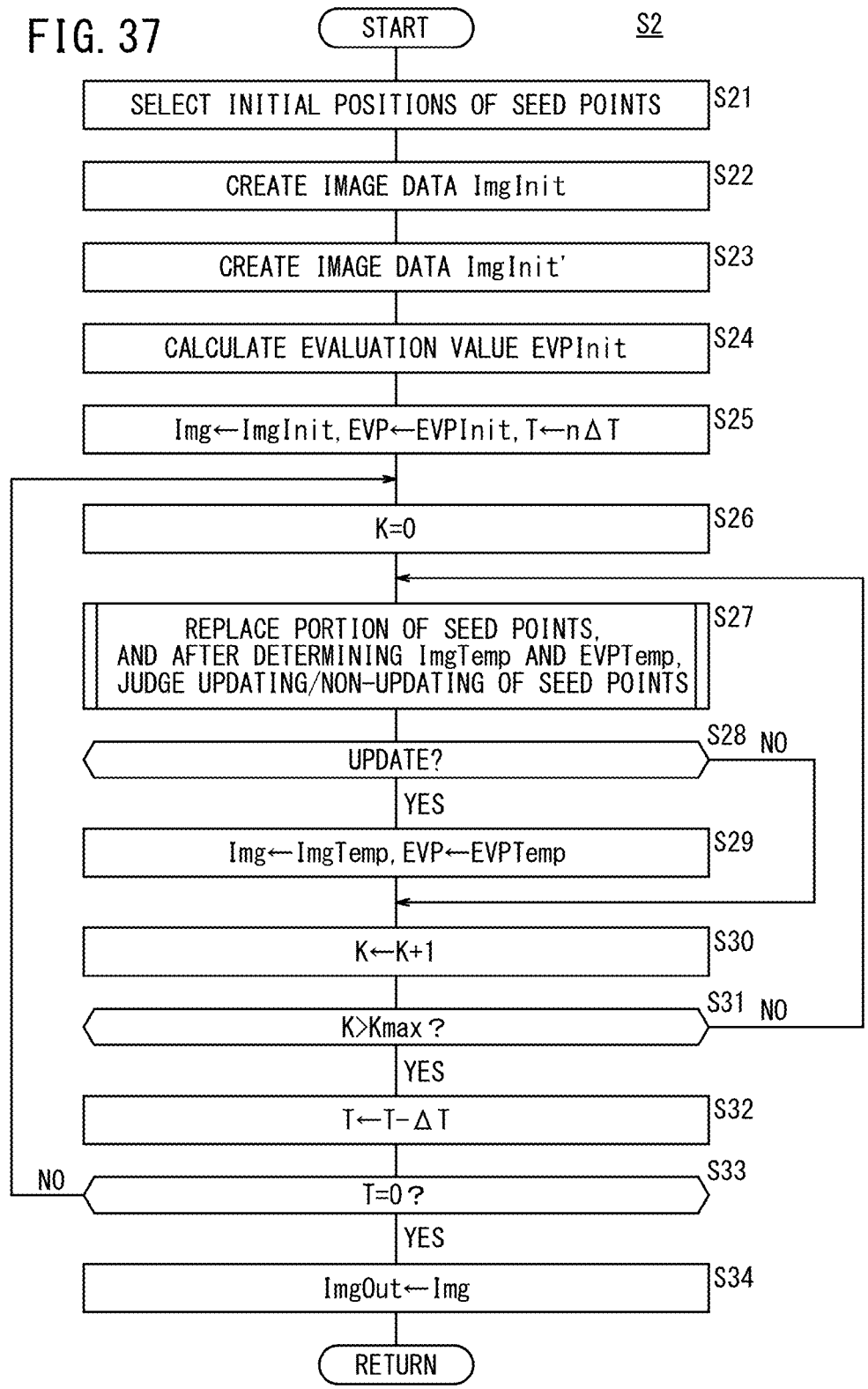
FIG. 37 is a flowchart providing a description of a method for generating output image data.

Primarily with reference to the flowchart of FIG. 37 and the functional block diagrams of FIG. 32 and FIG. 33, explanations shall be given concerning an optimization method for optimizing the form of the mesh pattern 20 by means of a simulated annealing method (hereinafter referred to as an SA method) according to the present embodiment. The SA method is a stochastic search algorithm modeled on an "annealing method" for obtaining robust iron by striking iron in a high temperature condition.

First, the initial position selecting unit 328 selects initial positions of seed points SD (step S21).

Prior to selecting the initial positions, the random number generator 326 generates a random number value using a pseudo-random number generating algorithm. As one such pseudo-random number generating algorithm, any of various algorithms may be used, such as a Mersenne Twister, an SIMD-Oriented Fast Mersenne Twister (SFMT), or an Xor-shift method. Then, using the random number value supplied from the random number generator 326, the initial position selecting unit 328 determines initial positions of the seed points SD in a random fashion. Herein, the initial position selecting unit 328 selects initial positions of the seed points SD as pixel addresses in the image data Img, and the seed points SD are set at respective positions that do not overlap one another.

Based on the number of pixels in vertical and horizontal directions of the image data Img supplied from the image information estimating unit 336, the initial position selecting unit 328 determines beforehand the range of the two-dimensional image region. Further, the initial position selecting unit 328 acquires beforehand from the image information estimating unit 336 the number of seed points SD, and based thereon, the number of seed points SD is determined.

FIG. 38 is a graph showing an example of a relationship between an arrangement density of seed points SD and the total transmittance of the mesh pattern 20. In the illustrated graph, it is shown that as the arrangement density becomes higher, the coverage area of the wires increases, and as a result, the total transmittance of the mesh pattern 20 decreases.

The graph characteristics exhibit changes responsive to the optical transmittance of the film material (as indicated in column 450*a* of FIG. 35), the wiring width (the value input to the text box 434 of FIG. 35), and a region determining algorithm (e.g., a Voronoi diagram). Thus, characteristic data responsive to each of the parameters such as wiring width or the like may be stored beforehand in the storage unit 324, in any of various data formats consisting of functions, tables, or the like.

Further, a correspondence between the arrangement density of the seed points SD and an electrical resistance value of the mesh pattern 20 may be acquired beforehand, whereby the number of seed points SD may be determined based on a specified electrical resistance value. The electrical resistance value is one parameter indicative of electrical conductivity of the first conductive portion 14*a* and the second conductive portion 14*b*, which is essential to the design of the mesh pattern 20.

The initial position selecting unit 328 may also select the initial positions of the seed points SD without using a random number value. For example, the initial positions can be determined by referring to data acquired from an external apparatus including a non-illustrated scanner or storage device. Such data, for example, may be predetermined binary data, and more specifically, may be halftone data used for printing.

Next, the image data generating unit 338 generates image data ImgInit that serves as initial data (step S22). The image data generating unit 338 generates image data ImgInit (initial data) representing the pattern corresponding to the mesh pattern 20, based on the number of seed points SD and the position data SDd supplied from the storage unit 324, along with image information supplied from the image information estimating unit 336. In this case, an algorithm for determining respective mesh shapes 22 from the plural seed points SD can adopt various methods. In the present embodiment, a method using a Voronoi diagram (see FIG. 20B) is adopted.

Incidentally, prior to generating the image data Img (including the initial image data ImgInit), definitions for pixel addresses and pixel values are determined in advance.

Figure 39A:
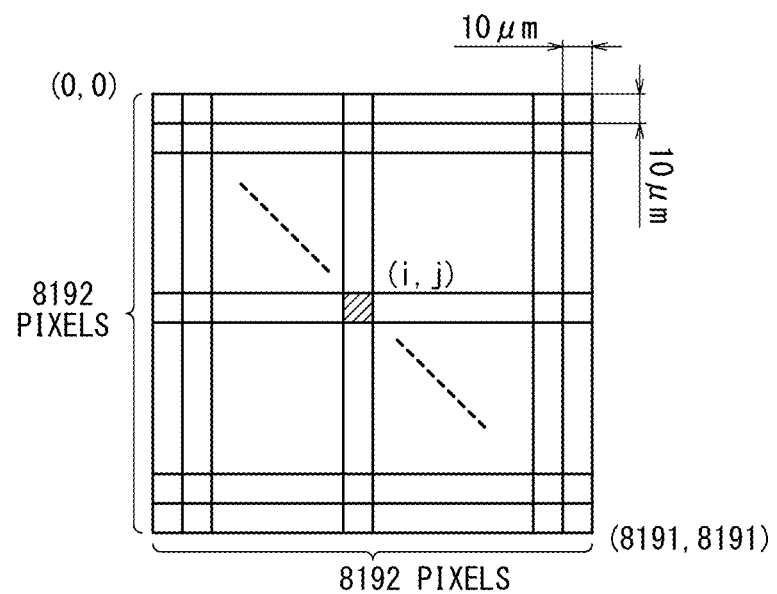
FIG. 39A is an explanatory diagram showing pixel address definitions in image data.

FIG. 39A is an explanatory diagram showing image pixel address definitions in the image data Img. For example, it is assumed that the pixel size is 10 μm, and the number of pixels in both vertical and horizontal directions of the image data is 8192 pixels respectively. For facilitating the FFT calculation process (to be described later), the number of pixels may be set as a power of 2 (e.g., 2 to the 13th power). At this time, the entire image region of the image data Img corresponds to a rectangular region of roughly 82 mm square.

Figure 39B:
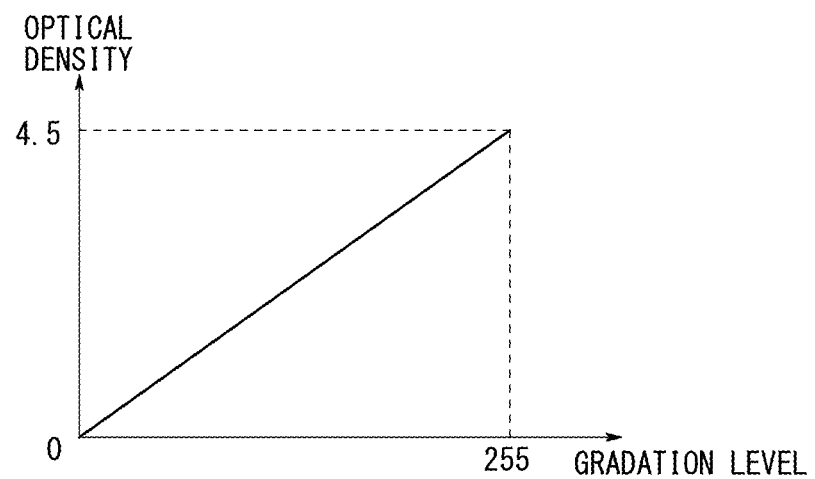
FIG. 39B is an explanatory diagram showing pixel value definitions in image data.

FIG. 39B is an explanatory diagram representing pixel value definitions in the image data Img. For example, it is assumed that the number of gradation levels for each individual pixel is 8 bits (256 gradations). An optical density of zero is set to correspond to a pixel value of zero (lowest value), whereas an optical density of 4.5 is set to correspond to a pixel value of 255 (highest value). For pixel values 1 to 254 therebetween, values are determined according to a linear relationship with respect to the optical density. It goes without saying that the optical density is not limited solely to transmissive density, but may be also reflective density, and can be selected appropriately depending on the manner in which the conductive sheet 10 is to be used. Further, apart from optical density, tristimulus values XYZ, RGB color values, or L*a*b* color values, etc., can also be used to define respective pixel values, similar to the above description.

Figure 40A:
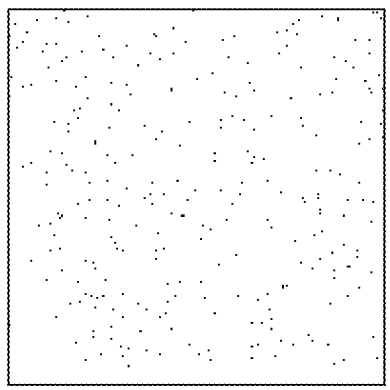
FIG. 40A is a schematic diagram of initial positions of seed points.
Figure 40B:
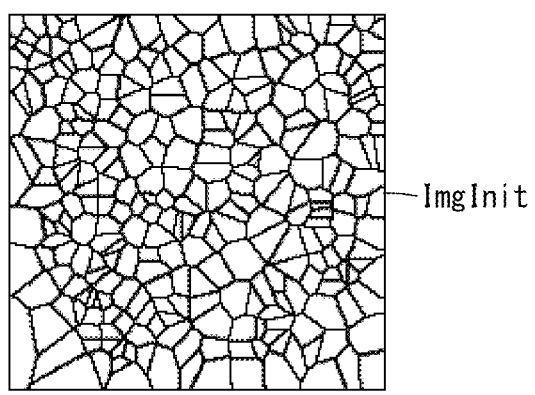
FIG. 40B is a Voronoi diagram formed on the basis of the seed points of FIG. 40A.

In this manner, the image data generating unit 338 creates the image data ImgInit corresponding to the mesh pattern 20, based on the data definition of the image data Img and the image information estimated by the image information estimating unit 336 (refer to the description of step S1) (step S22). Using a Voronoi diagram as a reference for the initial positions of the seed points SD (see FIG. 40A), the image data generating unit 338 determines initial conditions for the mesh pattern 20 shown in FIG. 40B. The image data Img (including the image data ImgInit) is handled as respective 4-channel image data made up of optical density OD, color value L*, color value a*, and color value b*.

Incidentally, in the case that the size of the image data Img is extremely large, the processing load required to perform optimization becomes enormous, and therefore, a large amount of processing time and processing power for the image generating device 312 is required. Further, since the size of image data Img (output image data ImgOut) is increased, a sufficient memory capacity to store such data also is required. Therefore, it is effective to use a method of regularly arranging unit image data ImgE that satisfies predetermined boundary conditions, and to construct the image data Img in a repeated pattern. Below, a specific method will be described in detail with reference to FIG. 41 and FIG. 42.

Figure 41:
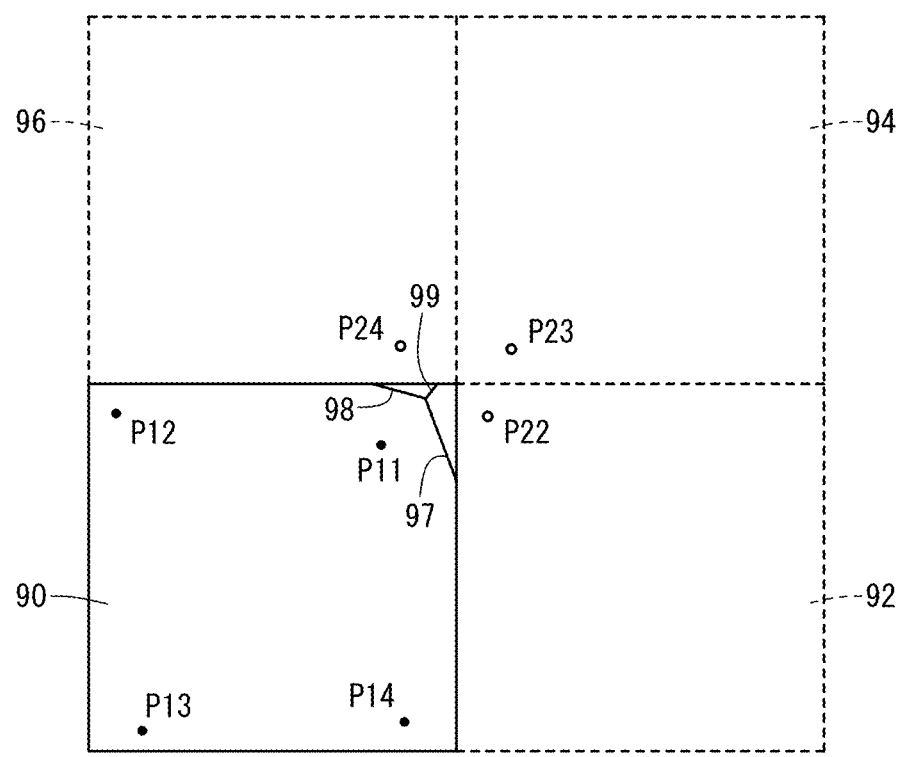
FIG. 41 is an outline schematic diagram showing a method for determining a pattern (wiring pattern) on an end portion of a unit area.
Figure 42:
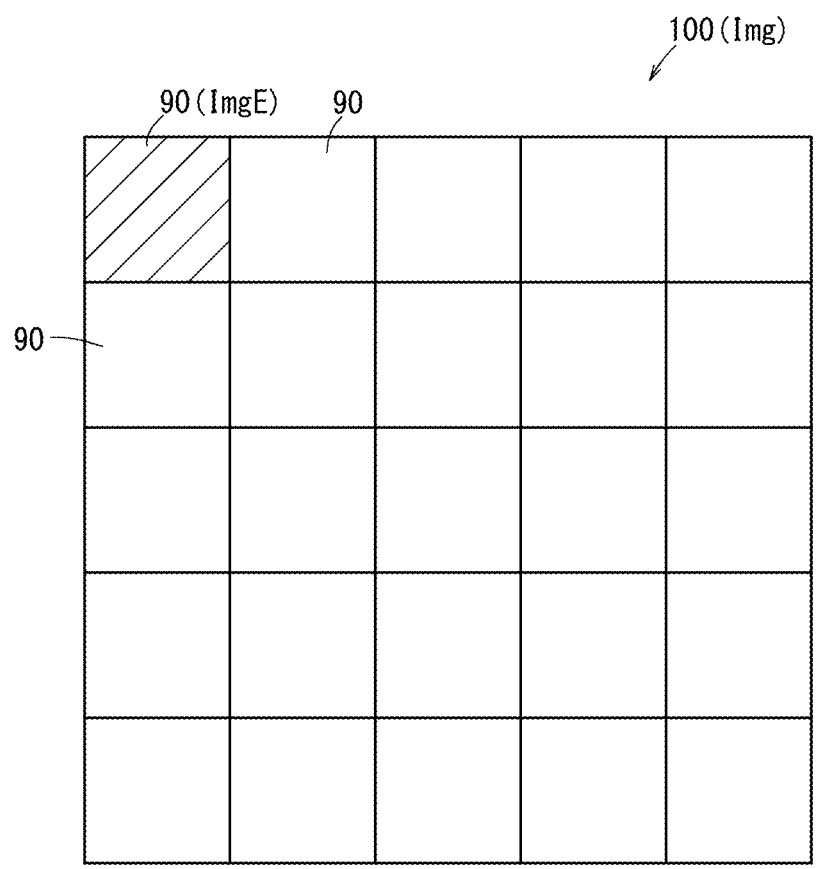
FIG. 42 is an outline schematic diagram showing a result in which unit image data are arranged regularly to create image data.

FIG. 41 is an outline schematic diagram showing a method for determining a pattern on an end portion of a unit area 90. FIG. 42 is an outline schematic diagram showing a result in which unit image data ImgE are arranged regularly to create the image data Img.

As shown in FIG. 41, in the unit area 90 comprising a substantially square shape, points $P_{11}$ to $P_{14}$ are disposed respectively in the upper right corner, the upper left corner, the lower left corner, and the lower right corner. For facilitating description, only the four points $P_{11}$ to $P_{14}$ are shown as residing within the unit area 90, and other points are omitted.

To the right of the unit area 90, a virtual area 92 (shown in dashed lines) is arranged adjacent thereto having the same size as the unit area 90. In the virtual area 92, a virtual point $P_{22}$ is arranged in a corresponding manner to the point $P_{12}$ in the unit area 90. Further, to the upper right of the unit area 90, a virtual area 94 (shown in dashed lines) is arranged adjacent thereto having the same size as the unit area 90. In the virtual area 94, a virtual point $P_{23}$ is arranged in a corresponding manner to the point $P_{13}$ in the unit area 90. Further, upwardly of the unit area 90, a virtual area 96 (shown in dashed lines) is arranged adjacent thereto having the same size as the unit area 90. In the virtual area 96, a virtual point $P_{24}$ is arranged in a corresponding manner to the point $P_{14}$ in the unit area 90.

Under these conditions, as will be described below, the image data generating unit 338 determines the pattern (wiring pattern) in the upper right corner of the unit area 90 in accordance with a Voronoi diagram (segmentation method).

In the relationship between point $P_{11}$ and the virtual point $P_{22}$, a single partition line 97 is determined, the line 97 being defined by a group of points that are equidistant from both the points. Further, in the relationship between the point $P_{11}$ and the virtual point $P_{24}$, a single partition line 98 is determined, the line 98 being defined by a group of points that are equidistant from both the points. Furthermore, in the relationship between the point $P_{22}$ and the virtual point $P_{24}$, a single partition line 99 is determined, the line 99 being defined by a group of points that are equidistant from both the points. In accordance with the partition lines 97 to 99, the pattern in the upper right corner of the unit area 90 is defined. In a similar manner, the patterns are defined across all ends of the unit area 90. The image data inside the unit area 90, which is created in the foregoing manner, is referred to below as unit image data ImgE.

As shown in FIG. 42, by arranging the unit image data ImgE regularly in the same direction, as well as vertically and horizontally, the image data Img is generated in the planar region 100. Since the pattern is determined in accordance with the boundary conditions shown in FIG. 41, it is possible for the respective unit image data ImgE portions to be connected together seamlessly between upper and lower ends, and between left and right ends of the unit image data ImgE.

By such a configuration, it is possible to minimize the size of the unit image data ImgE, and thus it is possible to reduce the data size and the amount of arithmetic processing. Further, generation of moiré phenomena due to mismatching of seams does not occur. The unit area 90 is not limited to a square shape, as shown in FIG. 41 and FIG. 42, but may be any type of shape that can be arranged regularly without gaps, such as rectangular, triangular, hexagonal shapes, etc.

Next, in step S23, the image data generating unit 338 generates image data ImgInit', based on the image data ImgInit generated in step S22 and image information estimated by the image information estimating unit 336 (refer to the explanation of step S1). The image data ImgInit' is image data representative of a pattern in which a black matrix 34 as a structural pattern is superimposed on the mesh pattern 20. In the case that the black matrix 34 is not superimposed by selecting the radio button 462b (see FIG. 36), the image data ImgInit without modification is copied to the image data ImgInit', and the routine proceeds to the following step S24.

In the case that the black matrix 34 is superimposed by selecting the radio button 462a (see FIG. 36), the image data generating unit 338 generates superimposed image data (i.e., the image data ImgInit'), using the image data ImgInit and the image information estimated by the image information estimating unit 336. The superimposed image data is image data representative of a pattern in which the black matrix 34 as a structural pattern is superimposed on the mesh pattern 20.

In the case that the data definitions for pixel values of the image data ImgInit are indicative of transmission density, the transmission density (the value input to the text box 466 in FIG. 36) of each of the pixels is added corresponding to the arrangement position of the black matrix 34, and the image data ImgInit' can be generated. Further, in the case that the data definitions for pixel values of the image data ImgInit are indicative of reflection density, the reflection density (the value input to the same text box 466) of each of the pixels is substituted therefor corresponding to the arrangement position of the black matrix 34, and the image data ImgInit' can be generated.

Next, the mesh pattern evaluating unit 340 calculates the evaluation value EVPInit (step S24). In the SA method, the evaluation value EVP assumes the role of a cost function.

More specifically, the FFT operating unit 400 shown in FIG. 33 effects FFT with respect to the image data ImgInit'. In addition, the evaluation value calculating unit 402 calculates the evaluation value EVP based on the spectrum Spc supplied from the FFT operating unit 400.

From within the image data Img, the aforementioned evaluation values EVP(L*), EVP(a*), EVP(b*) are calculated respectively for each of the respective channels for the color value L*, the color value a*, and the color value b* (refer to formula (2) or formula (3) above). In addition, the evaluation value EVP is obtained by a product-sum operation using a predetermined weighting coefficient.

In place of the color values L*, a*, b*, optical density OD may also be used. In relation to the evaluation value EVP, depending on the type of observational mode, i.e., corresponding to whether the auxiliary light source is predominantly transmissive light, predominantly reflective light, or a mixture of transmissive and reflective light, an appropriate calculation method can be selected that complies with human visual sensitivity.

Further, it goes without saying that the formula for computing the evaluation value EVP may be changed corresponding to the target level (acceptable range or tolerance) or the evaluation function for determining the mesh pattern 20.

In this manner, the mesh pattern evaluating unit 340 calculates the evaluation value EVPInit (step S24).

Next, the storage unit 324 temporarily stores the image data ImgInit created in step S22, and the evaluation value EVPInit calculated in step S24 (step S25). Along therewith, an initial value nΔT (where n is a natural number and ΔT is a positive real number) is assigned to the simulated temperature T.

Next, the counter 408 initializes the variable K (step S26). That is, the counter 408 assigns 0 to the variable K.

Figure 43:
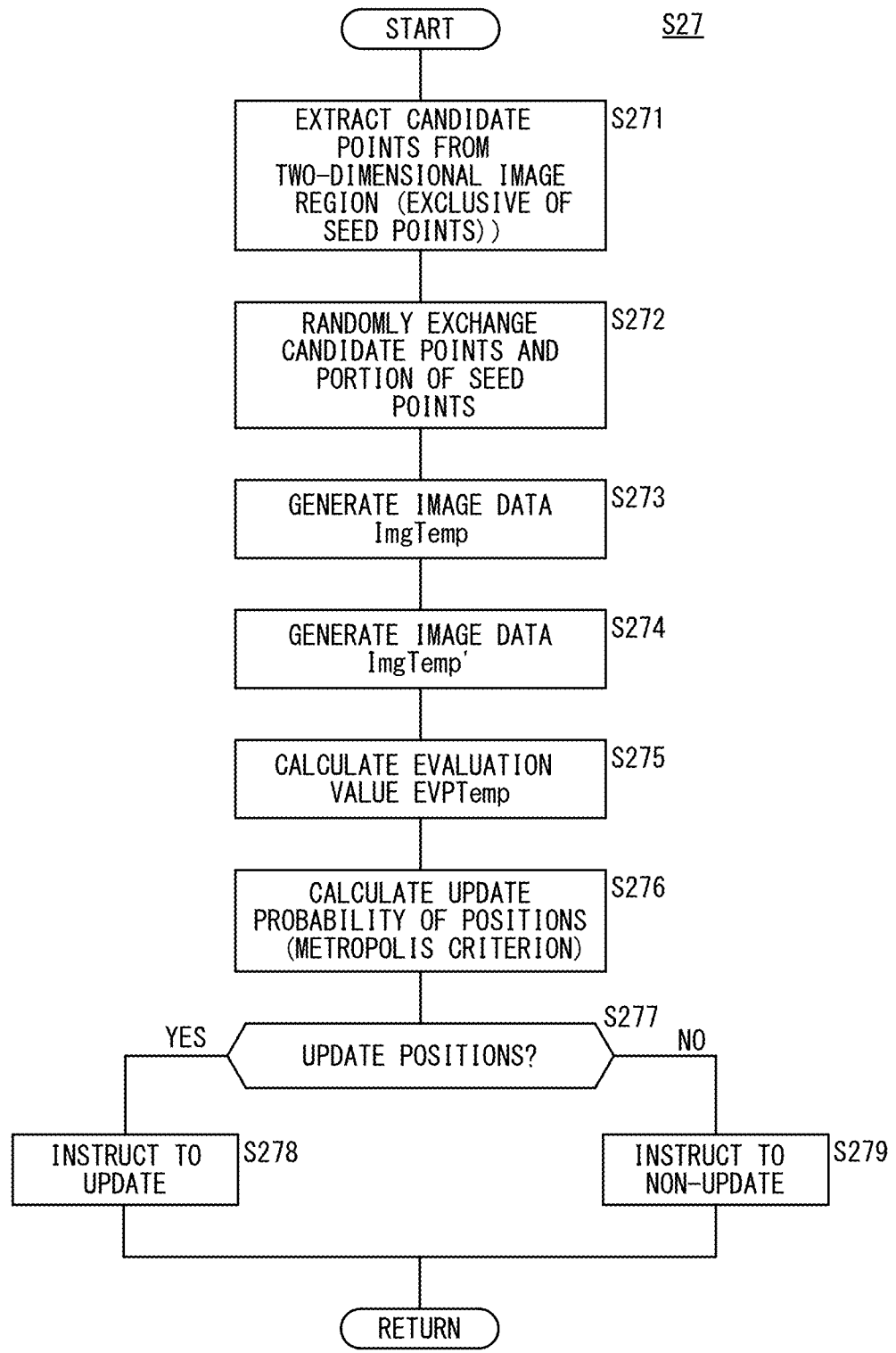
FIG. 43 is a detailed flowchart of step S27 shown in FIG. 37.

Then, in a state in which a portion of the seed points SD (second seed points SDS) are replaced by candidate points SP, and after image data ImgTemp is created and the evaluation value EVPTemp is calculated, a determination is made as to whether to "update" or "not update" the seed points SD (step S27). Further details concerning step S27 will be described with reference to the flowchart of FIG. 43 and the functional block diagrams of FIG. 32 and FIG. 33.

First, the updated candidate position determining unit 330 extracts and determines candidate points SP from the predetermined planar region 100 (step S271). The updated candidate position determining unit 330, for example, using a random value supplied from the random number generator 326, determines non-overlapping positions in relation to any of the positions of the seed points SD. The candidate points SP may be a single point or a plurality of points. In the example shown in FIG. 44A, two candidate points SP (point $Q_1$ and point $Q_2$) are determined with respect to the eight current seed points SD (points $P_1$ to $P_8$).

Figure 44A:
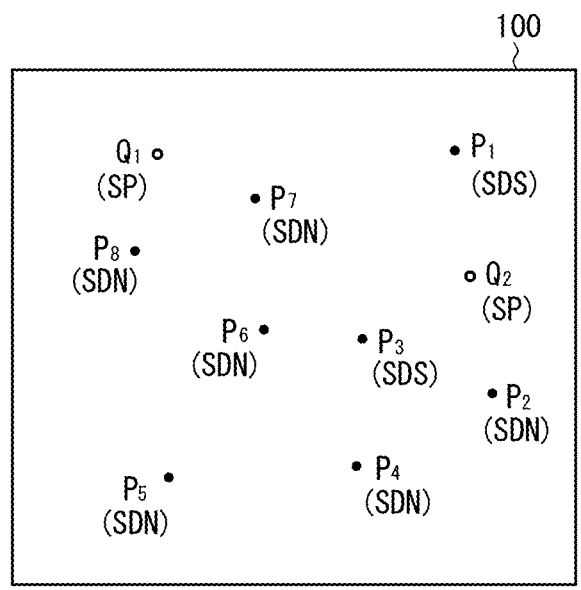
FIG. 44A is an explanatory drawing showing a positional relationship between first seed points, second seed points, and candidate points within an image region.
Figure 44B:
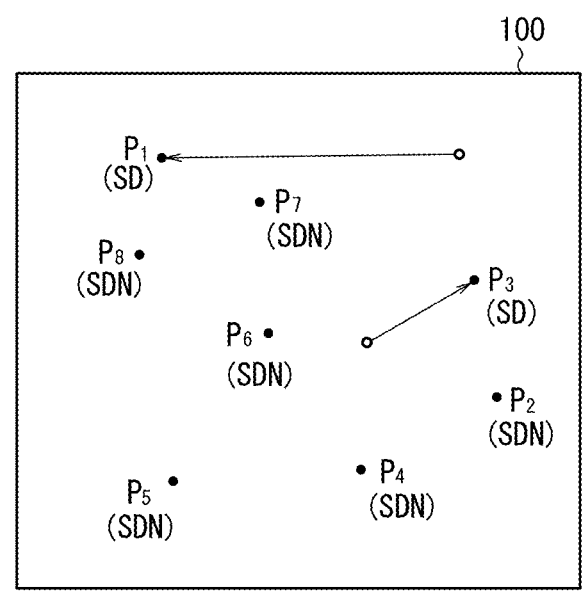
FIG. 44B is an explanatory drawing of a result in which the second seed points and the candidate points are exchanged to update the seed point positions.

Next, a portion of the seed points SD and the candidate points SP are exchanged at random (step S272). The updated candidate position determining unit 330 establishes a correspondence randomly between each of the candidate points SP and each of the exchanged (or updated) seed points SD. In FIG. 44A, a correspondence is established between point $P_1$ and point $Q_1$, and also between point $P_3$ and point $Q_2$. As shown in FIG. 44B, the point $P_1$ and the point $Q_1$ are exchanged, and the point $P_3$ and the point $Q_2$ are exchanged. In this case, points $P_2$ and points $P_4$ to $P_8$, which are not subject to exchange (or updating), are referred to as first seed points SDN, whereas point $P_1$ and point $P_3$, which are subject to exchange (or updating), are referred to as second seed points SDS.

Then, using the exchanged and updated seed points SD (see FIG. 44B), the image data generating unit 338 generates the image data ImgTemp (step S273). At this time, the method used is the same as in the case of step S22 (see FIG. 37), and thus explanations therefor are omitted. Further, in the case that the black matrix 34 is not superimposed by selecting the radio button 462*b* (see FIG. 36), the image data ImgTemp without modification is copied to the image data ImgTemp', and the routine proceeds to the following step S274.

In the case that the black matrix 34 is superimposed by selecting the radio button 462*a* (see FIG. 36), the image data generating unit 338 generates superimposed image data (i.e., the image data ImgTemp'), using the image data ImgTemp and the image information estimated by the image information estimating unit 336. The superimposed image data is image data representative of a pattern in which the black matrix 34 as a structural pattern is superimposed on the mesh pattern 20.

Next, the image data generating unit 338 generates the image data ImgTemp', based on the image data ImgTemp generated in step S273 and the image information (see the explanation of step S1) estimated by the image information estimating unit 336 (step S274). At this time, the method is the same as that used in the case of step S23 (see FIG. 37), and thus explanations therefor are omitted.

Next, the mesh pattern evaluating unit 340 calculates an evaluation value EVPTemp based on the image data ImgTemp' (step S275). At this time, the method used is the same as in the case of step S24 (see FIG. 37), and thus explanations therefor are omitted.

Next, the update probability calculation unit 412 calculates an update probability Prob for updating the positions of the seed points SD (step S276). The phrase "updating the positions" implies determining, as new seed points SD, seed points SD that are tentatively exchanged and obtained in step S272 (i.e., the first seed points SDN and the candidate points SP).

More specifically, in accordance with the Metropolis Criterion, a probability of updating the seed points SD and a probability of not updating the seed points SD are calculated. The update probability Prob is given by the following formula (4).

$$Prob = \begin{cases} 1 & (\text{if } EVPTemp < EVP) \\ \exp\left(-\dfrac{EVPTemp - EVP}{T}\right) & (\text{if } EVPTemp \geq EVP) \end{cases} \quad (4)$$

The variable T represents a simulated temperature, wherein, in accordance with the simulated temperature T approaching an absolute temperature (T=0), the updating rule for the seed points SD changes from stochastic to deterministic.

Next, in accordance with the update probability Prob calculated by the update probability calculation unit 412, the position update determining unit 414 determines whether or not to update the positions of the seed points SD (step S277). For example, such a determination may be made stochastically using a random number value supplied from the random number generator 326.

In the case that the seed points SD are to be updated, an "update" instruction is given to the storage unit 324, whereas in the case that the seed points SD are not to be updated, a "do not update" instruction is given to the storage unit 324 (steps S278, S279).

In the foregoing manner, step S27 is brought to an end.

Returning to FIG. 37, in accordance with either of the instructions "update" or "do not update", it is determined whether or not the seed points SD should be updated (step S28). In the case that the seed points SD are not updated, step S29 is not performed and the routine proceeds to the next step S30.

On the other hand, in the case that the seed points SD are to be updated, in step S29, the storage unit 324 overwrites and updates the presently stored image data Img with the image data ImgTemp determined in step S273. Further, also in step S29, the storage unit 324 overwrites and updates the presently stored evaluation value EVP with the evaluation value EVPTemp determined in step S275. Furthermore, also in step S29, the storage unit 324 overwrites and updates the presently stored position data SDSd of the second seed points SDS with the position data SPd of the candidate points SP determined in step S271. Thereafter, the routine proceeds to step S30.

Next, the counter 408 increments the value of K at the present time by 1 (step S30).

Then, the counter 408 compares a magnitude relationship between the value of K at the present time and the predetermined value of Kmax (step S31). If the value of K is smaller than Kmax, then the process returns to step S27, and steps S27 to S31 thereafter are repeated. In this case, in order to sufficiently ensure convergence at an optimized calculation, the value of Kmax can be set, for example, at Kmax=10000.

In cases apart therefrom, the simulated temperature management unit 410 decrements the simulated temperature T by ΔT (step S32) and then proceeds to step S33. The change in the simulated temperature T is not limited to being decremented by ΔT, but the simulated temperature T may also be multiplied by a fixed constant δ (0<δ<1). In this case, the update probability Prob (lower) indicated in formula (4) is decremented by a constant value.

Next, the simulated temperature management unit 410 determines whether or not, at the present time, the simulated temperature T is equivalent to zero (step S33). If T is not equal to zero, then the process returns to step S26, and steps S26 to S33 are repeated.

On the other hand, if T is equivalent to zero, then the simulated temperature management unit 410 issues a notification to the output image data determining unit 416 to the effect that evaluation by the SA method has been completed. In addition, the storage unit 324 overwrites the content of the updated image data Img, which was updated for the last time in step S29, onto the output image data ImgOut, thereby updating the same (step S34). In this manner, generation of the output image data ImgOut (step S2) is brought to an end.

The output image data ImgOut is used for outputting and forming the thin metal wires 16. For example, in the case that the conductive sheet 10 is manufactured by way of one-shot exposure of both surfaces thereof, to be described later, the output image data ImgOut is used for fabricating a photomask pattern. Further, in the case that the conductive sheet 10 is manufactured by printing including screen printing or inkjet printing, the output image data ImgOut is used as printing data.

Further, apart from the touch panel 44, the output image data ImgOut may be used to form wires of various types of electrodes, such as for an inorganic EL element, an organic EL element, a solar cell, or the like. Further, apart from electrodes, the inventive features can be applied to a transparent heat generating element (for example, a vehicle defroster) that generates heat by flow of electric current, and an electromagnetic shielding material for shielding electromagnetic waves.

So that the operator can visually confirm the data, the obtained output image data ImgOut may be displayed on the display device 322, and the mesh pattern 20 may be made visual in a simulated manner. Below, an example shall be described of actual visual results of the output image data ImgOut.

Figure 45A:
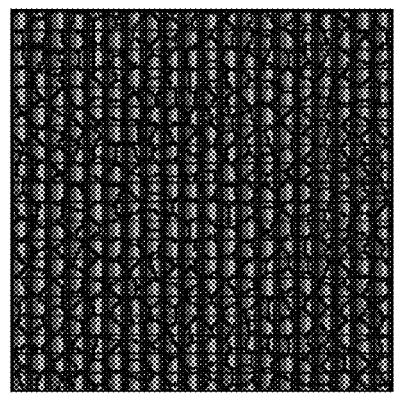
FIG. 45A is an outline schematic diagram in which a black matrix is superimposed and made visual with respect to output image data.
Figure 45B:
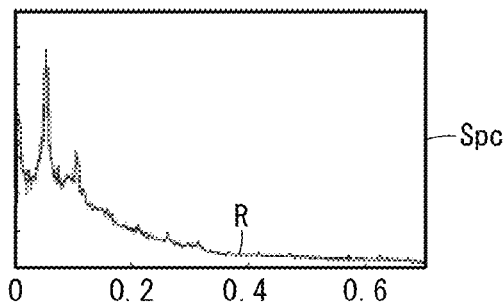
FIGS. 45B to 45D are graphs in which R components, G components, and B components of color values within the image data of FIG. 45A are extracted, respectively, and two-dimensional power spectra thereof are calculated.
Figure 45C:
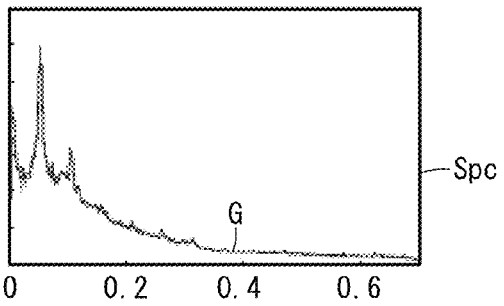
Figure 45D:
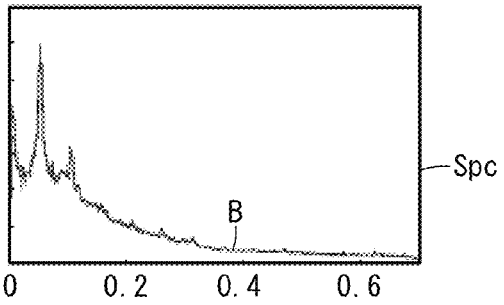

FIG. 45A is an outline schematic diagram in which the black matrix 34 is superimposed with respect to output image data ImgOut representing a pattern of the mesh pattern 20, thereby to make the image data visual. In the present drawing, the mesh pattern 20, the red sub-pixel 32r, the green sub-pixel 32g, the blue sub-pixel 32b, and the black matrix 34 are shown so as to be capable of being distinguished respectively. FIGS. 45B to 45D are graphs in which R components, G components, and B components of color values within the output image data ImgOut of FIG. 45A are extracted, respectively, and spectra Spc thereof are calculated. As shown in FIGS. 45B to 45D, substantially the same spectra Spc are obtained for the respective R, G, B components. In any one of such spectra, a noise peak is generated centered about a spatial frequency corresponding to the lattice interval of the black matrix 34.

Figure 46A:
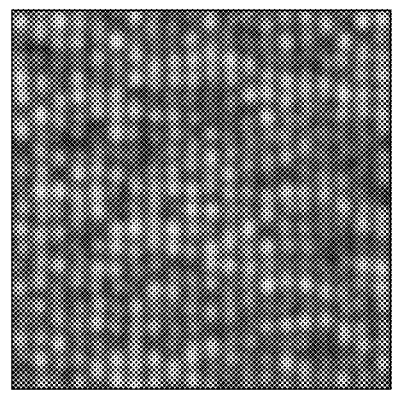
FIG. 46A is an outline schematic diagram in which human visual response characteristics operate on and made visual with respect to the output image data of FIG. 45.

In contrast thereto, FIG. 46A is an outline schematic diagram in which human visual response characteristics are applied with respect to the output image data ImgOut of FIG. 45, thereby to make the image data visual. By applying the human visual response characteristics, or stated otherwise, by applying a low pass filter (see FIG. 22), as shown in FIG. 46A, fine structure profiles of the mesh pattern 20 and the black matrix 34 almost cannot be perceived visually.

Figure 46B:
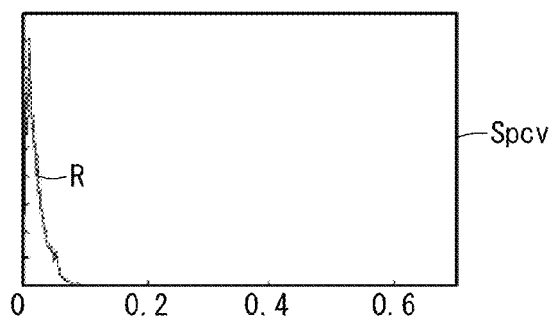
FIGS. 46B to 46D are graphs in which R components, G components, and B components of color values within the image data of FIG. 46A are extracted, respectively, and two-dimensional power spectra thereof are calculated.
Figure 46C:
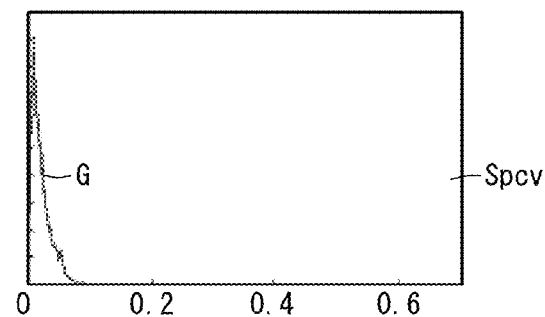
Figure 46D:
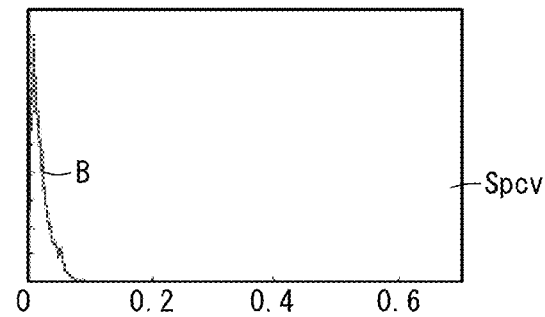

FIGS. 46B to 46D are graphs in which R components, G components, and B components of color values within the image data of FIG. 46A are extracted, respectively, and spectra Spcv thereof are calculated. Compared to FIG. 45A, the above-described noise characteristic peak is shifted toward a low spatial frequency side, and the area formed by the spectra Spcv is reduced.

If the aforementioned method is used, concerning noise characteristics of the mesh pattern 20, an evaluation that conforms better to human visual response characteristics can be carried out.

Lastly, the image cutout unit 332 cuts out two or more first conductive patterns 70a, two or more first dummy patterns 76a, and two or more second conductive patterns 70b, respectively, from the wiring pattern (form of the mesh pattern 20) of the planar region 100 represented by the output image data ImgOut (step S3).

Figure 47A:
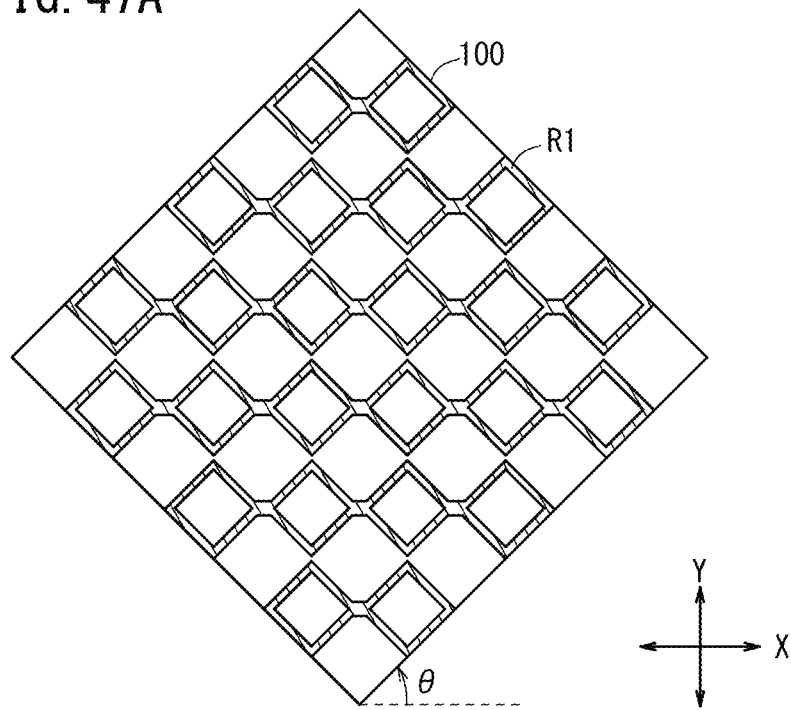
FIG. 47A is an outline schematic diagram showing results obtained in a case where a first conductive pattern and a first dummy pattern are cut out respectively.
Figure 47B:
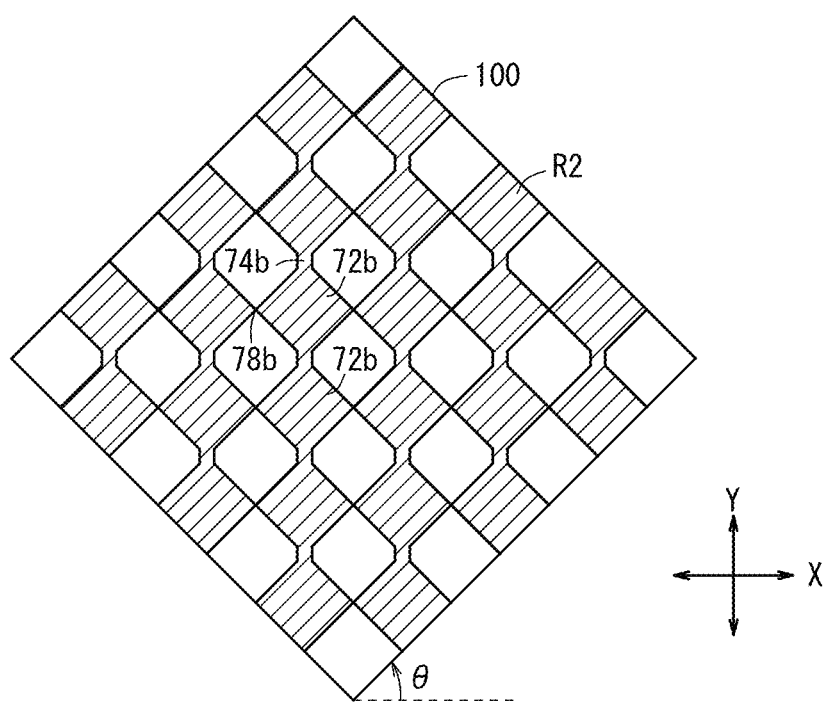
FIG. 47B is an outline schematic diagram showing results obtained in a case where a second conductive pattern is cut out.

FIG. 47A is an outline schematic diagram showing results obtained in the case where first conductive patterns 70a and first dummy patterns 76a are cut out respectively. FIG. 47B is an outline schematic diagram showing results obtained in the case where second conductive patterns 70b are cut out.

By cutting out locations except for a first region R1 (the region shown in hatching) from within the planar region 100 shown in FIG. 47A, first image data are created representing a pattern on one main surface side (the side in the direction of the arrow s1 in FIG. 9) of the transparent substrate 12. The first region R1 has a form in which frame shapes in the form of diamonds are connected in plurality in the direction of the arrow X. More specifically, in the first image data, two or more first conductive patterns 70a and two or more first dummy patterns 76a (see FIG. 9B and FIG. 10) are represented, respectively.

Further, by cutting out only the second region R2 (the region shown in hatching) from within the planar region 100 shown in FIG. 47B, second image data are created representing a pattern on the other main surface side (the side in the direction of the arrow s2 in FIG. 9) of the transparent substrate 12. In the second image data, two or more second conductive patterns 70b (see FIG. 5B and FIG. 7) are represented, respectively. Moreover, the remaining regions except for the second region R2 (i.e., the blank areas inside the planar region 100 shown in FIG. 47B) correspond respectively to positions of the first conductive patterns 70a.

In FIG. 47A and FIG. 47B, compared with FIG. 42, the planar region 100 is arranged in a state of being inclined at a predetermined angle (e.g., θ=45°). More specifically, an angle θ formed between the arrangement direction of the unit image data ImgE and the direction of extension of the respective first conductive patterns 70a (or the respective second conductive patterns 70b) is not zero (0°<θ<90°). In this manner, by tilting the respective first conductive patterns 70a (or the respective second conductive patterns 70b) at the predetermined angle θ with respect to the direction in which the repeating pattern of the mesh pattern 20 is arranged, generation of moiré phenomena between the repeating pattern and the respective first sensing units 72a (or the respective second sensing units 72b) can be suppressed. It goes without saying that the angle θ may be equal to zero degrees (θ=0°), so long as moiré phenomena are not generated in such a condition. From the same standpoint, the size of the repeating pattern preferably is of a size that is larger than the size of the respective first sensing units 72a (or the respective second sensing units 72b).

The generated first image data and second image data are used for output formation of the thin metal wires 16. For example, in the case that the conductive sheet 10 is manufactured using a two-sided one-shot exposure, to be described later, the first image data and the second image data are used to produce a photomask pattern. Further, in the case that the conductive sheet 10 is manufactured by printing including screen printing or inkjet printing, the first image data and the second image data are used as printing data.

[Method of Forming First Conductive Portion 14a and Second Conductive Portion 14b]

Next, in a method of forming the first conductive portion 14a and the second conductive portion 14b (hereinafter also referred to as the first conductive portion 14a, etc.), for example, by exposing to light a photosensitive material including an emulsion layer containing a photosensitive silver halide salt on the transparent substrate 12, and carrying out development processing thereon, metallic silver portions and light permeable portions may be formed respectively in exposed and non-exposed areas, to thereby form the first conductive portion 14a and the second conductive portion 14b. Moreover, by further implementing at least one of a physical development treatment and a plating treatment on the metallic silver portions, a conductive metal may be deposited on the metallic silver portions. With respect to the conductive sheet 10 shown in FIG. 2, etc., the following manufacturing method indicated below preferably is adopted. More specifically, a one-shot exposure is carried out with respect to photosensitive silver halide emulsion layers formed on both surfaces of the transparent substrate 12, the first conductive portion 14a is formed on one main surface of the transparent substrate 12, and the second conductive portion 14b is formed on the other main surface of the transparent substrate 12.

A detailed example of the production method will be described below with reference to FIGS. 48 through 50.

Figure 48:
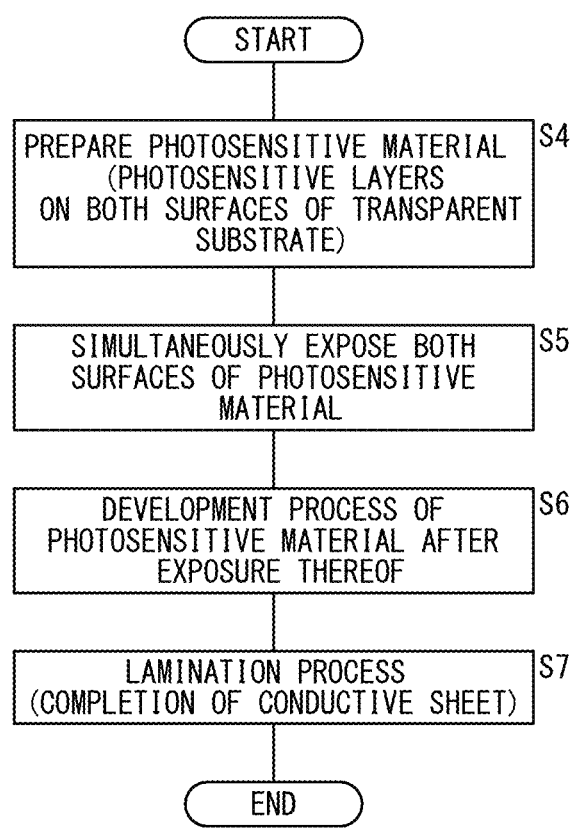
FIG. 48 is a flowchart providing a description of a manufacturing method for the conductive sheet according to the first embodiment.
Figure 49A:
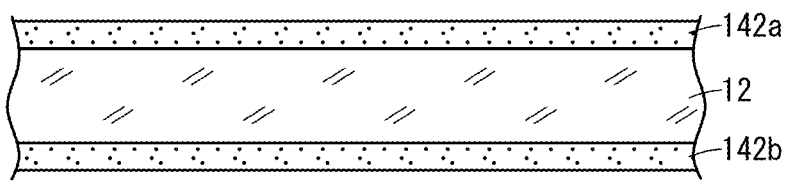
FIG. 49A is a cross sectional view showing a situation in which a produced photosensitive material is partially omitted.

First, in step S4 of FIG. 48, an elongate photosensitive material 140 is prepared. As shown in FIG. 49A, the photosensitive material 140 has the transparent substrate 12, a photosensitive silver halide emulsion layer (hereinafter referred to as a first photosensitive layer 142a) formed on one main surface of the transparent substrate 12, and a photosensitive silver halide emulsion layer (hereinafter referred to as a second photosensitive layer 142b) formed on the other main surface of the transparent substrate 12.

Figure 49B:
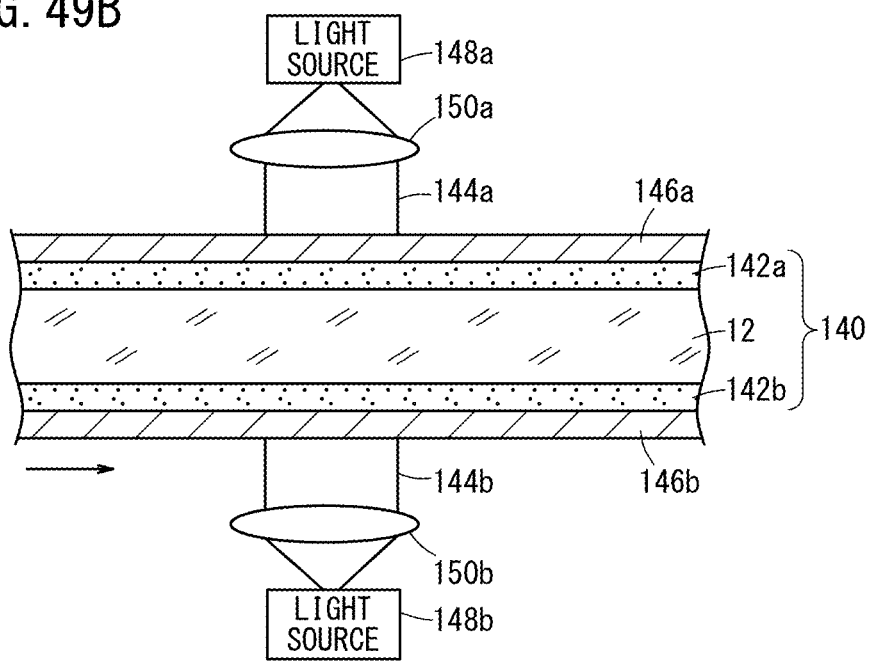
FIG. 49B is an outline schematic diagram showing simultaneous exposure of both surfaces with respect to the photosensitive material.

In step S5 of FIG. 48, the photosensitive material 140 is exposed. In this step, an exposure treatment (two-sided one-shot exposure) is carried out, which includes a first exposure treatment for irradiating the first photosensitive layer 142a on the transparent substrate 12 with light in a first exposure pattern, and a second exposure treatment for irradiating the second photosensitive layer 142b on the transparent substrate 12 with light in a second exposure pattern. In the example of FIG. 49B, the first photosensitive layer 142a is irradiated through a first photomask 146a with first light 144a (parallel light), and the second photosensitive layer 142b is irradiated through a second photomask 146b with second light 144b (parallel light), while the elongate photosensitive material 140 is conveyed in one direction. The first light 144a is light from a first light source 148a that is converted into parallel light by an intervening first collimator lens 150a, and the second light 144b is light from a second light source 148b that is converted into parallel light by an intervening second collimator lens 150b.

Although two light sources (the first light source 148a and the second light source 148b) are used in the example of FIG. 49B, a single light source may be used. In this case, light from one light source may be divided by an optical system into the first light 144a and the second light 144b, which are used to irradiate the first photosensitive layer 142a and the second photosensitive layer 142b.

In addition, in step S6 of FIG. 48, the exposed photosensitive material 140 is subjected to a development process. The exposure time and the development time for the first photosensitive layer 142a and the second photosensitive layer 142b change depending on the type of the first light source 148a, the second light source 148b, and the developer, etc., and preferred numerical ranges therefore cannot be determined categorically. However, the exposure time and, the development time are adjusted to achieve a development ratio of 100%.

Figure 50:
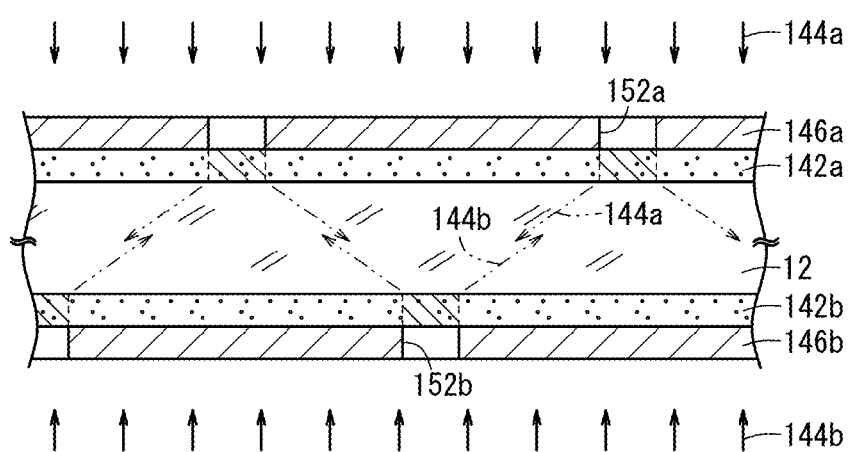
FIG. 50 is an outline schematic diagram showing a condition in which a first exposure process and a second exposure process are implemented.

In addition, as shown in FIG. 50, in the first exposure treatment in a production method of according to the second embodiment, for example, the first photomask 146a is placed in close contact with the first photosensitive layer 142a, the first light source 148a is arranged in facing relation to the first photomask 146a, and the first light 144a is emitted from the first light source 148a toward the first photomask 146a, whereby the first photosensitive layer 142a is exposed. The first photomask 146a is constituted from a glass substrate composed of transparent soda glass, and a mask pattern (first exposure pattern 152a) formed on the glass substrate. Consequently, in the first exposure treatment, areas in the first photosensitive layer 142a, corresponding to the first exposure pattern 152a in the first photomask 146a, are exposed. A space of approximately 2 to 10 μm may be formed between the first photosensitive layer 142a and the first photomask 146a.

Similarly, in the second exposure treatment, the second photomask 146b is placed in close contact with the second photosensitive layer 142b, the second light source 148b is arranged in facing relation to the second photomask 146b, and the second light 144b is emitted from the second light source 148b toward the second photomask 146b, whereby the second photosensitive layer 142b is exposed. The second photomask 146b, similar to the first photomask 146a, is constituted from a glass substrate composed of transparent soda glass, and a mask pattern (second exposure pattern 152b) formed on the glass substrate. Consequently, in the second exposure treatment, areas in the second photosensitive layer 142b, corresponding to the second exposure pattern 152b in the second photomask 146b, are exposed. A space of approximately 2 to 10 µm may be formed between the second photosensitive layer 142b and the second photomask 146b.

In the first and second exposure treatments, the timing of emission of first light 144a from the first light source 148a, and the timing of emission of second light 144b from the second light source 148b may be carried out simultaneously or independently. In the case that the emissions are carried out simultaneously, the first photosensitive layer 142a and the second photosensitive layer 142b can be exposed simultaneously in one exposure process, thus enabling the treatment time to be reduced.

Lastly, in step S7 of FIG. 48, a lamination process is carried out on the photosensitive material 140 following development thereof, whereby the conductive sheet 10 is completed. More specifically, the first protective layer 26a is formed on the side of the first photosensitive layer 142a, and the second protective layer 26b is formed on the side of the second photosensitive layer 142b. As a result, the first sensor part 60a and the second sensor part 60b are protected.

In the foregoing manner, using the above two-sided one-shot exposure production method, the electrodes of the touch panel 44 can be formed easily, and the touch panel can be made thinner (lower in profile).

In the above production method, the first conductive portion 14a and the second conductive portion 14b are formed using a photosensitive silver halide emulsion layer. However, other production methods may be used, including the following methods.

For example, the first conductive portion 14a, etc., may be formed by exposing a photoresist film on a copper foil formed on the transparent substrate 12, followed by performing a development treatment to form a resist pattern, and then etching parts of the copper foil exposed through the resist pattern. Alternatively, the first conductive portion 14a, etc., may be formed by printing a paste, which contains metal micro-particles, on the transparent substrate 12, and then subjecting the printed paste to metal plating. Alternatively, the first conductive portion 14a, etc., may be formed on the transparent substrate 12 by printing using a screen printing plate or a gravure printing plate. Alternatively, the first conductive portion 14a, etc., may be formed by carrying out inkjet printing on the transparent substrate 12.

Descriptions of Other Embodiments

Next, with reference to FIGS. 51 through 55, descriptions shall be given concerning other embodiments of the conductive sheet 10 according to the present embodiment.

[Example Applied to Resistive Film Type Touch Panel]

The present invention can be applied not only to an electrostatic capacitance type, but also to a resistive film type (as well as to a digital type, or an analog type) of touch panel 160. Below, with reference to FIGS. 51 to 53, the structure and operational principles of such a touch panel 160 will be described.

A digital resistive film type touch panel 160 comprises a lower side panel 162, an upper side panel 164 arranged in confronting relation to the lower side panel 162, a frame adhesive layer 166 bonded to peripheral edge portions of the lower side panel 162 and the upper side panel 164, and which serves to electrically insulate both the panels from each other, and an FPC 168 (Flexible Printed Circuit) sandwiched between the lower side panel 162 and the upper side panel 164.

Figure 52A:
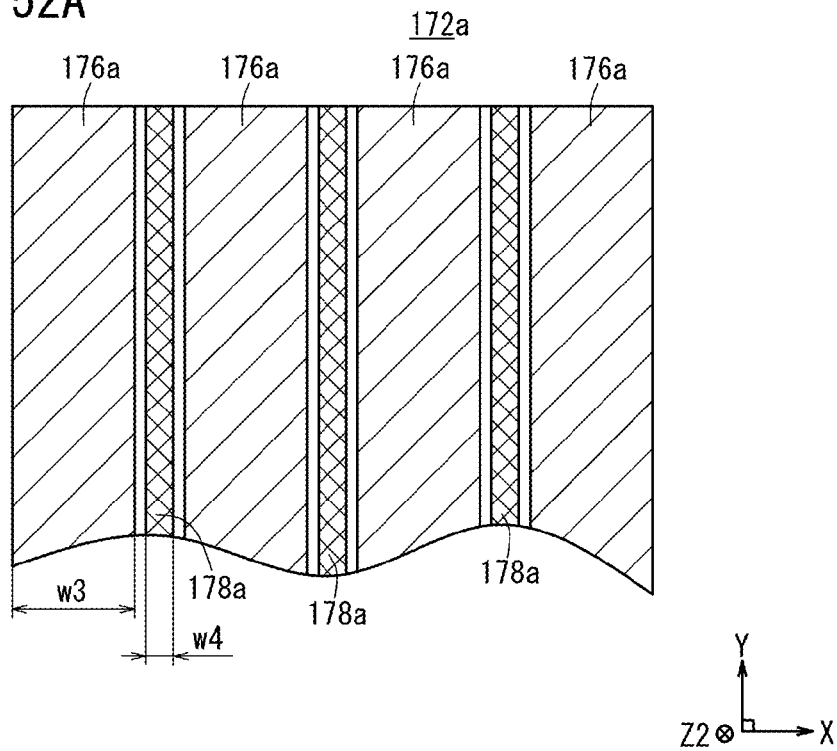
FIG. 52A is a partially enlarged plan view of a first sensor part shown in FIG. 51.

As shown in FIG. 51 and FIG. 52A, the upper side panel 164 includes a first transparent substrate 170a made from a flexible material (e.g., resin), and a first sensor part 172a and a first terminal wire portion 174a formed on one main surface (a side in the direction of the arrow Z2) thereof. The first sensor part 172a includes at least two first conductive patterns 176a formed by plural thin metal wires 16, respectively. The band-shaped first conductive patterns 176a extend respectively in the direction of the arrow Y and are arranged at equal intervals in the direction of the arrow X. Each of the first conductive patterns 176a is connected electrically to the FPC 168 through the first terminal wire portion 174a. Band-shaped first dummy patterns 178a are disposed respectively between each of the first conductive patterns 176a.

Figure 52B:
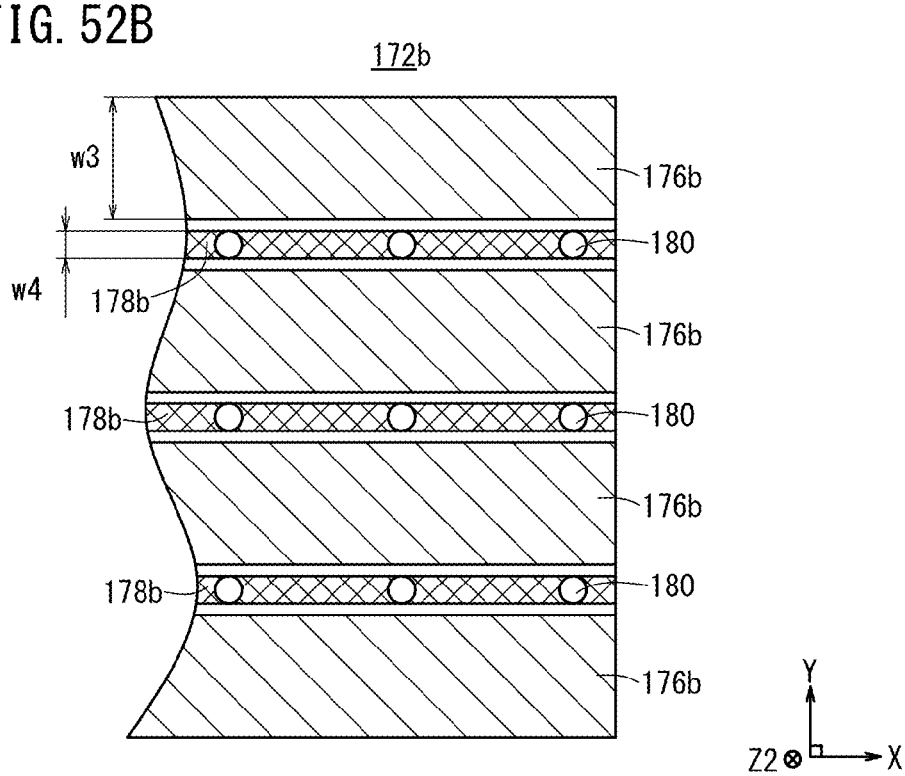
FIG. 52B is a partially enlarged plan view of a second sensor part shown in FIG. 51.

As shown in FIG. 51 and FIG. 52B, the lower side panel 162 includes a second transparent substrate 170b made from a highly rigid material (e.g., glass), a second sensor part 172b and a second terminal wire portion 174b formed on one main surface (a side in the direction of the arrow Z1) thereof, and a plurality of dot spacers 180 arranged on the second sensor part 172b at predetermined intervals. The second sensor part 172b includes at least two second conductive patterns 176b formed by plural thin metal wires 16, respectively. The band-shaped second conductive patterns 176b extend respectively in the direction of the arrow X and are arranged at equal intervals in the direction of the arrow Y. Each of the second conductive patterns 176b is connected electrically to the FPC 168 through the second terminal wire portion 174b. Band-shaped second dummy patterns 178b are disposed respectively between each of the second conductive patterns 176b.

Figure 53:
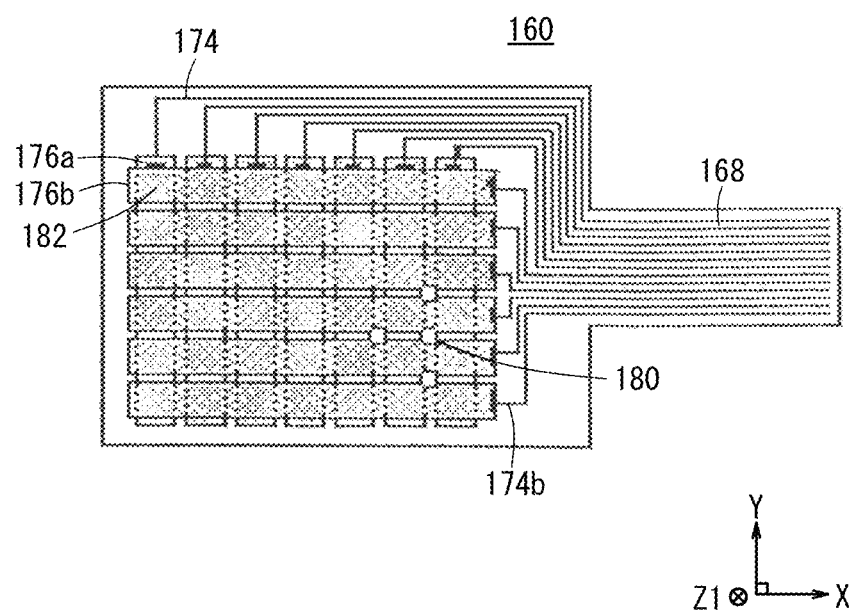
FIG. 53 is a front view with partial omission of the touch panel shown in FIG. 51.

As shown in FIG. 51 and FIG. 53, in a state in which the upper side panel 164 and the lower side panel 162 are bonded together, the first sensor part 172a and the second sensor part 172b are separated by a predetermined distance via respective dot spacers 180. In addition, each of the first conductive patterns 176a and each of the second conductive patterns 176b intersect one another respectively, whereby substantially square-shaped overlapping areas 182 are formed in plurality. Furthermore, the dot spacers 180 are disposed respectively at positions where each of the first dummy patterns 178a and each of the second dummy patterns 178b intersect one another respectively. More specifically, one dot spacer 180 is arranged at each corner of the overlapping areas 182.

Next, operations of the touch panel 160 will be described. Pressure is applied from the input surface (the main surface on the side of the arrow Z1 of the first transparent substrate 170a), whereby the flexible first transparent substrate 170a is bent in a concave shape. Upon being bent in this manner, at a region that corresponds to one overlapping area 182 surrounded by the four dot spacers 180 nearest to the pressing position, a portion of the first conductive pattern 176a is placed in contact with a portion of the second conductive pattern 176b. Under this condition, by application of voltage via the FPC 168, a potential gradient is generated between the upper side panel 164 and the lower side panel 162. More specifically, through the FPC 168, by reading the voltage from the upper side panel 164, an (x-axis) input position in the direction of the arrow X can be detected. Similarly, by reading the voltage from the lower side panel 162, a (y-axis) input position in the direction of the arrow Y can be detected.

In this case, the width w3 of the first conductive pattern 176a (or the second conductive pattern 176b) may be set in various ways corresponding to the resolution, and for example, preferably, is set on the order of 1 to 5 mm. The width w4 of the first dummy pattern 178a (or the second dummy pattern 178b) preferably is within a range of 50-200 μm in view of the insulative properties with respect to the first conductive pattern 176a (or the second conductive pattern 176b) and the sensitivity of the touch panel 160.

If portions of the regions shown in single hatching (first conductive patterns 176a and second conductive pattern 176b) and the regions shown in double hatching (first dummy patterns 178a and second dummy patterns 178b) shown in FIG. 52A and FIG. 52B are expanded, the structure of the mesh pattern 20 shown in FIG. 1 is made apparent. More specifically, under a condition in which the upper side panel 164 and the lower side panel 162 are superimposed, a wiring pattern preferably is determined such that suppression of moiré phenomenon and reduction of noise graininess can be achieved at the same time.

[Mesh Pattern Taking into Account Shape of Overlapping Structural Pattern]

A conductive sheet 230 may include not only the isotropic mesh pattern 20, but may also include an anisotropic (non-isotropic) mesh pattern 232.

Figure 54:
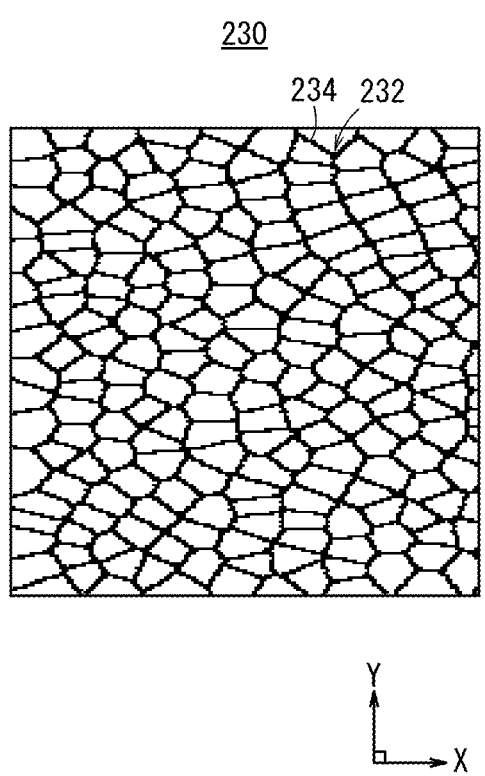
FIG. 54 is a schematic plan view of a conductive sheet according to another embodiment.

FIG. 54 is a partially enlarged plan view of a conductive sheet 230 having a mesh pattern 232, shapes of which are optimized under a condition of being superimposed with a black matrix 34 (see FIG. 3).

As can be understood from FIG. 1 and FIG. 8, the mesh shapes 234 (respective openings 18) of the mesh pattern 232 have an overall horizontal elongate shape compared with the mesh shapes 22 of the mesh pattern 20. The basis for the shapes thereof is estimated as described below.

As shown in FIG. 3, by disposing the red color sub-pixels 32r, the green color sub-pixels 32g, and the blue color sub-pixels 32b in the direction of the arrow X, single pixels 32 are defined respectively in regions of ⅓, whereby the degree of noise graininess of high spatial frequency components tends to increase. On the other hand, in the direction of the arrow Y, spatial frequency components only exist that correspond to the arrangement period of the black matrix 34, and spatial frequency components apart therefrom do not exist. Thus, the form of the mesh pattern 232 (each of the mesh shapes 234) is determined such that visibility of the arrangement period is reduced. More specifically, the spacing interval between the respective wires that extend in the direction of the arrow Y is determined so as to be narrow as much as possible, compared with the direction of the arrow X, and so that the wires are arranged regularly between the black matrix 34.

In the foregoing manner, it is possible to optimize the mesh pattern 232 while taking into consideration the form of a structural pattern that includes the black matrix 34. Stated otherwise, sensation of noise graininess is reduced in observing under conditions of actual use, and the visibility of objects to be observed can be improved significantly. Such features are particularly effective in the case that the actual conditions of use of the conductive sheet 230 are known beforehand.

[Regular Mesh Pattern]

The conductive sheet 240 may include not only the random mesh pattern 20, but may also include a regularly arranged mesh pattern 242. In this case as well, similar to the case of the random mesh pattern, the first effect (see FIGS. 16A to 17B) or the second effect (see FIGS. 18A to 19C) of enhancing visibility can be obtained.

As shown in FIG. 55, the first conductive portion 14a (or the second conductive portion 14b) includes a mesh pattern 242 formed such that plural thin metal wires 16q, which extend in the direction of the arrow q and are arrayed at a pitch Ps in the direction of the arrow r, and plural thin metal wires 16r, which extend in the direction of the arrow r and are arrayed at a pitch Ps in the direction of the arrow q, intersect one another respectively. In this case, the direction of the arrow q is inclined at an angle greater than or equal to +30° and less than or equal to +60° with respect to a reference direction (horizontal direction), and the direction of the arrow r is inclined at an angle between −30° and −60°. Consequently, any one of the mesh shapes 244 of the mesh pattern 242, i.e., the combined shape of one opening 18 and four thin metal wires 16 that surround the one opening 18 is of a diamond shape with vertex angles which are greater than or equal to 60° and less than or equal to 120°. The pitch Ps can be selected from values greater than or equal to 100 μm and less than or equal to 400 μm.

In the foregoing manner, even in the case of the mesh pattern 242 in which the same mesh shapes 244 are arranged in a regular manner, advantages and effects which are the same as those of the above-described embodiment can be obtained.

[Manufacturing Method Using Silver Halide Photosensitive Material]

Next, in the conductive sheet 10 according to the present embodiment, a method will be discussed focusing on use of a silver halide photosensitive material as a particularly preferred form thereof.

The method of manufacturing the conductive sheet 10 according to the present embodiment includes the following three processes, depending on the photosensitive materials and development treatments.

(1) A process comprising subjecting a photosensitive black-and-white silver halide material free of physical development nuclei to a chemical or thermal development, to form the metallic silver portions on the photosensitive material.

(2) A process comprising subjecting a photosensitive black-and-white silver halide material having a silver halide emulsion layer containing physical development nuclei to a solution physical development process, to thereby form the metallic silver portions on the photosensitive material.

(3) A process comprising subjecting a stack of a photosensitive black-and-white silver halide material free of physical development nuclei and an image-receiving sheet having a non-photosensitive layer containing physical development nuclei to a diffusion transfer development, to form the metallic silver portions on the non-photosensitive image-receiving sheet.

In process (1), an integral black-and-white development procedure is used to form a translucent conductive film on the photosensitive material. The resulting silver is chemically or thermally developed silver containing a high-specific surface area filament, and thereby exhibits a high activity in the following plating or physical development treatment.

In process (2), silver halide particles are melted around the physical development nuclei and deposited on the nuclei in exposed areas, to form a translucent conductive film, such as a light-transmitting conductive film, on the photosensitive material. Also in this process, an integral black-and-white development procedure is used. Although high activity can be achieved since the silver halide is deposited on the physical development nuclei during development, the developed silver has a spherical shape with a small specific surface.

In process (3), silver halide particles are melted in unexposed areas, and diffused and deposited on the development nuclei of an image-receiving sheet, to thereby form a translucent conductive film, such as a light-transmitting conductive film, on the sheet. In this process, a so-called separation-type procedure is used, and the image-receiving sheet is peeled off from the photosensitive material.

A negative or reversal development treatment can be used in any of the foregoing processes. In the diffusion transfer development, the negative development treatment can be carried out using an auto-positive photosensitive material.

The chemical development, thermal development, solution physical development, and diffusion transfer development have the meanings generally known in the art, and are explained in common photographic chemistry texts such as Shinichi Kikuchi, "Shashin Kagaku (Photographic Chemistry)", Kyoritsu Shuppan Co., Ltd., 1955, and C. E. K. Mees, "The Theory of Photographic Processes, 4th ed.", McMillan, 1977. A liquid treatment is generally used in the present invention, and also a thermal development treatment can be utilized. For example, the techniques described in Japanese Laid-Open Patent Publication Nos. 2004-184693, 2004-334077, and 2005-010752, and Japanese Patent Application Nos. 2004-244080 and 2004-085655 can be used in the present invention.

An explanation shall now be given in relation to the structure of each layer of the conductive sheet 10 according to the present embodiment.

[Transparent Substrate 12]

Plastic films, plastic plates, glass plates or the like can be given as examples of materials to be used as the transparent substrate 12.

As materials for the aforementioned plastic film and plastic plate, there can be used, for example, polyesters such as polyethylene terephthalate (PET), polyethylene naphthalate (PEN), etc., and Polymethyl Methacrylate (PMMA), Polypropylene (PP), Polystyrene (PS), Triacetyl Cellulose (TAC), etc.

As materials for the transparent substrate 12, preferably, plastic films or plastic plates having a melting point less than or equal to about 290° C. are used. In particular, PET is preferred from the standpoints of workability and optical transparency.

[Silver Halide Emulsion Layer]

The silver halide emulsion layer that forms the thin metal wires 16 of the first stacked portion 28a and the second stacked portion 28b includes additives such as solvents and dyes, etc., in addition to silver salt and a binder.

<1. Silver Salt>

The silver salt used in the present embodiment may include an inorganic silver salt such as a silver halide and an organic silver salt such as silver acetate or the like. In the present embodiment, preferably, silver halide is used, which has excellent light sensitive properties.

The coated silver amount (silver salt coating amount) of the silver halide emulsion layer, in terms of the silver therein, preferably is 1-30 g/m$^2$, more preferably is 1-25 g/m$^2$, and still more preferably, is 5-20 g/m$^2$. By keeping the silver coating amount within the above-described ranges, desirable surface resistivity can be obtained in the case of the conductive sheet 10.

<2. Binder>

As examples of binders that are used in the present embodiment, there may be used, for example, gelatins, polyvinyl alcohols (PVA), polyvinyl pyrolidones (PVP), polysaccharides such as starches, celluloses and derivatives thereof, polyethylene oxides, polyvinylamines, chitosans, polylysines, polyacrylic acids, polyalginic acids, polyhyaluronic acids, and carboxycelluloses, etc. Such binders exhibit neutral, anionic, or cationic properties depending on the ionic properties of the functional group.

The contained weight of the binder that is included in the silver salt emulsion layer of the present embodiment is not particularly limited, but can be determined suitably from within a range that exhibits properties of good dispersibility and adhesion. The contained weight of the binder in the silver salt emulsion layer preferably is ¼ or greater, and more preferably, is ½ or greater in terms of the silver/binder volume ratio. The silver to binder (silver/binder) volume ratio is preferably 100/1 or less, and more preferably, is 50/1 or less. Further, the silver to binder volume ratio is preferably 1/1 to 4/1, and most preferably, is 1/1 to 3/1. By maintaining the silver to binder volume ratio of the silver salt emulsion layer within such ranges, even in the event that the amount of the silver coating is adjusted, variance in resistance is suppressed, and a conductive sheet 10 having uniform surface resistivity can be obtained. Incidentally, the silver to binder volume ratio can be determined by converting the silver halide amount/binder amount of the raw materials (weight ratio) into a silver amount/binder amount (weight ratio), and furthermore, by converting the silver amount/binder amount (weight ratio) into a silver amount/binder amount (volume ratio).

<3. Solvents>

Solvents used in forming the silver salt emulsion layer are not particularly limited. The following solvents can be cited as examples: water, organic solvents (e.g., alcohols such as methanol, ketones such as acetone, amides such as formamide, sulfoxides such as dimethyl sulfoxide, esters such as ethyl acetate, and ethers), ionic liquids, and mixtures of such solvents.

<4. Other Additive Agents>

In relation to various additive agents used in the present embodiment, the additive agents are not limited, and preferably, known types of such additive agents can be used.

[First Protective Layer 26a, Second Protective Layer 26b]

As the first protective layer 26a and the second protective layer 26b, similar to the transparent substrate 12, plastic films, plastic plates, glass plates or the like can be given as examples of materials to be used therefor. For example, PET, PEN, PMMA, PP, PS, TAC, etc., can be used.

The thickness of the first protective layer 26a and the second protective layer 26b is not particularly limited, and can easily be selected responsive to aims of the invention. For example, preferably, the thickness is 5-100 μm, more preferably, is 8-50 μm, and still more preferably, is 10-30 μm.

Next, respective steps of a method of manufacturing the conductive sheet 10 will be described.

[Exposure]

In the present embodiment, although a case has been described in which the first conductive portion 14a and the second conductive portion 14b are implemented by means of a printing technique, apart from using a printing technique, the first conductive portion 14a and the second conductive portion 14b may be formed by exposure, development, etc. More specifically, exposure is carried out on the photosensitive material including the silver salt-containing layer, or on the photosensitive material on which the photolithographic photopolymer is coated, which is disposed on the transparent substrate 12. Exposure can be carried out by use of electromagnetic waves. For example, light such as visible light or ultraviolet light, or radiation such as X-rays or the like may be used to generate electromagnetic waves. Exposure may also be carried out using a light source having a wavelength distribution or a specific wavelength.

[Development Treatment]

In the present embodiment, after exposure of the emulsion layer, the emulsion layer is further subjected to a development treatment. The development treatment can be performed using common development treatment technologies for silver halide photographic films, photographic papers, printing plate films, emulsion masks for photomasking, and the like.

The development process according to the present invention can include a fixing process, which is carried out with the aim of stabilizing by removing unexposed portions of the silver salt. The fixing process in the present invention can utilize a fixing technique that makes use of a silver halide photographic film, photographic paper, a printing plate film, an emulsion mask for a photomask, or the like.

Preferably, at least one of a water washing process and a stabilization treatment is carried out on the photosensitive material on which the development and fixing processes have been implemented.

The amount by mass of the metallic silver portion included in the exposed portions after the development process preferably is of a content ratio of 50 percent by mass or greater, and more preferably is 80 percent by mass or greater, with respect to the amount by mass of the silver contained in the exposed portion prior to being exposed. If the amount by mass of the silver contained in the exposed portion is 50 percent by mass or greater with respect to the amount by mass of the silver contained in the exposed portion prior to being exposed, then a high degree of conductivity can be obtained.

The conductive sheet 10 is obtained by the above steps. The conductive sheet 10 may further be subjected to a calendaring treatment after the development treatment. By means of a calendaring treatment, adjustment to a desired surface resistivity can be achieved. The surface resistivity of the resultant conductive sheet 10 preferably is within a range of 0.1-300 ohm/sq.

The surface resistivity differs depending on how the conductive sheet 10 is used. For example, in the case of being used as a touch panel, the surface resistivity preferably is 1-70 ohm/sq., and more preferably, is 5-50 ohm/sq., and still more preferably, is 5-30 ohm/sq. Further, in the case of being used as an electromagnetic-wave shield, the surface resistivity preferably is less than or equal to 10 ohm/sq., and more preferably, is 0.1-3 ohm/sq.

[Physical Development and Plating Treatments]

In the present embodiment, in order to improve the conductivity of the metallic silver portion formed by the above exposure and development treatments, conductive metal particles may be deposited on the metallic silver portion by at least one of a physical development treatment and a plating treatment. In the present invention, the conductive metal particles may be deposited on the metallic silver portion by only one of the physical development and plating treatments, or by a combination of such treatments. The metallic silver portion, which is subjected to at least one of a physical development treatment and a plating treatment in this manner, may also be referred to as a "conductive metal portion", as well as the metallic silver portion itself.

In the present embodiment, "physical development" refers to a process in which metal ions such as silver ions are reduced by a reducing agent, whereby metal particles are deposited on a metal or metal compound core. Such physical development has been used in the fields of instant B&W film, instant slide film, printing plate production, etc., and similar technologies can be used in the present invention. Physical development may be carried out at the same time as the above development treatment following exposure, or may be carried out separately after completion of the development treatment.

In the present embodiment, the plating treatment may contain non-electrolytic plating (such as chemical reduction plating or displacement plating), electrolytic plating, or a combination of both non-electrolytic plating and electrolytic plating. Known non-electrolytic plating technologies, for example, technologies used in printed circuit boards, etc., may be used in the present embodiment. Preferably, electroless copper plating is used in the case of such non-electrolytic plating.

With the manufacturing method for a conductive sheet 10 according to the present invention, the plating step, etc., are not indispensable. In the present manufacturing method, a desired surface resistivity can be obtained by adjusting the coated silver amount of the silver salt emulsion layer, and the silver/binder volumetric ratio.

[Oxidation Treatment]

In the present embodiment, the metallic silver portion following the development treatment and the conductive metal portion, which is formed by at least one of the physical development treatment and the plating treatment, preferably are subjected to an oxidation treatment. For example, by the oxidation treatment, a small amount of metal deposited on the light-transmitting portion can be removed, so that the transmittance of the light-transmitting portion can be increased to roughly 100%.

[Hardening Treatment Following Development Treatment]

It is preferred, after the silver salt emulsion layer has been developed, for the resultant product to be immersed in a hardener and subjected to a hardening treatment. Examples of suitable hardeners, for example, can include dialdehyde type hardeners such as glutaraldehyde, adipaldehyde, and 2,3-dihydroxy-1,4-dioxane, and boric acid type hardeners, as described in Japanese Laid-Open Patent Publication No. 02-141279.

In the conductive sheet 10 according to the present embodiment, a layer that functions as an antireflection layer, a hard coat layer, or the like, may also be provided.

[Calendaring Treatment]

A calendaring treatment may be carried out to effect smoothing on the developed metallic silver portion. As a result, conductivity of the metallic silver portion can be markedly increased. The calendaring treatment can be performed using a calendar roll, wherein such a calendar roll typically is made up from a pair of rolls.

As rolls that are used in the calendaring process, plastic rolls of epoxy, polyimide, polyamide, polyimide amide, etc., or metallic rolls are used. In particular, in the case of using emulsion layers on both surfaces, preferably, processing is carried out by a pair of metallic rolls. In the case of having an emulsion layer on one side only, from the standpoint of preventing wrinkles, a metallic roll and a plastic roll, can be used together in combination. The upper limit value of linear pressure applied by the rolls is 1960 N/cm (200 kgf/cm, or 699.4 kgf/cm$^2$ if converted to surface pressure) or greater, and more preferably, is 2940 N/cm (300 kgf/cm, or 935.8 kgf/cm$^2$ if converted to surface pressure) or greater. The upper limit value of linear pressure is 6880 N/cm (700 kgf/cm) or less.

The applicable temperature at which the smoothing process represented by calendar rollers is carried out preferably lies within a range of 10° C. (without temperature adjustment) to 100° C., and more preferably, lies within a range of 10° C. (without temperature adjustment) to 50° C., although the applicable temperature range differs depending on the type of binder, or the image line density and shape of the metallic mesh pattern or the metallic wiring pattern.

[Laminating Process]

For protecting the first sensor part 60a and the second sensor part 60b, etc., a protective layer may be formed on the silver halide emulsion layer. Adhesiveness can be adjusted freely by disposing the first adhesive layer 24a (or the second adhesive layer 24b) between the protective layer and the silver halide emulsion layer.

Wet laminating adhesives, dry laminating adhesives, or hot melt adhesives, etc., may be used as suitable materials for the first adhesive layer 24a and the second adhesive layer 24b. In particular, the dry laminating adhesives are particularly preferred in light of their fast bonding speed and a variety of types of materials that can be bonded thereby. More specifically, as dry laminating adhesives, amino resin adhesives, phenol resin adhesives, chloroprene rubber adhesives, nitrile rubber adhesives, epoxy adhesives, urethane adhesives, and reactive acrylic adhesives, etc., can be used. Among such adhesives, OCA (Optical Clear Adhesive, Registered Trademark) manufactured by Sumitomo 3M, which is an acrylic-based low acid value adhesive, is preferred.

Concerning the drying conditions, a temperature environment of 30-150° C. for 1-30 minutes is preferred. A drying temperature of 50-120° C. is particularly preferred.

Further, instead of the aforementioned adhesive layer, interlayer adhesion can be regulated by surface treatment of at least one of the transparent substrate 12 and the protective layer. For enhancing adhesive strength with the silver halide emulsion layer, for example, a corona discharge treatment, a flame treatment, an ultraviolet irradiation treatment, a high frequency irradiation treatment, a glow discharge irradiation treatment, an active plasma irradiation treatment, and a laser beam irradiation treatment, etc., may be implemented.

In the present invention, the technologies of the following Japanese Laid-Open Patent Publications and PCT International Publication Numbers shown in Table 1 and Table 2 can appropriately be used in combination. In the following Tables 1 and 2, conventional notations such as "Japanese Laid-Open Patent Publication No.", "Publication No.", "Pamphlet No. WO", etc., have been omitted.

TABLE 1

| | | | | |
|---|---|---|---|---|
| 2004-221564 | 2004-221565 | 2007-200922 | 2006-352073 | 2007-129205 |
| 2007-235115 | 2007-207987 | 2006-012935 | 2006-010795 | 2006-228469 |
| 2006-332459 | 2009-21153 | 2007-226215 | 2006-261315 | 2007-072171 |
| 2007-102200 | 2006-228473 | 2006-269795 | 2006-269795 | 2006-324203 |
| 2006-228478 | 2006-228836 | 2007-009326 | 2006-336090 | 2006-336099 |
| 2006-348351 | 2007-270321 | 2007-270322 | 2007-201378 | 2007-335729 |
| 2007-134439 | 2007-149760 | 2007-208133 | 2007-178915 | 2007-334325 |
| 2007-310091 | 2007-116137 | 2007-088219 | 2007-207883 | 2007-013130 |
| 2005-302508 | 2008-218784 | 2008-227350 | 2008-227351 | 2008-244067 |
| 2008-267814 | 2008-270405 | 2008-277675 | 2008-277676 | 2008-282840 |
| 2008-283029 | 2008-288305 | 2008-288419 | 2008-300720 | 2008-300721 |
| 2009-4213 | 2009-10001 | 2009-16526 | 2009-21334 | 2009-26933 |
| 2008-147507 | 2008-159770 | 2008-159771 | 2008-171568 | 2008-198388 |
| 2008-218096 | 2008-218264 | 2008-224916 | 2008-235224 | 2008-235467 |
| 2008-241987 | 2008-251274 | 2008-251275 | 2008-252046 | 2008-277428 |

TABLE 2

| | | | | |
|---|---|---|---|---|
| 2006/001461 | 2006/088059 | 2006/098333 | 2006/098336 | 2006/098338 |
| 2006/098335 | 2006/098334 | 2007/001008 | | |

EXAMPLES

Examples of the present invention will be described more specifically below. Materials, amounts, ratios, treatment contents, treatment procedures, and the like, used in the examples may be appropriately changed without departing from the essential scope of the present invention. Therefore, the following specific examples should be considered in all respects as illustrative and not restrictive.

In the examples, in relation to conductive sheets 10 according to inventive examples 1 to 7, comparative examples 1 to 3, and reference examples 1 and 2, visibility (noise graininess) and rate of change in brightness were evaluated in a display device 40 incorporating the above conductive sheets 10.

Inventive Examples 1 to 7, Comparative Examples 1 to 3, Reference Examples 1 and 2

Photosensitive Silver Halide Material

An emulsion containing an aqueous medium, gelatin and silver iodobromochloride particles was prepared. The amount of gelatin was 10.0 g per 150 g of Ag in the aqueous medium. The silver iodobromochloride particles therein had an I content of 0.2 mol %, a Br content of 40 mol %, and an average spherical equivalent diameter of 0.1 μm.

$K_3Rh_2Br_9$ and $K_2IrCl_6$ were added to the emulsion at a concentration of $10^{-7}$ mol/mol-Ag in order to dope the silver bromide particles with Rh and Ir ions. $Na_2PdCl_4$ was further added to the emulsion, and the resultant emulsion was subjected to gold-sulfur sensitization using chlorauric acid and sodium thiosulfate. Thereafter, the emulsion and a gelatin hardening agent were applied to each of a transparent substrate (composed of polyethylene terephthalate (PET) having an index of refraction n0=1.64) such that the amount of applied silver was 10 g/m². The Ag/gelatin volume ratio was 2/1.

The PET support body had a width of 300 mm, and the emulsion was applied thereto at a width of 250 mm and a length of 20 m. Both end portions having a width of 30 mm were cut off from the PET support body in order to obtain a roll-shaped photosensitive silver halide material having a central coating width of 240 mm.

(Generation of Exposure Pattern)

Using the SA method as described in the present embodiment (see FIG. 37), output image data ImgOut were created representing the mesh pattern 20 (see FIG. 1) made up from the spread out polygonal mesh shapes 22.

The set conditions for the mesh pattern 20 were established such that the total transmittance was 93%, the thickness of the transparent substrate 12 was 20 μm, the width of the thin metal wires 16 was 20 μm, and the thickness of the thin metal wires 16 was 10 μm. The size of the planar region 100 was set to 5 mm both vertically and horizontally, and the image resolution was set to 3500 dpi (dots per inch). Initial positions of the seed points SD were determined randomly using a Mersenne Twister algorithm, and respective polygonal mesh shapes 22 were determined in accordance with a Voronoi diagram. Evaluation values EVP were calculated based on the L*, a*, b* color values of the image data Img.

In addition, according to the example of FIG. 42, the output image data ImgOut were arranged regularly to create an exposure pattern having a repeating shape.

First, the radio button 462b on the setting screen 460 of FIG. 36 was selected, and with "PRESENCE/ABSENCE OF MATRIX" being set to "ABSENCE", the output image data ImgOut was created. As a result, output image data ImgOut representing the form of the mesh pattern 20 shown in FIG. 21A was obtained.

On the other hand, conditions for the black matrix 34 were set such that the optical density was 4.5 D, the pixel 32 had a vertical size of 200 µm and also a horizontal size of 200 µm, and the vertical lattice width and the horizontal lattice width were both 20 µm.

Secondly, the radio button 462a on the setting screen 460 of FIG. 36 was selected, and with "PRESENCE/ABSENCE OF MATRIX" being set to "PRESENCE", the output image data ImgOut was created. As a result, output image data ImgOut representing the pattern of the mesh pattern 232 of FIG. 54 was obtained.

Next, as shown in FIGS. 47A and 47B, by cutting out the output image data ImgOut, a first exposure pattern made up from a region excluding the first region R1, and a second exposure pattern made up from the second image region R2 were created, respectively.

(Exposure)

Exposure was carried out respectively with respect to both surfaces of an A4 sized (210 mm×297 mm) transparent substrate 12. Exposure was performed through photomasks of the above-described first exposure pattern (corresponding to the first conductive portion 14a) and second exposure pattern (corresponding to the second conductive portion 14b), using a high-pressure mercury lamp as a parallel light source. For manufacturing the conductive sheets 10 of inventive examples 1 to 6 and reference examples 1 and 2, exposure patterns corresponding to the mesh pattern 20 were used, respectively. Further, for manufacturing the conductive sheet 10 of inventive example 7, and an exposure pattern corresponding to the mesh pattern 232 (see FIG. 54) was used. Furthermore, for manufacturing conductive sheets according to comparative examples 1 to 3, exposure patterns corresponding to patterns PT1 to PT3 (see FIGS. 57A through 57C) were used, respectively.

(Developing Technique)

The following chemical compounds were included in 1 liter of the developing solution.

| | |
|---|---|
| Hydroquinone | 20 g |
| Sodium sulfite | 50 g |
| Potassium carbonate | 40 g |
| Ethylenediaminetetraacetic acid | 2 g |
| Potassium bromide | 3 g |
| Polyethylene glycol 2000 | 1 g |
| Potassium hydroxide | 4 g |
| pH | controlled at 10.3 |

The following chemical compounds were included in 1 liter of the fixing solution.

| | |
|---|---|
| Ammonium thiosulfate solution (75%) | 300 ml |
| Ammonium sulfite monohydrate | 25 g |
| 1,3-Diaminopanetetraacetic acid | 8 g |
| Acetic acid | 5 g |
| Aqueous ammonia (27%) | 1 g |
| pH | controlled at 6.2 |

Using the treatment agents as listed above, a development treatment was conducted on the photosensitive material following exposure thereof using an automatic development machine FG-710PTS (manufactured by FUJIFILM Corporation) under the following development conditions; development: 30 seconds at 35° C., fixation: 23 seconds at 34° C., water washing: 20 seconds under running water (5 L/min).

(Lamination Process)

The first protective layer 26a and the second protective layer 26b, which are made up from the same material, were attached, respectively, on both surfaces of the photosensitive material following development thereof: As described later, for each of the samples of the conductive sheet 10, a protective film having a different index of refraction n1 was used. Further, a commercially available adhesive tape (NSS50-1310, thickness 50 µm, manufactured by New Tac Kasei Co., Ltd.) was used as the first adhesive layer 24a and the second adhesive layer 24b (see FIG. 2). In addition, after attachment of the first protective layer 26a and the second protective layer 26b, in order to prevent the occurrence of air bubbles, an autoclave treatment was carried out for 20 minutes at 0.5 atm. in a 40° C. environment.

For convenience of evaluation, the first protective layer 26a with a portion of the sheet thereof cut out was used. More specifically, a setup was provided in which a difference was observable one time between a case (index of refraction n1) in which the first protective layer 26a was formed, and a case (an air layer having an index of refraction of 1.00) in which the first protective layer 26a was not formed. In the following descriptions, a displayed location corresponding to the cutout portion of the first protective layer 26a is referred to an A region, while the remaining displayed location is referred to as a B region.

Inventive Example 1

A conductive sheet 10 according to the first inventive example was manufactured using polychlorotrifluoroethylene (PCTFE) with an index of refraction n1=1.42 as the first protective layer 26a. In this case, the relative index of refraction nr1 was nr1=(1.42/1.64)=0.86.

Inventive Example 2, Comparative Examples 1 to 3

A conductive sheet 10 according to the second inventive example was manufactured using polymethyl methacrylate (PMMA) with an index of refraction n1=1.50 as the first protective layer 26a. In this case, the relative index of refraction nr1 was nr1=(1.50/1.64)=0.91.

Further, concerning comparative example 1 corresponding to the pattern PT1 (see FIG. 57A), comparative example 2 corresponding to the pattern PT2 (see FIG. 57B), and comparative example 3 corresponding to the pattern PT3 (see FIG. 57C), respective samples were made by covering the aforementioned patterns with polymethyl methacrylate.

Inventive Example 3, Inventive Example 7

Conductive sheets 10 according to the third and seventh inventive examples were manufactured using polystyrene (PS) with an index of refraction n1=1.60 as the first protective layer 26a. In this case, the relative index of refraction nr1 was nr1=(1.60/1.64)=0.97.

Inventive Example 4

A conductive sheet 10 according to the fourth inventive example was manufactured using polythiourethane (PTU)

with an index of refraction n1=1.70 as the first protective layer 26a. In this case, the relative index of refraction nr1 was nr1=(1.70/1.64)=1.03.

Inventive Example 5

A conductive sheet 10 according to the fifth inventive example was manufactured using glass with a high index of refraction n1=1.78 as the first protective layer 26a. In this case, the relative index of refraction nr1 was nr1=(1.78/1.64)=1.08.

Inventive Example 6

A conductive sheet 10 according to the sixth inventive example was manufactured using glass with an ultrahigh index of refraction n1=1.90 as the first protective layer 26a. In this case, the relative index of refraction nr1 was nr1=(1.90/1.64)=1.15.

Reference Example 1

A conductive sheet according to a first reference example was manufactured using tetrafluoroethylene (FEP) with an index of refraction n1=1.34 as a first protective layer. In this case, the relative index of refraction nr1 was nr1=(1.34/1.64)=0.81.

Reference Example 2

A conductive sheet according to a second reference example was manufactured using glass with an ultrahigh index of refraction n1=1.98 as a first protective layer. In this case, the relative index of refraction nr1 was nr1=(1.98/1.64)=1.20.

[Evaluation]

The samples according to Inventive Examples 1 to 7, Comparative Examples 1 to 3, and Reference Examples 1 and 2 were bonded respectively on the display screen of the display unit 30. As the display unit 30, a commercially available color liquid crystal display (screen size: 11.6 type, 1366×768 dots, vertical and horizontal pixel pitches: both 192 μm) was used.

(Measurement of Surface Resistivity)

To evaluate uniformity in surface resistivity, a surface resistivity of each of the samples of Inventive Example 2 and Comparative Examples 1 to 3 was measured at ten arbitrary sites using a LORESTA GP (Model MCP-T610) inline 4-pin type probe (ASP), manufactured by Dia Instruments Co., Ltd., to obtain an average value of the surface resistivities.

(Noise Graininess)

Under a condition in which the display unit 30 was controlled to display a white color (maximum brightness), three researchers carried out sensory evaluations, respectively, of their sensations to graininess (sensation of image roughness). In this evaluation, sensation of noise of brightness due to the mesh shapes 22, and sensation of noise in colors due to the structure of the sub-pixels were quantified in a comprehensive manner. The observation distance from the display screen was set at 300 mm, and the interior illumination was set at 300 lx, respectively. Three samples were used for each level.

In the present sensory evaluation, comparative observations were performed with respect to visibility results of the A region (a display area where the first protective layer 26a is not formed). More specifically, with respect to the A region, if the sensation of noise graininess of the B region was significantly improved, 5 points were given; if improved, 4 points were given; if unchanged, 3 points were given; if made worse, 2 points were given; and if made significantly worse, 1 point was given, respectively. In addition, the scores given by the respective researchers were averaged to provide an evaluation value of noise graininess.

(Rate of Change in Luminance)

Luminance of the display screen was measured under a condition in which the display unit 30 was controlled to display a white color (maximum brightness). To perform such measurements, an LS-100 Luminance Meter (made by Konica Minolta) was used. The measurement distance from the display screen was set at 300 mm, the measurement angle was set at 2°, and the interior illumination was set at less than or equal to 1 lx, respectively.

With the luminance of the A region being represented by La [cd/m$^2$] and the luminance of the B region being represented by Lb [cd/m$^2$], the rate of change in luminance (units: %) was calculated as 100×(Lb−La)/La. The measurement position inside the region B was set in proximity to a boundary with the region A, taking into consideration in-plane uniformity.

[Results]

(Measurement of Surface Resistivity)

In Inventive Example 2 as well as Comparative Examples 1 to 3, the surface resistivity was of a sufficiently practical level to function as the transparent electrodes, and translucency also was good. In particular, Inventive Example 2 (conductive sheet 10 according to the present invention) exhibited the smallest variation in surface resistivity.

(Noise Graininess)

In the following Table 3, results are shown of sensory evaluations, and more specifically, of evaluation values rounded to one decimal place, in relation to Inventive Examples 1 to 6 and Reference Examples 1 and 2.

TABLE 3

|  | Refractivity Index n1 | Relative Refractivity Index nr1 | Evaluation Value (average) |
| --- | --- | --- | --- |
| Reference Example 1 | 1.34 | 0.81 | 3.6 |
| Inventive Example 1 | 1.42 | 0.86 | 4.2 |
| Inventive Example 2 | 1.50 | 0.91 | 4.6 |
| Inventive Example 3 | 1.60 | 0.97 | 4.3 |
| Inventive Example 4 | 1.70 | 1.03 | 4.4 |
| Inventive Example 5 | 1.78 | 1.08 | 4.6 |
| Inventive Example 6 | 1.90 | 1.15 | 4.2 |
| Reference Example 2 | 1.98 | 1.20 | 3.7 |

[1] In relation to visibility of patterns having different shapes, high evaluation results were obtained in order of Inventive Example 2, Comparative Example 3, Comparative Example 1, and Comparative Example 2. This order corresponds to an increasing order of the areas formed by peaks of the power spectra shown in FIG. 23. In particular, it was confirmed that, in Inventive Example 2 (conductive sheet 10 according to the present invention), noise graininess was less conspicuous.

[2] In relation to visibility of patterns of different isotropy, sensation to noise was not evident, levels enabling sufficient practicality as a transparent electrode, and good translucency were exhibited in Inventive Examples 3 and 7. In particular, in the case of Inventive Example 7, sensation to noise was confirmed to be less conspicuous than Inventive Example 3.

Furthermore, using a transparent plate instead of a liquid crystal panel, illumination through backlighting was observed, and the same visual evaluation was performed. In the evaluation, sensation to noise was confirmed to be less conspicuous in Inventive Example 3 than in Inventive Example 7. More specifically, the evaluation results verified that the patterns of mesh patterns 20, 232 were optimized depending on visual aspects of the conductive sheet 10, more specifically, depending on the presence or absence of the black matrix 34 or color filters of the red sub-pixels 32r, etc.

Figure 56:
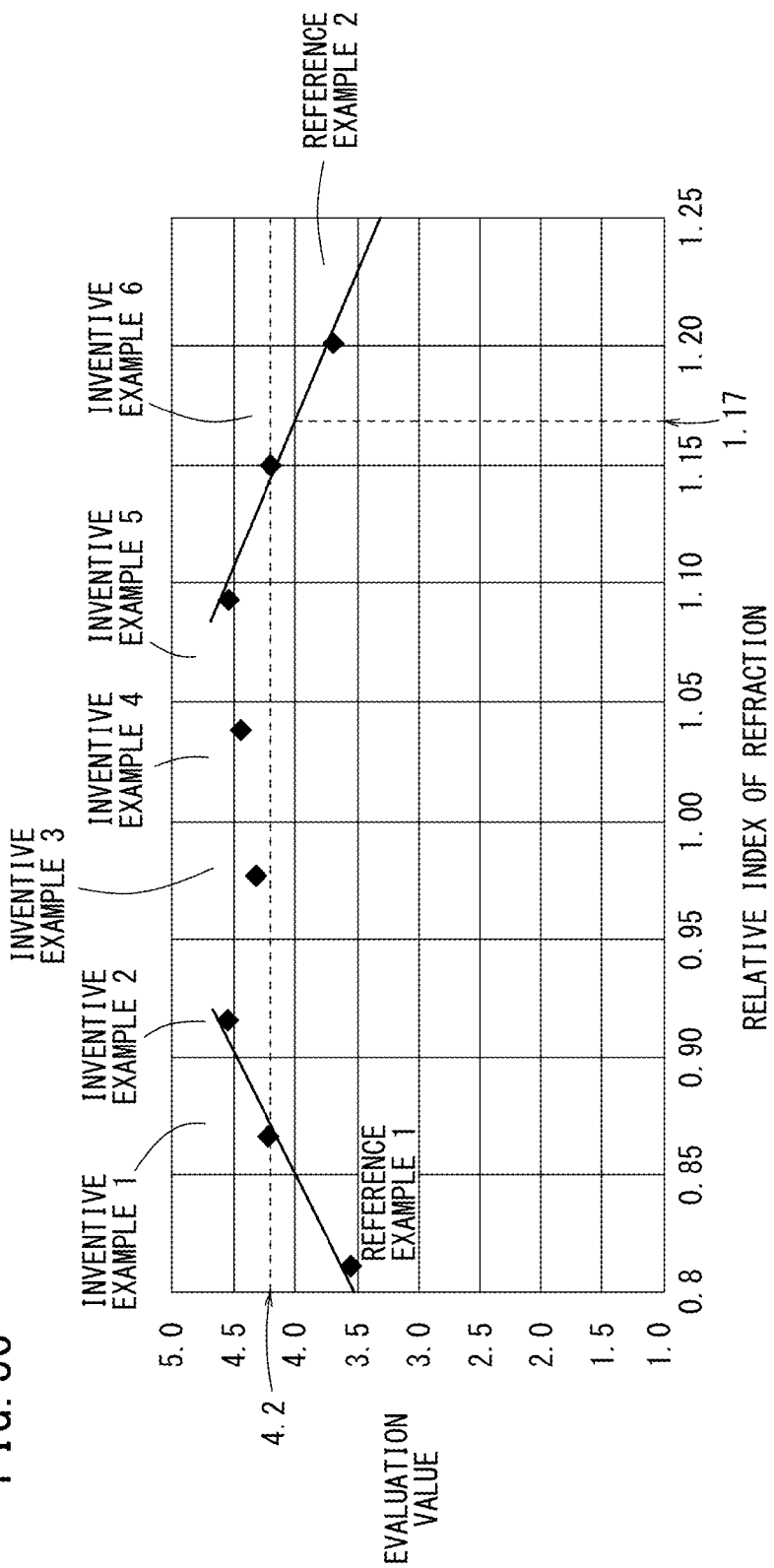
FIG. 56 is an explanatory diagram showing results of a sensory evaluation performed in relation to the present embodiment.

[3] As shown in FIG. 56 and Table 3, in any of Inventive Examples 1 to 6 and reference examples 1 and 2, the evaluation values exceeded 3, and a reduction in noise graininess was obtained by eliminating the air layer. Among these results, in any of Inventive Examples 1 to 6, the evaluation values exceeded 4, and compared to Inventive Examples 1 and 2, more significant effects were observed.

In FIG. 56, a degree of change in the evaluation value is large at three points plotted on each of both ends of the figure, and linear approximation was performed on the three points on each end in the figure. According to such approximation curves, if the relative index of refraction nr1 roughly satisfies the inequality $0.85 \leq nr1 \leq 1.17$, favorable results are exhibited since the evaluation value is equal to or greater than 4.0. In addition, in the case that the evaluation value is equal to or greater than 4.2, and more specifically, if the relative index of refraction nr1 satisfies the inequality $0.86 \leq nr1 \leq 1.15$, noise graininess can be suppressed.

(Rate of Change in Luminance)

In the following Table 4, in any of Inventive Examples 1 to 6 and Reference Examples 1 and 2, the rate of change in luminance was positive, and luminance of the display screen was enhanced by eliminating the air layer (air gap).

TABLE 4

|  | Rate of Change in Luminance (%) |
| --- | --- |
| Reference Example 1 | 15.1 |
| Inventive Example 1 | 18.9 |
| Inventive Example 2 | 21.7 |
| Inventive Example 3 | 21.9 |
| Inventive Example 4 | 21.2 |
| Inventive Example 5 | 20.0 |
| Inventive Example 6 | 16.5 |
| Reference Example 2 | 14.1 |

Among these results, in any of Inventive Examples 2 to 5, the rate of change in luminance exceeded 20%, and compared to Inventive Examples 1 and 6, the difference was of a degree that could be perceived visually. More specifically, if the relative index of refraction nr1 satisfied the inequality $0.91 \leq nr1 \leq 1.08$, results were obtained capable of further enhancing display brightness.

[Supplemental Explanations]

Other than the above-described Inventive Examples, the following findings were obtained based on results of similar evaluations that were performed while changing the production conditions of the conductive sheet 10 in various ways.

(1) The material of the transparent substrate 12 is not limited to PET, and in a range that satisfies the above-described relationship of the relative indices of refraction nr1 and nr2, the same experimental results were obtained regardless of the material. Further, if the second protective layer 26b and the first protective layer 26a are made of different materials, similar results are obtained in a range that satisfies the above-described relationship.

(2) By making any one of the relative indices of refraction nr1, nr2 greater than or equal to 0.86 and less than or equal to 1.15, an effect was obtained in which the sensation of noise graininess was reduced. Further, by making both of the relative indices of refraction nr1, nr2 greater than or equal to 0.86 and less than or equal to 1.15, a significantly reduced effect was obtained.

(3) By making any one of the relative indices of refraction nr1, nr2 greater than or equal to 0.91 and less than or equal to 1.08, an effect was obtained in which the amount of light irradiated externally through the display screen, i.e., the brightness of the display, was enhanced. Further, by making both of the relative indices of refraction nr1, nr2 greater than or equal to 0.91 and less than or equal to 1.08, a significantly enhanced effect was obtained.

(4) Even if the conductive sheet 10 is arranged in a state of having the front and back thereof inverted, the same evaluation results described above were obtained.

The present invention is not limited to the embodiments described above, but various changes and modifications may be made thereto without departing from the scope of the invention.

For example, the pattern material is not limited to being a black matrix 34, and it goes without saying that, responsive to the various uses thereof, the present invention can be applied with respect to structural patterns of various shapes.

The invention claimed is:

1. A conductive sheet comprising:
a substrate;
a first conductive portion formed on one main surface of the substrate and made up from a plurality of thin metal wires that have a width being greater than or equal to 0.1 μm and less than or equal to 15 μm and are formed from a non-transparent material;
a first protective layer disposed on the one main surface in covering relation to the first conductive portion;
a second conductive portion formed on another main surface of the substrate and made up from a plurality of thin metal wires that have a width being greater than or equal to 0.1 μm and less than or equal to 15 μm and are formed from a non-transparent material;
a second protective layer disposed on the other main surface in covering relation to the second conductive portion;
a first adhesive layer disposed between the one main surface and the first protective layer; and
a second adhesive layer disposed between the another main surface and the second protective layer,
wherein at least one of a relative index of refraction of the substrate with respect to the first protective layer and a relative index of refraction of the substrate with respect to the second protective layer is 0.86 to 1.15,
wherein the first conductive portion comprises a mesh pattern in which different mesh shapes are arranged randomly in plan view,
wherein each of the mesh shapes is polygonal,
wherein a percentage of polygons having a number of vertices, an occurrence frequency of which is highest in a histogram of the number of vertices in the mesh shapes, is 40% to 70%.

2. The conductive sheet according to claim 1, wherein the first conductive portion comprises:
a plurality of first conductive patterns that extend in a first direction and are arranged in a second direction perpendicular to the first direction; and
a plurality of first dummy patterns disposed in interspatial portions between adjacent ones of the first conductive patterns, and which are insulated electrically from each of the first conductive patterns, wherein a wiring density of the first dummy patterns is equal to a wiring density of the first conductive patterns.

3. A touch panel comprising:
a conductive sheet comprising:
   a substrate;
   a first conductive portion formed on one main surface of the substrate and made up from a plurality of thin metal wires that have a width being greater than or equal to 0.1 μm and less than or equal to 15 μm and are formed from a non-transparent material;
   a first protective layer disposed on the one main surface in covering relation to the first conductive portion;
   a second conductive portion formed on another main surface of the substrate and made up from a plurality of thin metal wires that have a width being greater than or equal to 0.1 μm and less than or equal to 15 μm and are formed from a non-transparent material;
   a second protective layer disposed on the other main surface in covering relation to the second conductive portion;
   a first adhesive layer disposed between the one main surface and the first protective layer; and
   a second adhesive layer disposed between the another main surface and the second protective layer,
   wherein at least one of a relative index of refraction of the substrate with respect to the first protective layer and a relative index of refraction of the substrate with respect to the second protective layer is 0.86 to 1.15,
   wherein the first conductive portion comprises a mesh pattern in which different mesh shapes are arranged randomly in plan view,
   wherein each of the mesh shapes is polygonal,
   wherein the mesh pattern includes a repeating shape,
   wherein the first conductive portion comprises a plurality of first conductive patterns that extend in a first direction and are arranged in a second direction perpendicular to the first direction, and each of the first conductive patterns is inclined at a predetermined angle with respect to a direction in which the repeating shape is arranged;
a detection control unit for detecting a contact position or a proximity position from a side of the one main surface of the conductive sheet.

4. A display device comprising:
a conductive sheet comprising:
   a substrate;
   a first conductive portion formed on one main surface of the substrate and made up from a plurality of thin metal wires that have a width being greater than or equal to 0.1 μm and less than or equal to 1.5 μm and are formed from a non-transparent material;
   a first protective layer disposed on the one main surface in covering relation to the first conductive portion;
   a second conductive portion formed on another main surface of the substrate and made up from a plurality of thin metal wires that have a width being greater than or equal to 0.1 μm and less than or equal to 15 μm and are formed from a non-transparent material;
   a second protective layer disposed on the other main surface in covering relation to the second conductive portion;
   a first adhesive layer disposed between the one main surface and the first protective layer; and
   a second adhesive layer disposed between the another main surface and the second protective layer,
   wherein at least one of a relative index of refraction of the substrate with respect to the first protective layer and a relative index of refraction of the substrate with respect to the second protective layer is 0.86 to 1.15,
   wherein the first conductive portion comprises a mesh pattern in which different mesh shapes are arranged randomly in plan view,
   wherein each of the mesh shapes is polygonal,
   wherein the mesh pattern includes a repeating shape,
   wherein the first conductive portion comprises a plurality of first conductive patterns that extend in a first direction and are arranged in a second direction perpendicular to the first direction, and each of the first conductive patterns is inclined at a predetermined angle with reset to a direction in which the repeating shape is arranged;
a detection control unit for detecting a contact position or a proximity position from a side of the one main surface of the conductive sheet; and
a display unit that displays an image on a display surface based on a display signal,
wherein the another main surface of the conductive sheet is disposed on the display surface in confronting relation to the display unit.

5. A conductive sheet comprising:
   a substrate;
   a first conductive portion formed on one main surface of the substrate and made up from a plurality of thin metal wires that have a width being greater than or equal to 0.1 μm and less than or equal to 15 μm and are formed from a non-transparent material;
   a first protective layer disposed on the one main surface in covering relation to the first conductive portion;
   a second conductive portion formed on another main surface of the substrate and made up from a plurality of thin metal wires that have a width being greater than or equal to 0.1 μm and less than or equal to 15 μm and are formed from a non-transparent material;
   a second protective layer disposed on the other main surface in covering relation to the second conductive portion;
   a first adhesive layer disposed between the one main surface and the first protective layer; and
   a second adhesive layer disposed between the another main surface and the second protective layer,
   wherein at least one of a relative index of refraction of the substrate with respect to the first protective layer and a relative index of refraction of the substrate with respect to the second protective layer is 0.86 to 1.15,
   wherein the first conductive portion comprises a mesh pattern in which different mesh shapes are arranged randomly in plan view,
   wherein each of the mesh shapes is polygonal,
   Wherein the mesh pattern includes a repeating shape,
wherein the first conductive portion comprises a plurality of first conductive patterns that extend in a first direction and are arranged in a second direction perpendicular to the first direction, and
   each of the first conductive patterns is inclined at a predetermined angle with respect to a direction in which the repeating shape is arranged.

6. A touch panel comprising:
the conductive sheet according to claim 1; and
a detection control unit for detecting a contact position or a proximity position from a side of the one main surface of the conductive sheet.

7. A display device comprising:
the conductive sheet according to claim 1;
a detection control unit for detecting a contact position or a proximity position from a side of the one main surface of the conductive sheet; and
a display unit that displays an image on a display surface based on a display signal,
wherein the another main surface of the conductive sheet is disposed on the display surface in confronting relation to the display unit.

8. A conductive sheet comprising:
a first substrate;
a first conductive portion formed on one main surface of the substrate and made up from a plurality of thin metal wires that have a width being greater than or equal to 0.1 μm and less than or equal to 15 μm and are formed from a non-transparent material;
a first protective layer disposed on the one main surface of the first substrate in covering relation to the first conductive portion;
a second substrate;
a second conductive portion formed on one main surface of the second substrate and made up from a plurality of thin metal wires that have a width being greater than or equal to 0.1 inn and less than or equal to 15 μm and are formed from a non-transparent material; and
a second protective layer disposed on the one main surface of the second substrate in covering relation to the second conductive portion;
a first adhesive layer disposed between the one main surface of the first substrate and the first protective layer; and
a second adhesive layer disposed between the one main surface of the second substrate and the second protective layer,
wherein at least one of a relative index of refraction of the first substrate with respect to the first protective layer and a relative index of refraction of the second substrate with respect to the second protective layer is 0.86 to 1.15,
wherein the first conductive portion comprises a mesh pattern in which different mesh shapes are arranged randomly in plan view,
wherein each of the mesh shapes is polygonal, and
wherein a percentage of polygons having a number of vertices, an occurrence frequency of which is highest in a histogram of the number of vertices in the mesh shapes, is 40% to 70%.

9. A conductive sheet comprising:
a first substrate;
a first conductive portion formed on one main surface of the substrate and made up from a plurality of thin metal wires that have a width being greater than or equal to 0.1 μm and less than or equal to 15 μm and are formed from a non-transparent material;
a first protective layer disposed on the one main surface of the first substrate in covering relation to the first conductive portion;
a second substrate;
a second conductive portion formed on one main surface of the second substrate and made up from a plurality of thin metal wires that have a width being greater than or equal to 0.1 μm and less than or equal to 15 μm and are formed from a non-transparent material; and
a second protective layer disposed on the one main surface of the second substrate in covering relation to the second conductive portion;
a first adhesive layer disposed between the one main surface of the first substrate and the first protective layer; and
a second adhesive layer disposed between the one main surface of the second substrate and the second protective layer,
wherein at least one of a relative index of refraction of the first substrate with respect to the first protective layer and a relative index of refraction of the second substrate with respect to the second protective layer is 0.86 to 1.15,
wherein the first conductive portion comprises a mesh pattern in which different mesh shapes are arranged randomly in plan view,
wherein each of the mesh shapes is polygonal,
wherein the mesh pattern includes a repeating shape, and
wherein the first conductive portion comprises a plurality of first conductive patterns that extend in a first direction and are arranged in a second direction perpendicular to the first direction, and
each of the first conductive patterns is inclined at a predetermined angle with respect to a direction in which the repeating shape is arranged.

10. A touch panel comprising:
a conductive sheet comprising:
 a first substrate;
 a first conductive portion formed on one main surface of the substrate and made up from a plurality of thin metal wires that have a width being greater than or equal to 0.1 μm and less than or equal to 15 μm and are formed from a non-transparent material;
 a first protective layer disposed on the one main surface of the first substrate in covering relation to the first conductive portion;
 a second substrate;
 a second conductive portion formed on one main surface of the second substrate and made up from a plurality of thin metal wires that have a width being greater than or equal to 0.1 μm and less than or equal to 15 μm and are formed from a non-transparent material; and
 a second protective layer disposed on the one main surface of the second substrate in covering relation to the second conductive portion;
 a first adhesive layer disposed between the one main surface of the first substrate and the first protective layer; and
 a second adhesive layer disposed between the one main surface of the second substrate and the second protective layer,
 wherein at least one of a relative index of refraction of the first substrate with respect to the first protective layer and a relative index of refraction of the second substrate with respect to the second protective layer is 0.86 to 1.15,
 wherein the first conductive portion comprises a mesh pattern in which different mesh shapes are arranged randomly in plan view,
 wherein each of the mesh shapes is polygonal,
 wherein a percentage of polygons having a number of vertices, an occurrence frequency of which is highest in a histogram of the number of vertices in the mesh shapes, is 40% to 70%; and
a detection control unit for detecting a contact position or a proximity position from a side of one main surface of the conductive sheet.

11. A display device comprising:
a conductive sheet comprising:
  a first substrate;
  a first conductive portion formed on one main surface of the substrate and made up from a plurality of thin metal wires that have a width being greater than or equal to 0.1 μm and less than or equal to 15 μm and are formed from a non-transparent material;
  a first protective layer disposed on the one main surface of the first substrate in covering relation to the first conductive portion;
  a second substrate;
  a second conductive portion formed on one main surface of the second substrate and made up from a plurality of thin metal wires that have a width being greater than or equal to 0.1 μm and less than or equal to 15 μm and are formed from a non-transparent material; and
  a second protective layer disposed on the one main surface of the second substrate in covering relation to the second conductive portion;
  a first adhesive layer disposed between the one main surface of the first substrate and the first protective layer; and
  a second adhesive layer disposed between the one main surface of the second substrate and the second protective layer,
  wherein at least one of a relative index of refraction of the first substrate with respect to the first protective layer and a relative index of refraction of the second substrate with respect to the second protective layer is 0.86 to 1.15,
  wherein the first conductive portion comprises a mesh pattern in which different mesh shapes are arranged randomly in plan view,
  wherein each of the mesh shapes is polygonal,
  wherein a percentage of polygons having a number of vertices, an occurrence frequency of which is highest in a histogram of the number of vertices in the mesh shapes, is 40% to 70%, and
a detection control unit for detecting a contact position or a proximity position from a side of one main surface of the conductive sheet; and
a display unit that displays an image on a display surface based on a display signal,
wherein another main surface of the conductive sheet is disposed on the display surface in confronting relation to the display unit.

12. A touch panel comprising:
a conductive sheet comprising:
  a first substrate;
  a first conductive portion formed on one main surface of the substrate and made up from a plurality of thin metal wires that have a width being greater than or equal to 0.1 μm and less than or equal to 15 μm and are formed from a non-transparent material;
  a first protective layer disposed on the one main surface of the first substrate in covering relation to the first conductive portion;
  a second substrate;
  a second conductive portion formed on one main surface of the second substrate and made up from a plurality of thin metal wires that have a width being greater than or equal to 0.1 μm and less than or equal to 15 μm and are formed from a non-transparent material; and
  a second protective layer disposed on the one main surface of the second substrate in covering relation to the second conductive portion;
  a first adhesive layer disposed between the one main surface of the first substrate and the first protective layer; and
  a second adhesive layer disposed between the one main surface of the second substrate and the second protective layer,
  wherein at least one of a relative index of refraction of the first substrate with respect to the first protective layer and a relative index of refraction of the second substrate with respect to the second protective layer is 0.86 to 1.15,
  wherein the first conductive portion comprises a mesh pattern in which different mesh shapes are arranged randomly in plan view,
  wherein each of the mesh shapes is polygonal,
  wherein the mesh pattern includes a repeating shape, and
  wherein the first conductive portion comprises a plurality of first conductive patterns that extend in a first direction and are arranged in a second direction perpendicular to the first direction, and
  each of the first conductive patterns is inclined at a predetermined angle with respect to a direction in which the repeating shape is arranged; and
a detection control unit for detecting a contact position or a proximity position from a side of one main surface of the conductive sheet.

13. A display device comprising:
a conductive sheet comprising:
  a first substrate;
  a first conductive portion formed on one main surface of the substrate and made up from a plurality of thin metal wires that have a width being greater than or equal to 0.1 μm and less than or equal to 15 μm and are formed from a non-transparent material;
  a first protective layer disposed on the one main surface of the first substrate in covering relation to the first conductive portion;
  a second substrate;
  a second conductive portion formed on one main surface of the second substrate and made up from a plurality of thin metal wires that have a width being greater than or equal to 0.1 μm and less than or equal to 15 μm and are formed from a non-transparent material; and
  a second protective layer disposed on the one main surface of the second substrate in covering relation to the second conductive portion;
  a first adhesive layer disposed between the one main surface of the first substrate and the first protective layer; and
  a second adhesive layer disposed between the one main surface of the second substrate and the second protective layer,
  wherein at least one of a relative index of refraction of the first substrate with respect to the first protective layer and a relative index of refraction of the second substrate with respect to the second protective layer is 0.86 to 1.15,
  wherein the first conductive portion comprises a mesh pattern in which different mesh shapes are arranged randomly in plan view, wherein each of the mesh shapes is polygonal,
wherein the mesh pattern includes a repeating shape, and
wherein the first conductive portion comprises a plurality of first conductive patterns that extend in a first direction and are arranged in a second direction perpendicular to the first direction, and
each of the first conductive patterns is inclined at a predetermined angle with respect to a direction in which the repeating shape is arranged; and
a detection control unit for detecting a contact position or a proximity position from a side of one main surface of the conductive sheet; and
a display unit that displays an image on a display surface based on a display signal,
wherein another main surface of the conductive sheet is disposed on the display surface in confronting relation to the display unit.

14. A conductive sheet comprising:
a substrate;
a first conductive portion formed on one main surface of the substrate and made up from a plurality of thin metal wires that have a width being greater than or equal to 0.1 µm and less than or equal to 15 µm and are formed from a non-transparent material;
a first protective layer disposed on the one main surface in covering relation to the first conductive portion;
a second conductive portion formed on another main surface of the substrate and made up from a plurality of thin metal wires that have a width being greater than or equal to 0.1 µm and less than or equal to 15 µm and are formed from a non-transparent material;
a second protective layer disposed on the other main surface in covering relation to the second conductive portion;
a first adhesive layer disposed between the one main surface and the first protective layer; and
a second adhesive layer disposed between the another main surface and the second protective layer,
wherein at least one of a relative index of refraction of the substrate with respect to the first protective layer and a relative index of refraction of the substrate with respect to the second protective layer is 0.86 to 1.15,
wherein a rate of change in luminance expressed by 100×(Lb−La)/La is 16.5% or more where La denotes luminance of a region that does not form the first protective layer, and Lb denotes luminance of a region that forms the first protective layer, when white light is irradiated onto the conductive sheet.

15. The conductive sheet according to claim 14, wherein the first conductive portion comprises a mesh pattern in which different mesh shapes are arranged randomly in plan view.

16. A touch panel comprising:
a conductive sheet comprising:
a substrate;
a first conductive portion formed on one main surface of the substrate and made up from a plurality of thin metal wires that have a width being greater than or equal to 0.1 µm and less than or equal to 15 µm and are formed from a non-transparent material;
a first protective layer disposed on the one main surface in covering relation to the first conductive portion;
a second conductive portion formed on another main surface of the substrate and made up from a plurality of thin metal wires that have a width being greater than or equal to 0.1 µm and less than or equal to 15 µm and are formed from a non-transparent material;
a second protective layer disposed on the other main surface in covering relation to the second conductive portion;
a first adhesive layer disposed between the one main surface and the first protective layer; and
a second adhesive layer disposed between the another main surface and the second protective layer,
wherein at least one of a relative index of refraction of the substrate with respect to the first protective layer and a relative index of refraction of the substrate with respect to the second protective layer is 0.86 to 1.15,
wherein a rate of change in luminance expressed by 100×(Lb−La)/La is 16.5% or more where La denotes luminance of a region that does not form the first protective layer, and Lb denotes luminance of a region that forms the first protective layer, when white light is irradiated onto the conductive sheet; and
a detection control unit for detecting a contact position or a proximity position from a side of the one main surface of the conductive sheet.

17. A display device comprising:
a conductive sheet comprising:
a substrate;
a first conductive portion formed on one main surface of the substrate and made up from a plurality of thin metal wires that have a width being greater than or equal to 0.1 µm and less than or equal to 15 µm and are formed from a non-transparent material;
a first protective layer disposed on the one main surface in covering relation to the first conductive portion;
a second conductive portion formed on another main surface of the substrate and made up from a plurality of thin metal wires that have a width being greater than or equal to 0.1 µm and less than or equal to 15 µm and are formed from a non-transparent material;
a second protective layer disposed on the other main surface in covering relation to the second conductive portion;
a first adhesive layer disposed between the one main surface and the first protective layer; and
a second adhesive layer disposed between the another main surface and the second protective layer,
wherein at least one of a relative index of refraction of the substrate with respect to the first protective layer and a relative index of refraction of the substrate with respect to the second protective layer is 0.86 to 1.15,
wherein a rate of change in luminance expressed by 100×(Lb−La)/La is 16.5% or more where La denotes luminance of a region that does not form the first protective layer, and Lb denotes luminance of a region that forms the first protective layer, when white light is irradiated onto the conductive sheet; and
a detection control unit for detecting a contact position or a proximity position from a side of the one main surface of the conductive sheet; and
a display unit that displays an image on a display surface based on a display signal,
wherein the another main surface of the conductive sheet is disposed on the display surface in confronting relation to the display unit.

18. The conductive sheet according to claim 14, wherein the first conductive portion comprises:

a plurality of first conductive patterns that extend in a first direction and are arranged in a second direction perpendicular to the first direction; and a plurality of first dummy patterns disposed in interspatial portions between adjacent ones of the first conductive patterns, and which are insulated electrically from each of the first conductive patterns, wherein a wiring density of the first dummy patterns is equal to a wiring density of the first conductive patterns.

19. The conductive sheet according to claim 14, wherein the first conductive portion comprises a mesh pattern in which different mesh shapes are arranged randomly in plan view, wherein each of the mesh shapes is polygonal, and wherein a percentage of polygons having a number of vertices, an occurrence frequency of which is highest in a histogram of the number of vertices in the mesh shapes, is 40% to 70%.

20. The conductive sheet according to claim 5, wherein the first conductive portion comprises:

a plurality of first conductive patterns that extend in a first direction and are arranged in a second direction perpendicular to the first direction; and a plurality of first dummy patterns disposed in interspatial portions between adjacent ones of the first conductive patterns, and which are insulated electrically from each of the first conductive patterns, wherein a wiring density of the first dummy patterns is equal to a wiring density of the first conductive patterns.

* * * * *